(12) United States Patent
Park

(10) Patent No.: US 12,497,559 B2
(45) Date of Patent: Dec. 16, 2025

(54) QUANTUM DOT-CONTAINING MATERIAL COMPRISING AN AZIDE GROUP AND A CHARGE TRANSPORT GROUP, METHOD OF PREPARING THEREOF, CROSS-LINKED MATERIAL THEREOF, METHOD OF PREPARING CROSS-LINKED MATERIAL, AND LIGHT-EMITTING DEVICE INCLUDING CROSS-LINKED MATERIAL

(71) Applicant: Samsung Display Co., Ltd., Yongin-si (KR)

(72) Inventor: Junwoo Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 945 days.

(21) Appl. No.: 17/546,289

(22) Filed: Dec. 9, 2021

(65) Prior Publication Data
US 2022/0213379 A1 Jul. 7, 2022

(30) Foreign Application Priority Data
Dec. 23, 2020 (KR) .................. 10-2020-0182419

(51) Int. Cl.
*C09K 11/02* (2006.01)
*C09D 11/037* (2014.01)
(Continued)

(52) U.S. Cl.
CPC .......... *C09K 11/025* (2013.01); *C09D 11/037* (2013.01); *C09D 11/101* (2013.01);
(Continued)

(58) Field of Classification Search
CPC ....... B82Y 20/00; C09K 11/70; C09K 11/025; H10K 85/6572
See application file for complete search history.

(56) References Cited

U.S. PATENT DOCUMENTS

| 10,899,963 B2 | 1/2021 | Chae et al. |
| 2006/0088713 A1 | 4/2006 | Dykstra et al. |
| (Continued) | | |

FOREIGN PATENT DOCUMENTS

| JP | 2016001547 A | * | 1/2016 | .......... H01L 51/502 |
| JP | 2023012818 A | * | 1/2023 | |
| (Continued) | | | | |

OTHER PUBLICATIONS

Translation JP 2023012818 A (Year: 2023).*
(Continued)

*Primary Examiner* — Hoa (Holly) Le
(74) *Attorney, Agent, or Firm* — CANTOR COLBURN LLP

(57) ABSTRACT

Disclosed are a quantum dot-containing material, a method of preparing the quantum dot-containing material, a cross-linked material of the quantum dot-containing material, and a method of preparing the same, and a light-emitting device comprising the quantum dot-containing material. The quantum dot-containing material may include a quantum dot and an organic group chemically bound to a surface of the quantum dot, the organic group may include an azide group and a charge transport group, and the charge transport group may not be an unsubstituted benzene group.

20 Claims, 5 Drawing Sheets

(51) Int. Cl.
  *C09D 11/101* (2014.01)
  *C09D 11/106* (2014.01)
  *C09D 11/50* (2014.01)
  *C09K 11/08* (2006.01)
  *C09K 11/88* (2006.01)
  *H10K 50/115* (2023.01)
  *B82Y 20/00* (2011.01)
  *B82Y 40/00* (2011.01)

(52) U.S. Cl.
  CPC ............ *C09D 11/106* (2013.01); *C09D 11/50* (2013.01); *C09K 11/0883* (2013.01); *C09K 11/883* (2013.01); *H10K 50/115* (2023.02); *B82Y 20/00* (2013.01); *B82Y 40/00* (2013.01)

(56) References Cited

U.S. PATENT DOCUMENTS

| | | | |
|---|---|---|---|
| 2015/0148262 A1 | 5/2015 | Trau et al. | |
| 2016/0111656 A1 | 4/2016 | Ha et al. | |
| 2017/0067902 A1 | 3/2017 | Zhang et al. | |
| 2018/0133345 A1 | 5/2018 | Naasani | |
| 2019/0312204 A1 | 10/2019 | Kang et al. | |
| 2022/0089604 A1* | 3/2022 | Park .................... | H10K 85/6572 |
| 2023/0011105 A1* | 1/2023 | Ko ........................ | C09K 11/883 |
| 2023/0225202 A1* | 7/2023 | Cho ..................... | H10K 85/654 |
| | | | 257/40 |

FOREIGN PATENT DOCUMENTS

| | | | | |
|---|---|---|---|---|
| KR | 100886916 B1 | 3/2009 | | |
| KR | 100973431 B1 | 8/2010 | | |
| KR | 20160047062 A | 5/2016 | | |
| KR | 101825884 B1 | 1/2018 | | |
| KR | 101977282 B1 | 5/2019 | | |
| KR | 102087299 B1 | 3/2020 | | |
| WO | WO-2021250279 A1 * | 12/2021 | ........... | H10K 85/654 |

OTHER PUBLICATIONS

Translation JP 2016001547 A (Year: 2016).*
Ana Fokina (2015) JGU, Development and Application of Chemically Grafted Polymer/Quantum Dot Hybrids, Dissertation, 163 pp.
English Abstract of KR 20080100726 (English Abstract of KR 10-0886916).
English Abstract of KR20090033947 (English Abstract of KR 10-0973431).
Kazuhiro Nakabayashi, et al., International Journal of Polymer Science, vol. 2012, Article ID 170912, 18 pp.
Matthias Zom, et al., Quantum Dot- Block Copolymer Hybrids with Improved Properties and Their Application to Quantum Dot Light-Emitting Devices, ACS Nano 2009, 3, 5, 1063-1068.
Seryun Lee, et al., Free-Standing Nanocomposite Multilayers with VariousLength Scales, Adjustable Internal Structures, andFunctionalities, J. Am. Chem. Soc. 2009, 131, 2579-2587.
Korean Notice of Allowance for KR Patent Application No. 10-2020-0182419 dated Sep. 1, 2025.
Fatimata Dembele et al., Zwitterionic Silane Copolymer for Ultra-Stable and Bright Biomolecular Probes Based on Fluorescent Quantum Dot Nanoclusters, ACS Appl. Mater. Interfaces, 9(21), 18161-18169, May 3, 2017.

* cited by examiner

QUANTUM DOT-CONTAINING MATERIAL COMPRISING AN AZIDE GROUP AND A CHARGE TRANSPORT GROUP, METHOD OF PREPARING THEREOF, CROSS-LINKED MATERIAL THEREOF, METHOD OF PREPARING CROSS-LINKED MATERIAL, AND LIGHT-EMITTING DEVICE INCLUDING CROSS-LINKED MATERIAL

CROSS-REFERENCE TO RELATED APPLICATION

This application is based on and claims priority to Korean Patent Application No. 10-2020-0182419, filed on Dec. 23, 2020, in the Korean Intellectual Property Office, and all the benefits accruing therefrom under 35 U.S.C. § 119, the entire content of which is incorporated by reference herein.

BACKGROUND

1. Field

This disclosure relates to a material, and more specifically to a quantum dot-containing material, a method of preparing the quantum dot-containing material, a cross-linked material of the quantum dot-containing material, and a light-emitting device comprising the quantum dot-containing material.

2. Description of the Related Art

Among light-emitting devices, organic light-emitting devices (OLEDs) are self-emissive devices that, as compared with devices of the related art, have wide viewing angles, high contrast ratios, short response times, and excellent characteristics in terms of brightness, driving voltage, and response speed, and that produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. The excitons may transit from an excited state to a ground state, thus generating light.

Various types of organic light emitting devices are known. However, there still remains a need for OLEDs having improved hole transportability or long lifespan, or both.

SUMMARY

One or more embodiments include a quantum dot-containing material, a method of preparing the quantum dot-containing material, a cross-linked material of the quantum dot-containing material, a method of preparing the cross-linked material, and a light-emitting device including the cross-linked material, wherein the quantum dot-containing material may be surface-modified with an organic group including a thermal- and photo-cross-linking group to thereby provide a cross-linked material with excellent or improved hole transportability and long lifespan.

Additional aspects will be set forth in part in the description which follows and, in part, will be apparent from the description, or may be learned by practice of the presented embodiments of the disclosure.

According to an embodiment, a quantum dot-containing material may include:
a quantum dot and
an organic group chemically bound to a surface of the quantum dot,
wherein the organic group may include an azide group and a charge transport group, and
the charge transport group may not be an unsubstituted benzene group.

According to an embodiment, a method of preparing the quantum dot-containing material may include:
chemically reacting the quantum dot with a precursor of the organic group to chemically bond the surface of the quantum dot to the organic group.

According to an embodiment, a cross-linked material of the quantum dot-containing material may be provided.

According to an embodiment, a method of preparing cross-linked material may include:
providing the quantum dot-containing material according to any one of the above embodiments and a solvent on a substrate, and
cross-linking the quantum dot-containing material.

According to an embodiment, a light-emitting device may include:
a first electrode,
a second electrode facing the first electrode, and
an interlayer between the first electrode and the second electrode and including an emission layer,
wherein the light-emitting device may include a cross-linked material as described herein.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
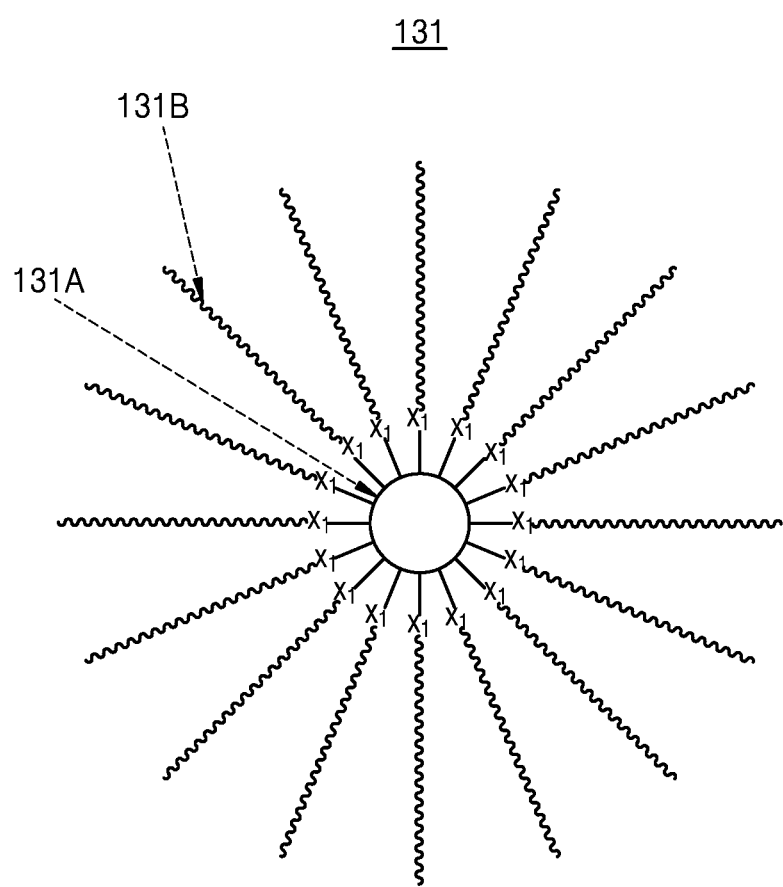
FIG. 1 is a schematic cross-sectional view of a quantum dot-containing material according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, and c" indicates only a, only b, only c, both a and b, both a and c, both b and c, all of a, b, and c, or variations thereof.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10%, 5% of the stated value.

The term "room temperature" used herein refers to a temperature of about 25° C.

In any formula, *, *', and *''' each indicate a binding site to a neighboring atom or a neighboring functional group.

Description of FIG. 1

A quantum dot-containing material 131 shown in FIG. 1 may include a quantum dot 131A and an organic group 131B chemically bound to a surface of the quantum dot. The quantum dot-containing material 131 may include at least one of the organic group 131B. The organic group 131B may include an azide group and a charge transport group, and the charge transport group may not be an unsubstituted benzene group.

Hereinafter, the quantum dot-containing material 131 according to an embodiment and a method of preparing the quantum dot-containing material 131 according to an embodiment will be described in connection with FIG. 1.

Quantum Dot 131A in Quantum Dot-Containing Material 131

The quantum dot-containing material 131 in FIG. 1 may include the quantum dot 131A.

In an embodiment, the quantum dot may include: a group II-VI semiconductor compound; a group III-V semiconductor compound; a group III-VI semiconductor compound; a group I-III-VI semiconductor compound; a group IV-VI semiconductor compound; a group IV element or compound; or any combination thereof.

In an embodiment, the quantum dot may be a group II-VI semiconductor compound; a group III-V semiconductor compound; or any combination thereof.

In an embodiment, the quantum dot may include: CdS, CdSe, CdTe, ZnS, ZnSe, ZnTe, ZnO, HgS, HgSe, HgTe, MgSe, or MgS;

CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS;

CdZnSeS, CdZnSeTe, CdZnSTe, CdHgSeS, CdHgSeTe, CdHgSTe, HgZnSeS, HgZnSeTe, or HgZnSTe;

GaN, GaP, GaAs, GaSb, AlN, AlP, AlAs, AlSb, InN, InP, InAs, or InSb;

GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP;

GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb;

InZnP, InGaZnP, or InAlZnP; or any combination thereof.

In an embodiment, the quantum dot may have a single structure in which the concentration of each element included in the quantum dot is uniform or is included as a core-shell double structure.

In an embodiment, an interface between a core and a shell may have a concentration gradient where a concentration of elements present in the shell decreases toward the core. In an embodiment, the quantum dot may be a core-shell double structure.

In an embodiment, a material included in the shell may include a group II-VI semiconductor compound; and/or a material included in the core may be a group III-V semiconductor compound.

In an embodiment, a material included in the shell may include: CdS, CdSe, CdTe, ZnS, ZnSe, ZnTe, ZnO, HgS, HgSe, HgTe, MgSe, or MgS;

CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS;

CdZnSeS, CdZnSeTe, CdZnSTe, CdHgSeS, CdHgSeTe, CdHgSTe, HgZnSeS, HgZnSeTe, or HgZnSTe; or any combination thereof.

In an embodiment, a material included in the core may include: GaN, GaP, GaAs, GaSb, AlN, AlP, AlAs, AlSb, InN, InP, InAs, or InSb;

GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP;

GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb;

InZnP, InGaZnP, or InAlZnP; or any combination thereof.

The quantum dot 131A may be understood by referring to the description of the quantum dot provided herein.

Organic Group 131B in Quantum Dot-Containing Material 131

The quantum dot-containing material 131 in FIG. 1 may include the organic group 131B. The organic group may include an azide group and a charge transport group, and the charge transport group may not be an unsubstituted benzene group.

In an embodiment, the charge transport group in the organic group may be an electron donating group or an electron withdrawing group.

In an embodiment, in the charge transport group, the electron donating group may be a π electron-rich $C_3$-$C_{60}$ cyclic group unsubstituted or substituted with at least one of $R_{20a}$ or $N(Ar_2)(Ar_3)$, $Ar_2$ and $Ar_3$ may each independently be a π electron-rich $C_3$-$C_{60}$ cyclic group unsubstituted or substituted with at least one $R_{20a}$, the electron withdrawing group may be:

—F, —$CFH_2$, —$CF_2H$, —$CF_3$, —CN, or —$NO_2$;

a $C_1$-$C_{60}$ alkyl group substituted with at least one of —F, —$CFH_2$, —$CF_2H$, —$CF_3$, —CN or —$NO_2$; or a π electron-depleted nitrogen-containing $C_1$-$C_{60}$ cyclic group unsubstituted or substituted with at least one $R_{10a}$, $R_{10a}$ may be:

deuterium (-D), —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group-$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; or a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof, and $R_{20a}$ may be:

deuterium (-D), a hydroxyl group, or a nitro group;

a $C_1$-$C_{60}$ alkyl group, a $C_2$-$C_{60}$ alkenyl group, a $C_2$-$C_{60}$ alkynyl group, a $C_1$-$C_{60}$ alkylthio group; or a $C_1$-$C_{60}$ alkoxy group, each independently unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{41})(Q_{42})(Q_{43})$, —$N(Q_{41})(Q_{42})$, —$B(Q_{41})(Q_{42})$, or any combination thereof;

a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, —$Si(Q_{51})(Q_{52})(Q_{53})$, —$N(Q_{51})(Q_{52})$, —$B(Q_{51})(Q_{52})$, or any combination thereof; or —$Si(Q_{61})(Q_{62})(Q_{63})$, —$N(Q_{61})(Q_{62})$, or —$B(Q_{61})(Q_{62})$, wherein $Q_{41}$ to $Q_{43}$, $Q_{51}$ to $Q_{53}$, and $Q_{61}$ to $Q_{63}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof.

For example, the electron donating group in the charge transport group may be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonapthothiophene group, an (indolo)phenanthrene group, a (benzofurano)phenanthrene group, a (benzothieno)phenanthrene group, or —N(Ar$_2$)(Ar$_3$), each independently unsubstituted or substituted with at least one R$_{20a}$, but embodiments are not limited thereto.

Ar$_2$, Ar$_3$, and R$_{20a}$ may be respectively understood by referring to the descriptions of Ar$_2$, Ar$_3$, and R$_{20a}$ provided herein.

For example, the electron withdrawing group in the charge transport group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzothiophene group, an azadibenzosilole group, an acridine group, or a pyridopyrazine group, each independently unsubstituted or substituted with at least one R$_{10a}$.

R$_{10a}$ may be understood by referring to the description of R$_{10a}$ provided herein.

For example, the charge transport group may be a carbazole group unsubstituted or substituted with at least one of R$_{20a}$ or —N(Ar$_2$)(Ar$_3$), but embodiments are not limited thereto.

In an embodiment, the organic group may be a group represented by Formula 1:

Formula 1

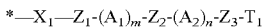

*—X$_1$—Z$_1$-(A$_1$)$_m$-Z$_2$-(A$_2$)$_n$-Z$_3$-T$_1$    1 wherein A$_1$ and A$_2$ are each independently a group represented by Formula 2-1 or Formula 2-2, Formula 2-1

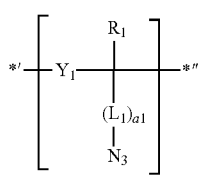

Formula 2-2

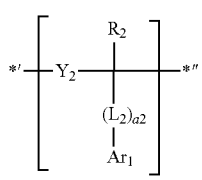

wherein, in Formula 1,

X$_1$ may be O or S.

In an embodiment, X$_1$ may be S.

Z$_1$ to Z$_3$ may each independently be:

a single bond;

—N(R$_{1a}$)—*', *—O—*', *—S—', or *—C(=O)—*'; or a C$_1$-C$_{60}$ alkylene group, a C$_1$-C$_{60}$ oxyalkylene group, a C$_6$-C$_{60}$ arylene group, or a C$_6$-C$_{60}$ oxyarylene group, each independently unsubstituted or substituted with deuterium, a hydroxyl group, a C$_1$-C$_{20}$ alkyl group, a C$_1$-C$_{20}$ alkoxy group, a C$_1$-C$_{20}$ alkylthio group, a phenyl group, a biphenyl group, or any combination thereof.

T$_1$ may be a terminal group.

The term "terminal group" as used herein refers to a constituent unit bonded to a terminal end of a polymer, and various terminal groups may be selected according to a synthesis method of a precursor of an organic group described herein. It will be understood by those of ordinary skill in the art that various changes in form and details may be made therein.

For example, the terminal group may be hydrogen, deuterium, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_1$-C$_{60}$ alkylthio group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, a C$_6$-C$_{60}$ aryloxy group unsubstituted or substituted with at least one R$_{10a}$, a C$_6$-C$_{60}$ arylthio group unsubstituted or substituted with at least one R$_{10a}$, a C$_1$-C$_{60}$ heteroaryloxy group unsubstituted or substituted with at least one R$_{10a}$, a C$_1$-C$_{60}$ heteroarylthio group unsubstituted or substituted with at least one R$_{10a}$, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$).

R$_{10a}$ may be understood by referring to the description of R$_{10a}$ provided herein.

A$_1$ and A$_2$ may each independently be a group represented by Formula 2-1 or Formula 2-2, wherein at least one of A$_1$ in a number of m and A$_2$ in a number of n may be a group represented by Formula 2-1.

m and n may each independently be an integer from 50 to 1,000.

In an embodiment, in Formula 1, m and n may each independently be an integer from 50 to 500.

* indicates a binding site to a surface of the quantum dot.

In Formulae 2-1 and 2-2,

Y$_1$ and Y$_2$ may each independently be a single bond or a C$_1$-C$_{10}$ alkylene group unsubstituted or substituted with at least one R$_{10a}$.

L$_1$ and L$_2$ may each independently be a single bond, a C$_3$-C$_{60}$ carbocyclic group unsubstituted or substituted with at least one R$_{10a}$, or a C$_1$-C$_{60}$ heterocyclic group unsubstituted or substituted with at least one R$_{10a}$.

a1 and a2 may each independently be an integer from 1 to 3.

Ar$_1$ may be an electron donating group unsubstituted or substituted with at least one R$_{20a}$ or an electron withdrawing group unsubstituted or substituted with at least one R$_{10a}$, and when L$_1$ is a single bond, Ar$_1$ may not be an unsubstituted benzene group.

$R_1$ and $R_2$ may each independently be hydrogen, deuterium, —F, —Cl, —Br, —I, a hydroxyl group, a cyano group, a nitro group, a $C_1$-$C_{10}$ alkyl group, a $C_2$-$C_{10}$ alkenyl group, a $C_2$-$C_{10}$ alkynyl group, a $C_1$-$C_{10}$ alkylthio group, or a $C_1$-$C_{10}$ alkoxy group.

*' and *" each indicate a binding site to an adjacent atom.

$R_{10a}$ and $R_{20a}$ may respectively be understood by referring to the descriptions of $R_{10a}$ and $R_{20a}$ provided herein, and $R_{1a}$ may be understood by referring to the description of $R_{10a}$ provided herein.

In an embodiment, Formula 2-2 of $A_1$ and $A_2$ in Formula 1 may be represented by Formula 2-2a or Formula 2-2b:

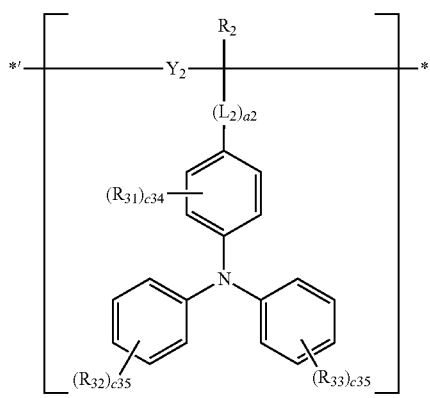

2-2a

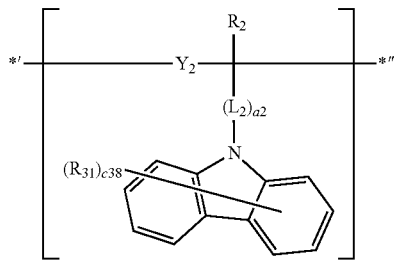

2-2b wherein, in Formulae 2-2a and 2-2b, $Y_2$, $R_2$, $L_2$, and a2 may respectively be understood by referring to the descriptions of $Y_2$, $R_2$, $L_2$, and a2 provided herein, $R_{31}$ to $R_{33}$ may each be understood by referring to the description of $R_{20a}$ provided herein, c34 may be an integer from 0 to 4, c35 may be an integer from 0 to 5, c38 may be an integer from 0 to 8, wherein substituent $R_{31}$ is present on each ring through which the bond with $R_{31}$ substituent passes, and

*' and *" each indicate a binding site to an adjacent atom.

In an embodiment, a molar ratio of the azide group to the charge transport group in the organic group may be in a range of about 1:1 to about 1:10, for example, about 1:1 to about 1:9, about 1:1 to about 1:8, about 1:1 to about 1:7, about 1:1 to about 1:6, about 1:1 to about 1:5, about 1:1 to about 1:4, about 1:1 to about 1:3, or about 1:1 to about 1:2.

In an embodiment, a molar ratio of the organic group to the quantum dot in the quantum dot-containing material may be in a range of about 1:100 to about 1:1,000. For example, the molar ratio of the organic group to the quantum dot in the quantum dot-containing material may be in a range of about 1:100 to about 1:900, about 1:100 to about 1:800, about 1:100 to about 1:700, about 1:100 to about 1:600, about 1:100 to about 1:500, about 1:100 to about 1:400, about 1:100 to about 1:300, or about 1:100 to about 1:200.

In an embodiment, an average diameter (D50) of the quantum dot-containing material may be in a range of about 40 nanometers (nm) to about 1,000 nm. For example, the average diameter of the quantum dot-containing material may be in a range of about 50 nm to about 900 nm, about 60 nm to about 800 nm, about 70 nm to about 700 nm, about 80 nm to about 600 nm, about 90 nm to about 500 nm, about 100 nm to about 400 nm, about 100 nm to about 300 nm, or about 100 nm to about 200 nm.

Method of Preparing Quantum Dot-Containing Material 131

The method of preparing the quantum dot-containing material 131 may include:

chemically reacting the quantum dot 131A with a precursor of the organic group 131B to chemically bond the surface of the quantum dot to the organic group.

In an embodiment, a precursor of the organic group 131B may be represented by Formula 1(1):

Formula 1(1)

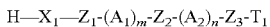

1(1)

wherein $A_1$ and $A_2$ are each independently a group represented by Formula 2-1 or Formula 2-2, Formula 2-1

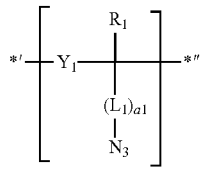

2-1

Formula 2-2

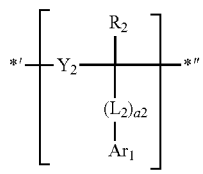

2-2 wherein, $X_1$, $Z_1$ to $Z_3$, $T_1$, $A_1$, $A_2$, m, and n in Formula 1(1) and $Y_1$, $Y_2$, $L_1$, $L_2$, a1, a2 $Ar_1$, $R_1$, $R_2$, *', and *" in Formulae 2-1 and 2-2 may respectively be understood by referring to the descriptions of $X_1$, $Z_1$ to $Z_3$, $T_1$, $A_1$, $A_2$, m, and n and $Y_1$, $Y_2$, $L_1$, $L_2$, a1, a2, $Ar_1$, $R_1$, $R_2$, *', and *" provided herein.

In an embodiment, in the chemically reacting of the quantum dot 131A with a precursor of the organic group 131B to chemically bond the surface of the quantum dot to the organic group, the chemically reacting may include forming a covalent bond between a surface of a quantum dot and the organic group.

Figure 2:
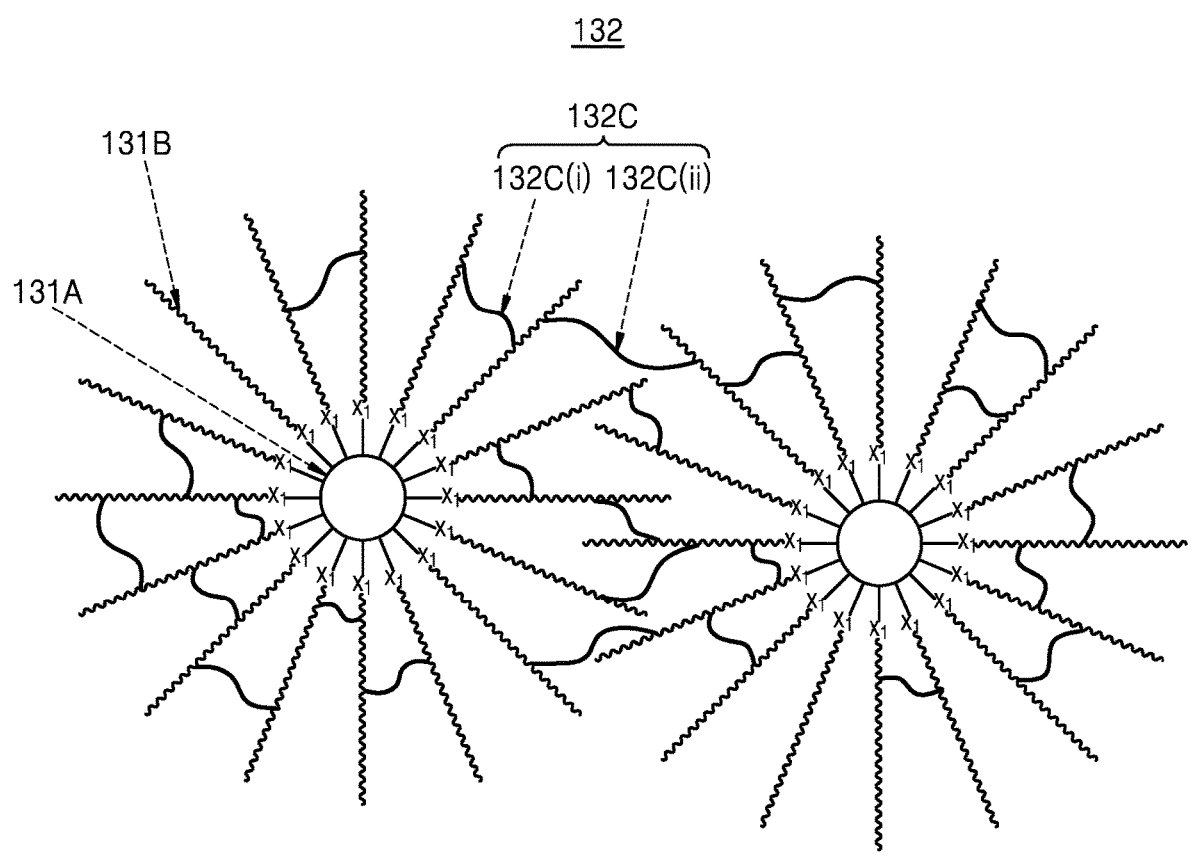
FIG. 2 is a schematic cross-sectional view of a cross-linked material according to an embodiment.

Description of FIG. 2

The quantum dot-containing material 131 in FIG. 1 may be cross-linked to form a cross-linked material 132 in FIG. 2. The cross-linked material 132 in FIG. 2 may include a residue group 132C derived from a cross-linking reaction between the azide group in the organic group 131B in the quantum dot-containing material 131 and an adjacent organic group. The azide group and the adjacent organic group may be included in i) the same quantum dot-containing material 132C (i) or ii) may each be included in different quantum dot-containing materials 132C (ii).

Hereinafter, the cross-linked material 132 according to an embodiment and a method of preparing the cross-linked material 132 according to an embodiment will be described in connection with FIG. 2.

Cross-Linked Material 132

FIG. 2 shows the cross-linked material 132 according to an embodiment. The cross-linked material 132 may be a cross-linked material (i.e., a product) of the quantum dot-containing material 131.

In an embodiment, a residue group derived from a cross-linking reaction between the azide group in the organic group in the quantum dot-containing material and an adjacent organic group.

In an embodiment, the cross-linked material 132 may include the residue group 132C derived from a cross-linking reaction between the azide group in the organic group 131A in the quantum dot-containing material 131 and an adjacent organic group. The azide group and the adjacent organic group may be included in i) the same quantum dot-containing material 132C (i) or ii) may each be included in different quantum dot-containing materials 132C (ii).

In an embodiment, the residue group 132C in cross-linked material 132 may include
a group represented by Formula 4:

Formula 4

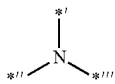

wherein, in Formula 4, *', *''', and *'''' each indicate a binding site to an adjacent atom.

According to an embodiment, the cross-linked material may have a form of a film. A thickness of the film may be in a range of about 0.1 micrometers (μm) to about 700 μm. For example, the thickness of the film may be in a range of about 0.1 μm to about 600 μm, about 0.1 μm to about 500 μm, about 0.1 μm to about 400 μm, about 0.1 μm to about 300 μm, about 0.1 μm to about 200 μm, about 0.1 μm to about 100 μm, or about 0.1 μm to about 50 μm.

Method of Preparing Cross-Linked Material 132

A method of preparing the cross-linked material 132 may include providing the quantum dot-containing material 131 and a solvent on a substrate; and
cross-linking the quantum dot-containing material 131.

In an embodiment, the solvent in the providing of the quantum dot-containing material 131 may be any suitable solvent that may dissolve the quantum dot-containing material.

For example, the solvent in the quantum dot-containing material 131 may be an alkylene glycol alkylether such as ethylene glycol monomethylether, ethylene glycol monoethylether, ethylene glycol monopropylether, ethylene glycol monobutylether, propylene glycol monomethylether, or propylene glycol methylethylether; a diethylene glycol dialkylether such as diethylene glycol dimethylether, diethylene glycol diethylether, diethylene glycol dipropylether, or diethylene glycol dibutylether; an alkylene glycol alkylether acetate such as methyl cellosolve acetate, ethyl cellosolve acetate, propylene glycol monomethylether acetate, propylene glycol monoethylether acetate, or propylene glycol monopropylether acetate; an alkoxyalkyl acetate such as methoxybutyl acetate or methoxypentyl acetate; an aromatic hydrocarbon such as benzene, toluene, xylene, or mesitylene; a ketone such as methylethyl ketone, acetone, methylamyl ketone, methylisobutyl ketone, or cyclohexanone; an alcohol such as ethanol, propanol, butanol, hexanol, cyclohexanol, ethyleneglycol, or glycerine; an ester such as 3-ethoxypropionate ethyl ester, 3-methoxypropionate methyl ester, or 3-phenyl-propionate ethyl ester; a cyclic ester such as γ-butyrolactone; a methoxy benzene (also known as anisol or anisole); or any combination thereof.

In an embodiment, the solvent may be a methoxy benzene (also known as anisol or anisole).

In an embodiment, the cross-linking of the quantum dot-containing material may be performed by exposure to ultraviolet rays.

As the organic group chemically bound to a surface of the quantum dot in the quantum dot-containing material includes an azide group, photo-cross-linking reaction may occur. Thus, stability of the quantum dot-containing material may improve. As the organic group may include a charge transport group, and the charge transport group may not be an unsubstituted benzene group, intermixing between an emission layer and a hole transport region may be reduced, thus improving efficiency of the quantum dot-containing material.

The cross-linked material of the quantum dot-containing material may improve stability and efficiency due to a cross-link bond. Thus, a light-emitting device, e.g., an organic light-emitting device, may have a high or improved hole mobility and long or improved lifespan.

A light-emitting device including the cross-linked material 132 may include:
a first electrode;
a second electrode facing the first electrode; and
an interlayer between the first electrode and the second electrode and including an emission layer,
wherein the light-emitting device may include the cross-linked material.

In an embodiment, the emission layer may include the cross-linked material.

In an embodiment, the emission layer may emit red light.

According to an embodiment, an electronic apparatus may include the light-emitting device. The electronic apparatus may further include a thin-film transistor.

In an embodiment, the electronic apparatus may further include a thin-film transistor including a source electrode and drain electrode, and a first electrode of the light-emitting device may be electrically connected to the source electrode or the drain electrode.

In an embodiment, the electronic apparatus may further include a color filter, a color-conversion layer, a touchscreen layer, a polarization layer, or any combination thereof. In an embodiment, the electronic apparatus may be a flat panel display device, but embodiments are not limited thereto.

The electronic apparatus may be understood by referring to the description of the electronic apparatus provided herein.

Figure 3:
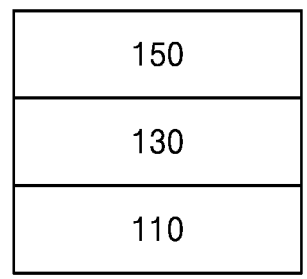
FIG. 3 is a schematic cross-sectional view of a light-emitting device according to an embodiment.

Description of FIG. 3

FIG. 3 is a schematic view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 3.

First Electrode 110

In FIG. 3, a substrate may be additionally located under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may easily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including of a single layer or a multi-layered structure including two or more layers. In an embodiment, the first electrode 110 may have a triple-layered structure of ITO/Ag/ITO.

Interlayer 130

The interlayer 130 may be on the first electrode 110. The interlayer 130 may include an emission layer.

The interlayer 130 may include the cross-linked material 132.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting units sequentially stacked between the first electrode 110 and the second electrode 150; and ii) a charge-generation layer located between the at least two emitting units. While not wishing to be bound by theory, it is understood that when the interlayer 130 includes the at least two emitting units and the charge generation layer, the light-emitting device 10 may be a tandem light-emitting device.

Hole Transport Region in Interlayer 130

The hole transport region may have i) a single-layered structure including of a single layer including of a single material, ii) a single-layered structure including of a single layer including a plurality of different materials, or iii) a multi-layered structure including a plurality of layers including a plurality of different materials.

The hole transport region may include a hole injection layer (HIL), a hole transport layer (HTL), an emission auxiliary layer, an electron blocking layer (EBL), or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers of each structure are sequentially stacked on the first electrode 110 in each stated order.

The hole transport region may include the compound represented by Formula 201, the compound represented by Formula 202, or any combination thereof:

Formula 201

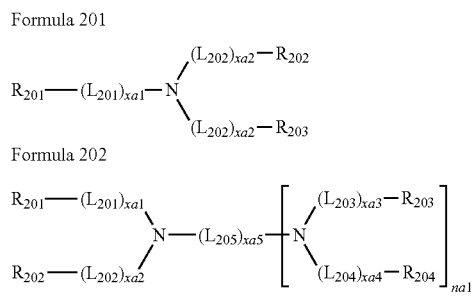

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In an embodiment, Formulae 201 and 202 may each include at least one of groups represented by Formulae CY201 to CY217:

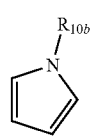

CY201

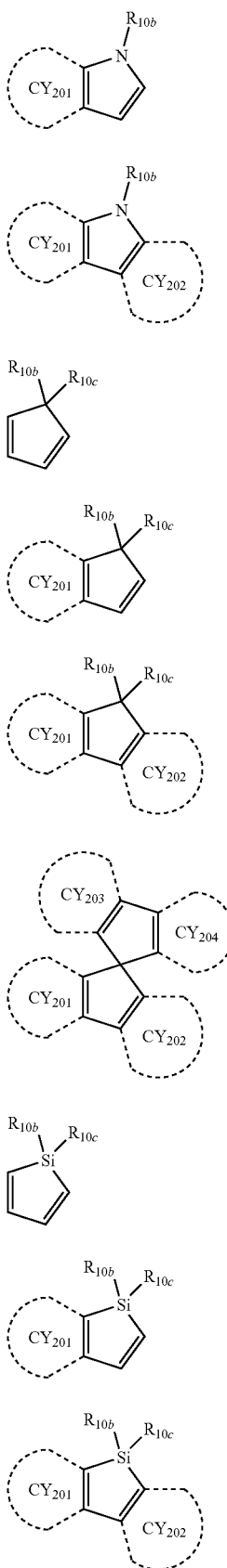
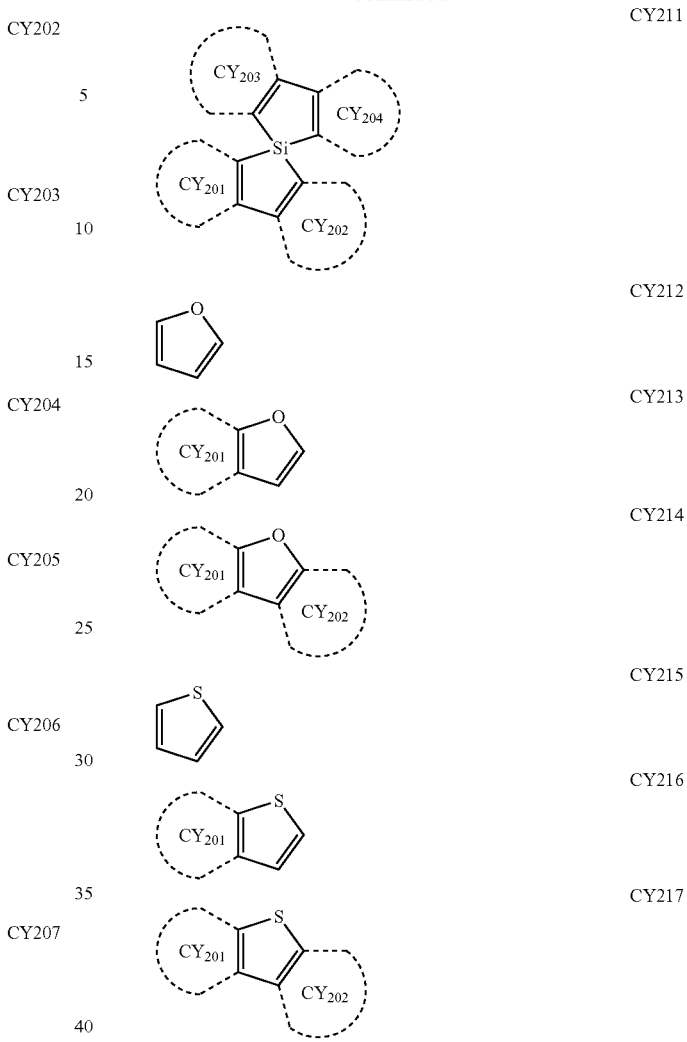

wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In an embodiment, Formulae 201 and 202 may each include at least one of groups represented by Formulae CY201 to CY203.

In an embodiment, Formula 201 may include at least one of groups represented by Formulae CY201 to CY203 or at least one of groups represented by Formulae CY204 to CY217.

In an embodiment, in Formula 201, xa1 may be 1, $R_{201}$ may be a group represented by any one of Formulae CY201 to CY203, xa2 may be 0, and $R_{202}$ may be a group represented by any one of Formulae CY204 to CY207.

In an embodiment, Formulae 201 and 202 may each not include groups represented by Formulae CY201 to CY203.

In an embodiment, Formulae 201 and 202 may each not include groups represented by Formulae CY201 to CY203, and include at least one of groups represented by Formulae CY204 to CY217.

In an embodiment, Formulae 201 and 202 may each not include groups represented by Formulae CY201 to CY217.

In an embodiment, the hole transport region may include one of Compounds HT1 to HT46, or m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate)(PEDOT/PSS), polyaniline/camphorsulfonic acid (PANI/CSA), polyaniline/poly(4-styrenesulfonate) (PANI/PSS), or any combination thereof:

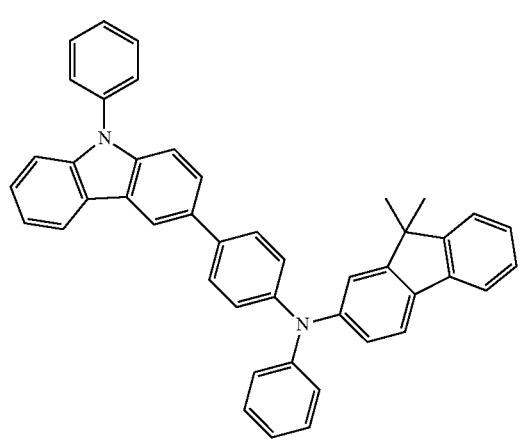

HT1

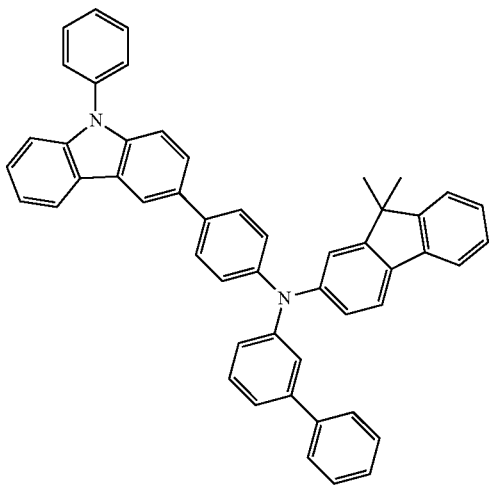

HT2

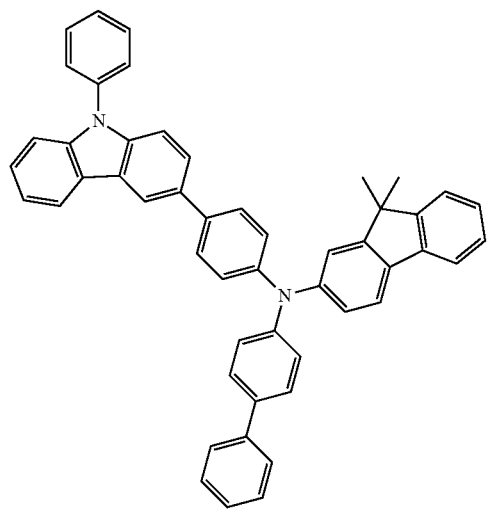

HT3

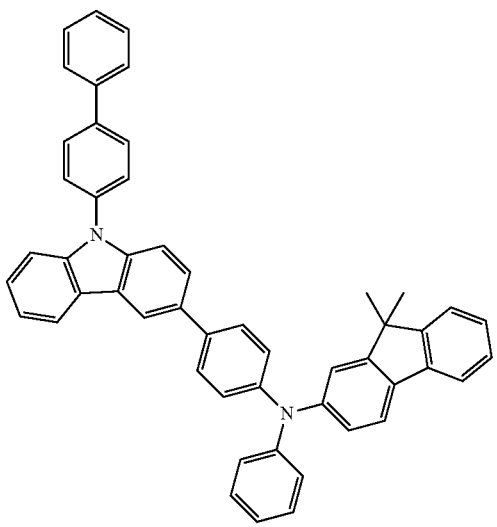

HT4

-continued
HT5
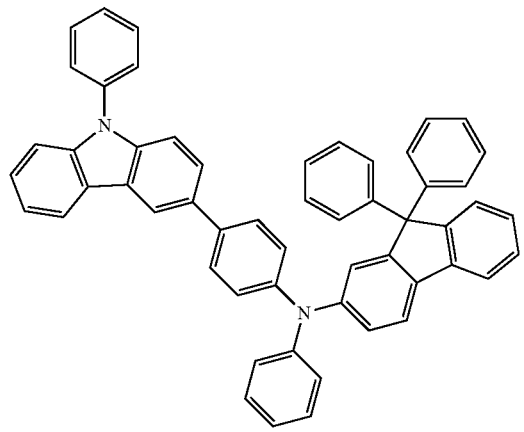
HT6
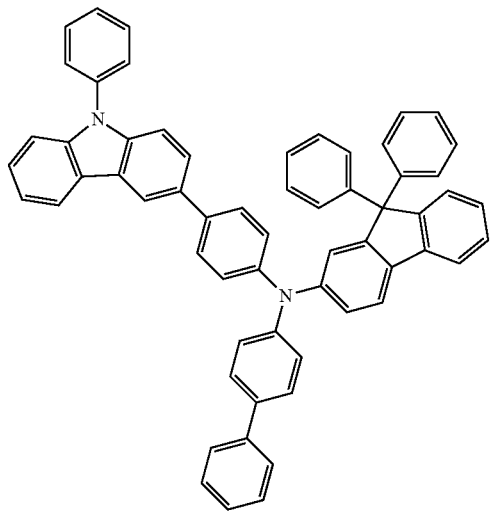
HT7
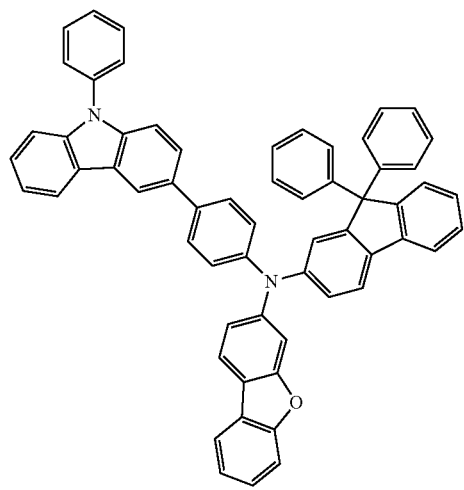
HT8
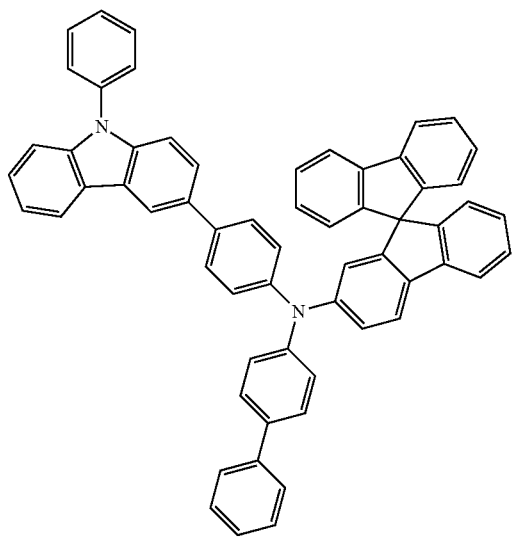
HT9
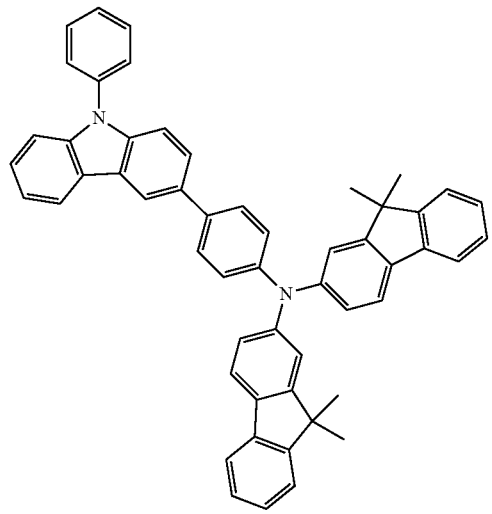
HT10
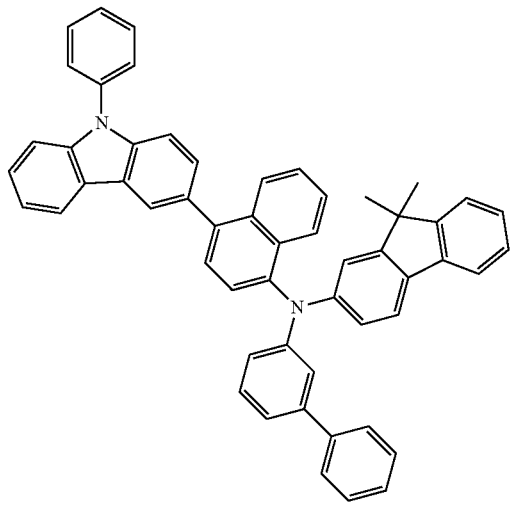

-continued
HT11 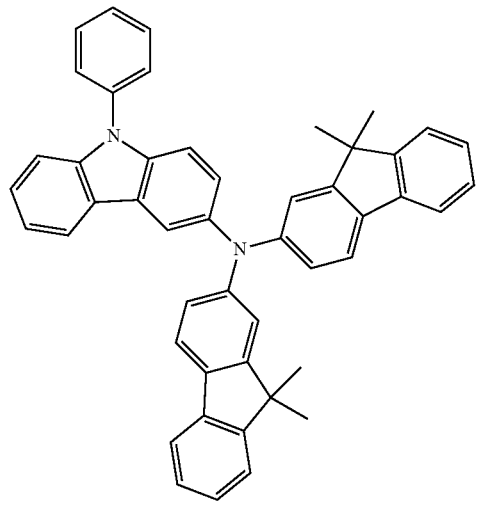
HT12 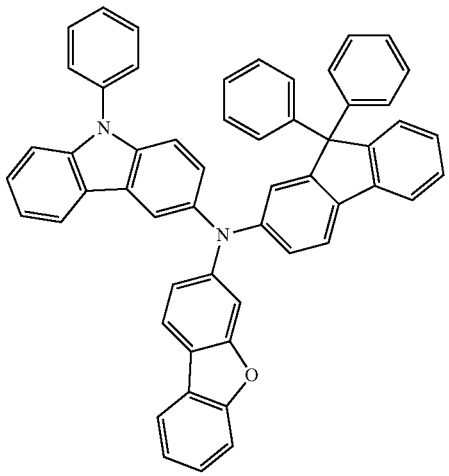
HT13 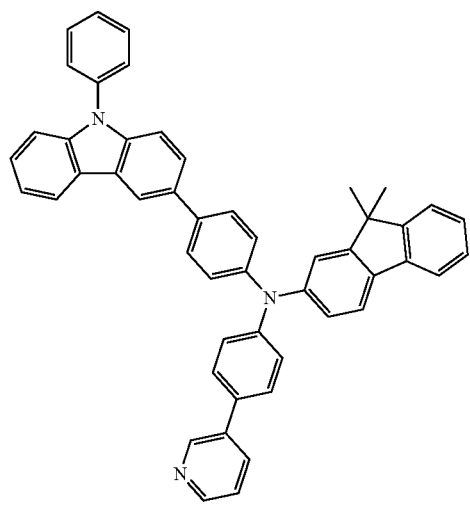
HT14 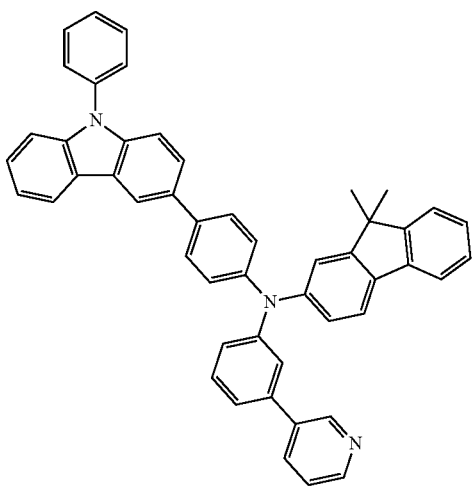
HT15 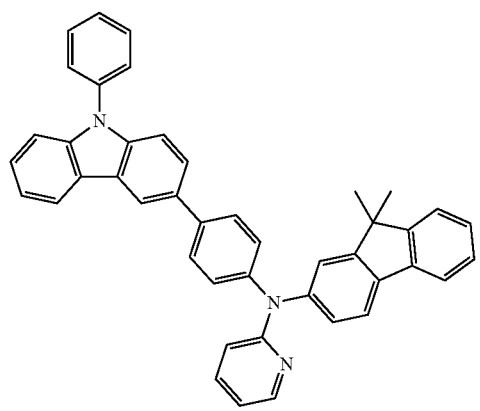
HT16 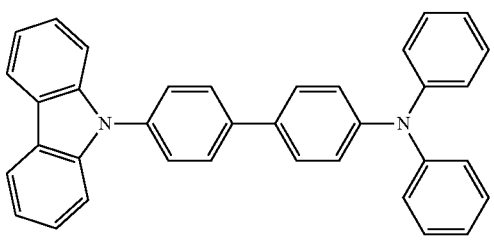

-continued
HT17
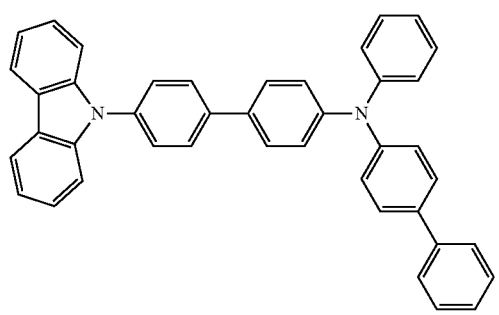
HT18
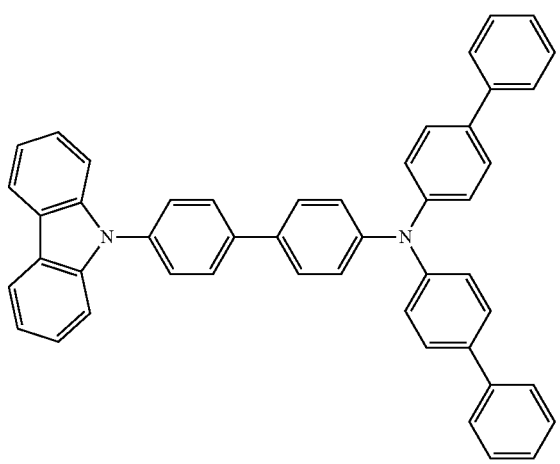
HT19
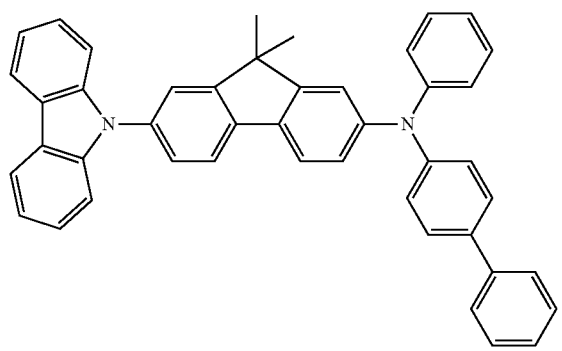
HT20
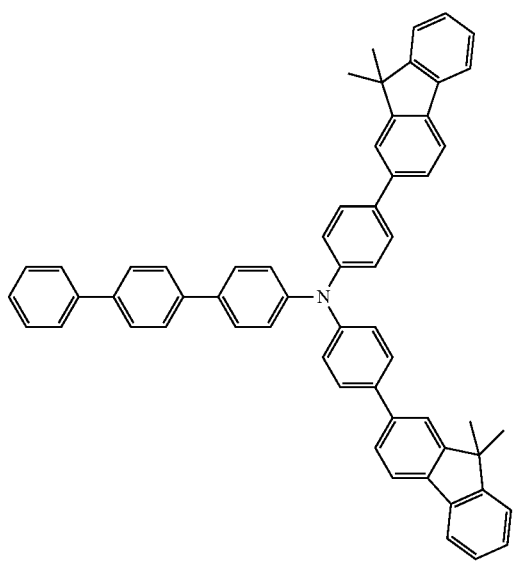
HT21
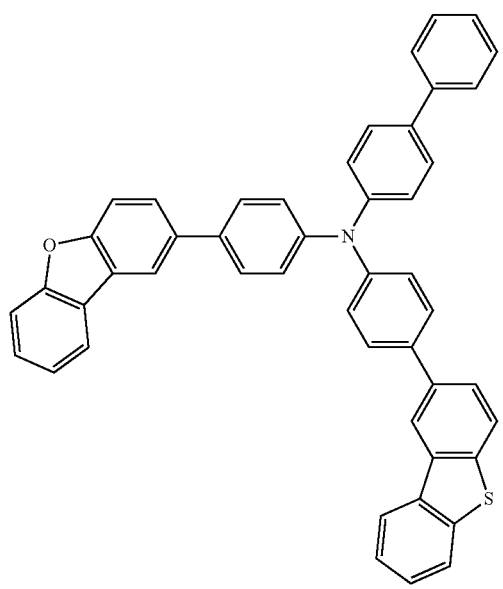
HT22
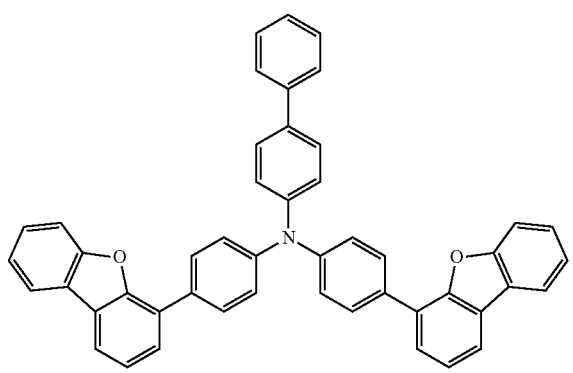

-continued
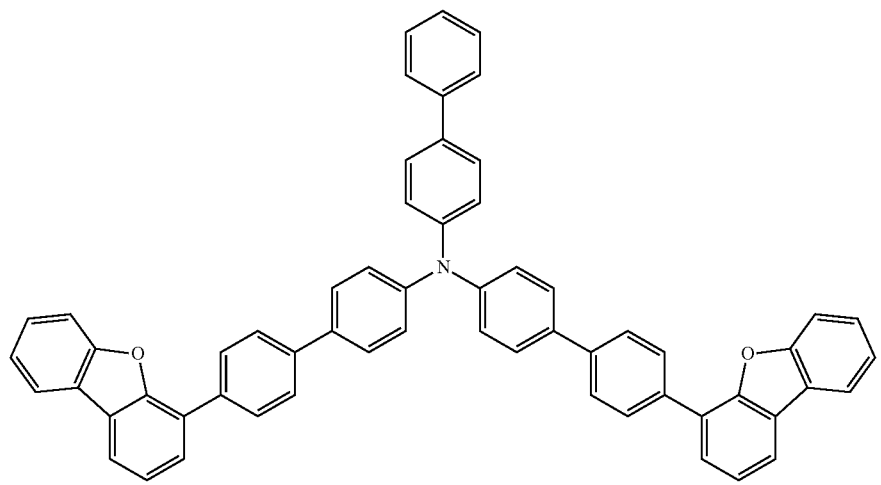
HT23
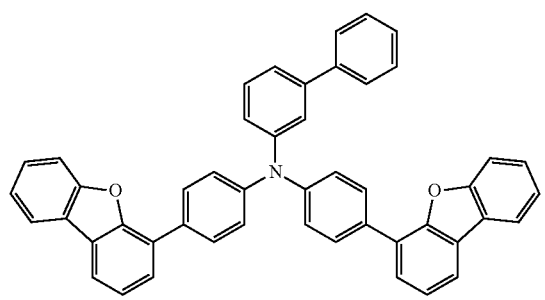
HT24
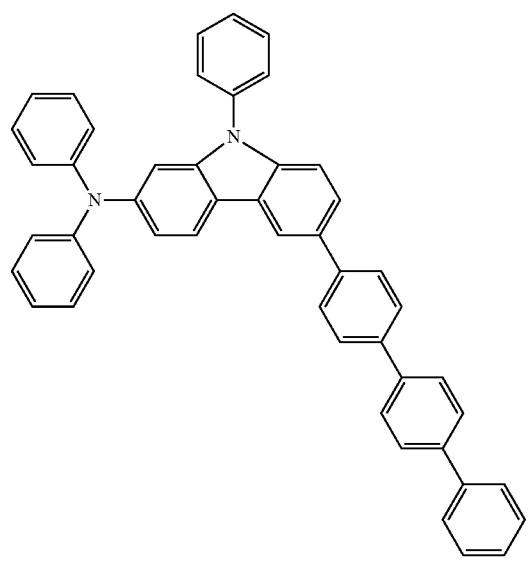
HT25
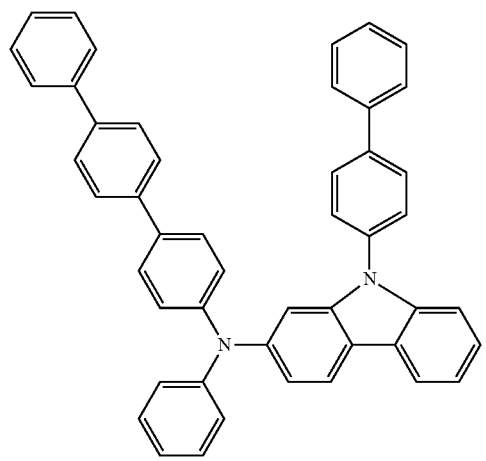
HT26
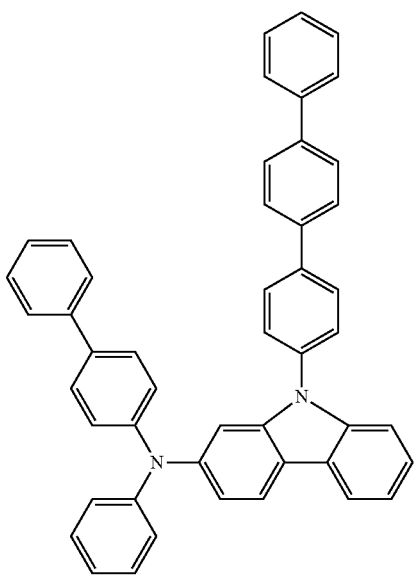
HT27

-continued
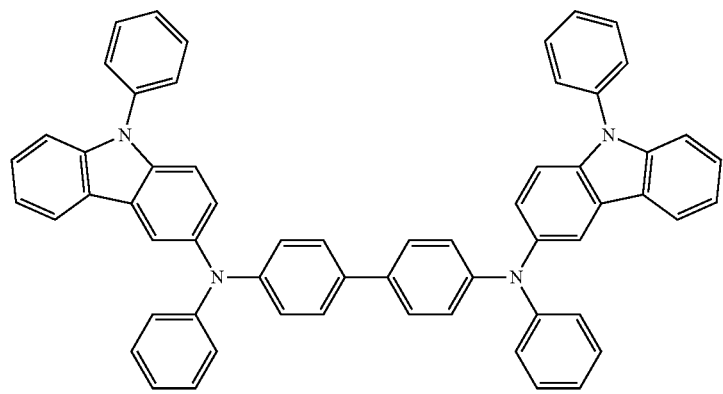
HT28
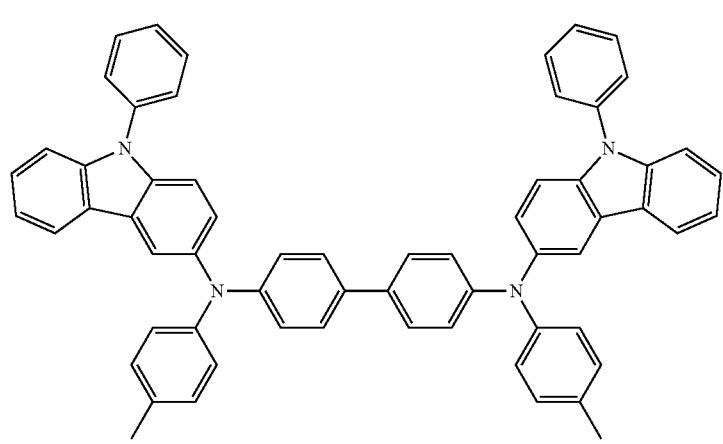
HT29
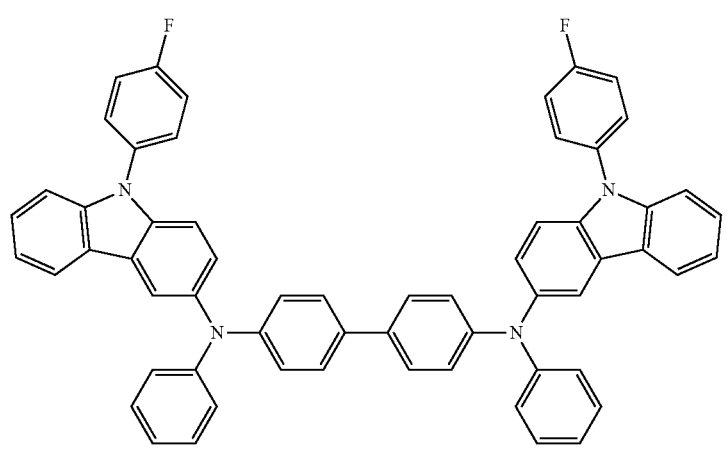
HT30

-continued
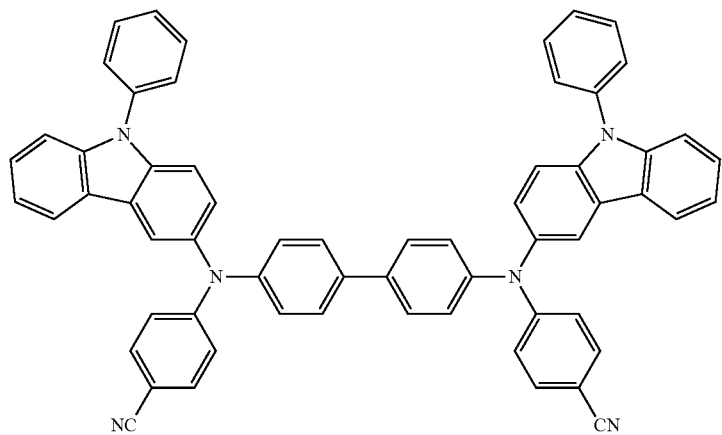
HT31
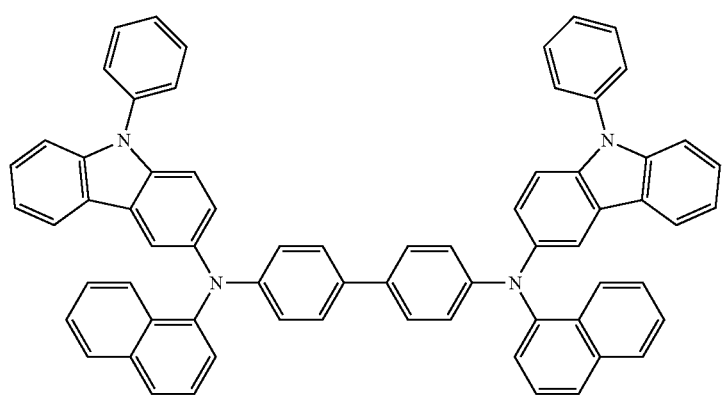
HT32
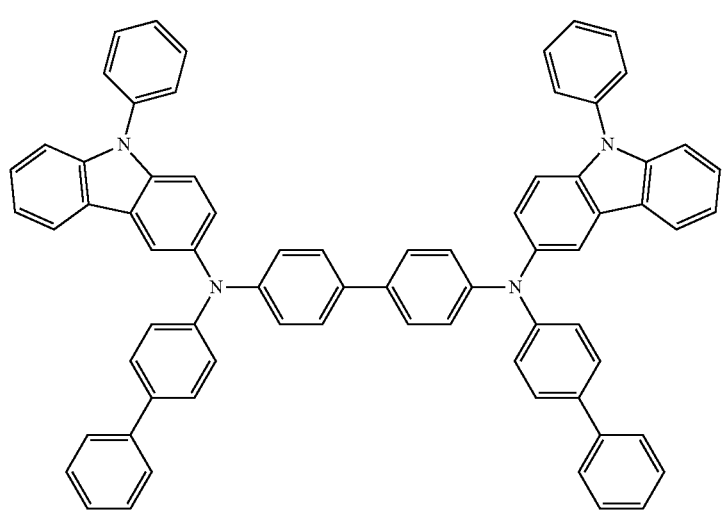
HT33

-continued
HT34
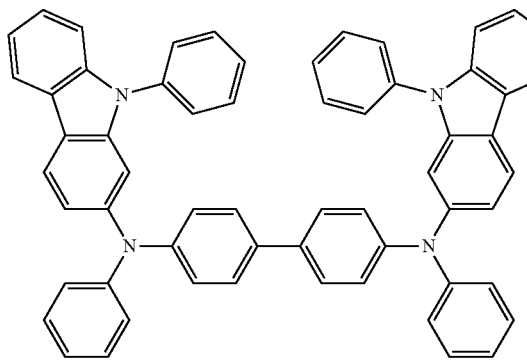
HT35
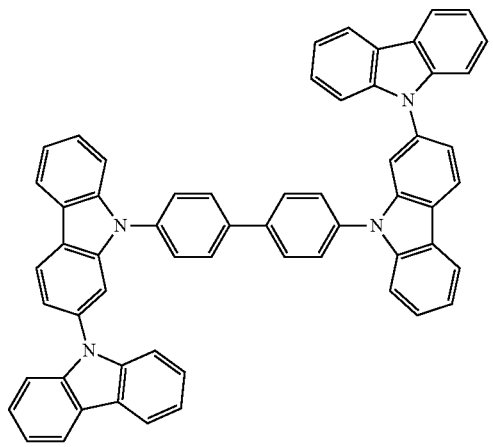
HT36
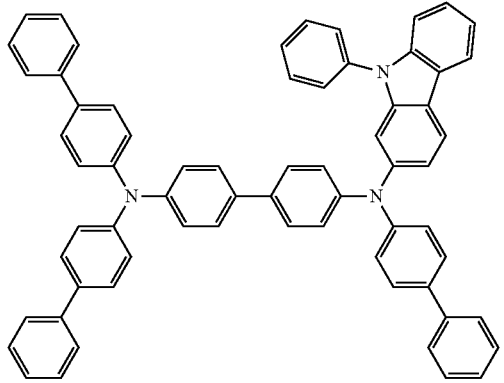
HT37
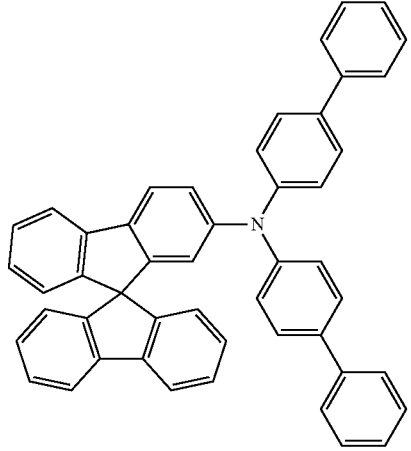
HT38
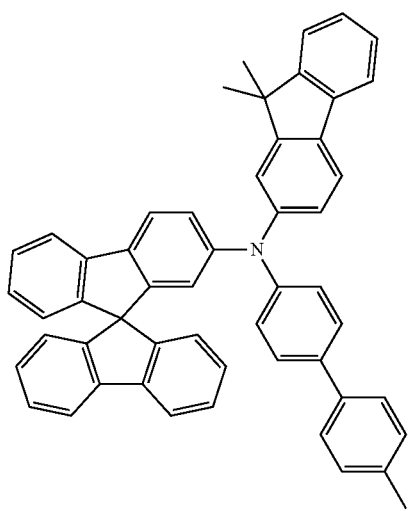
HT39
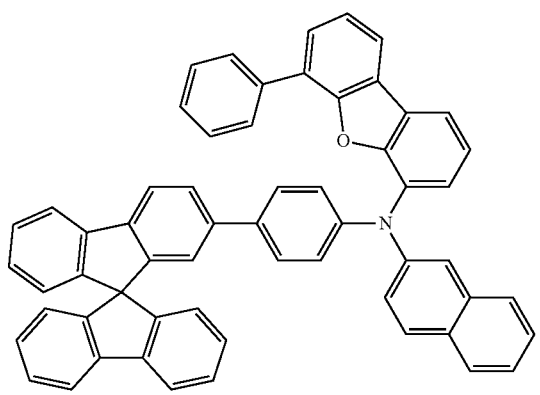

-continued
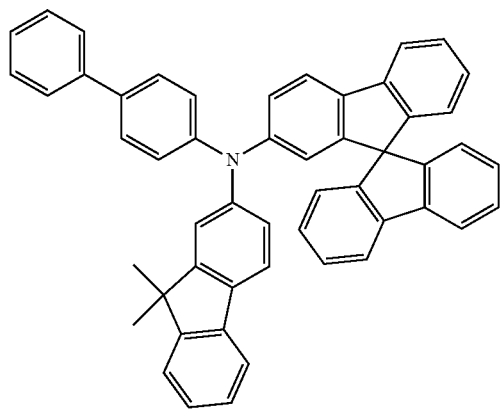
HT40
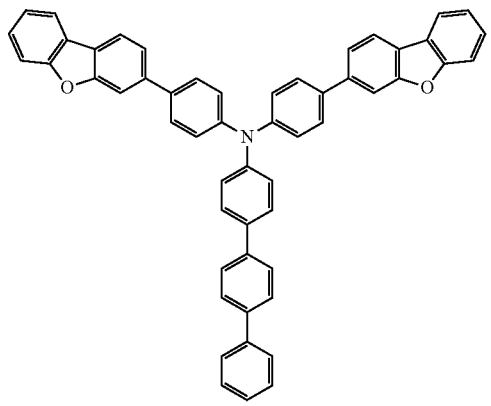
HT41
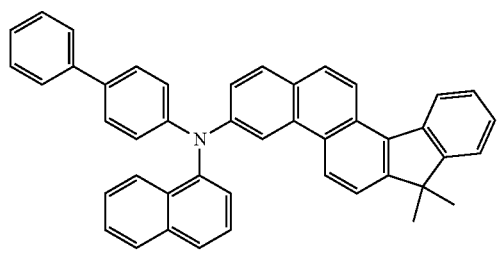
HT42
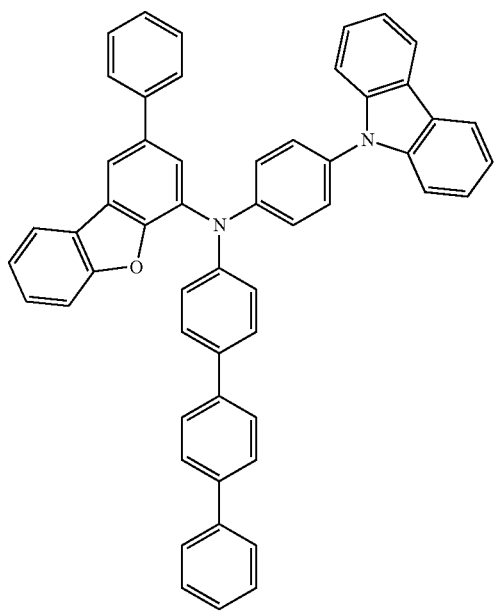
HT43
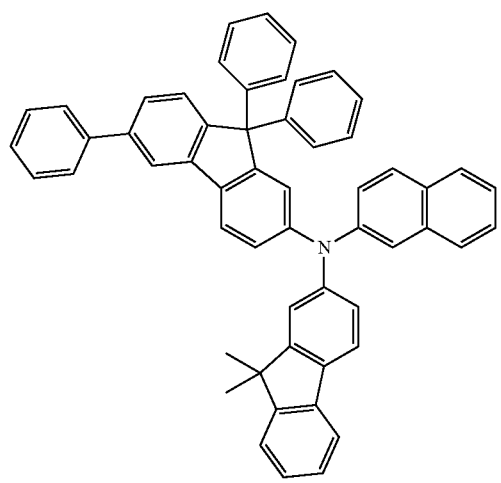
HT44
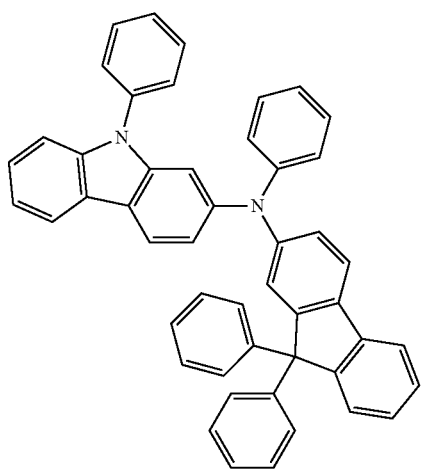
HT45

-continued
HT46
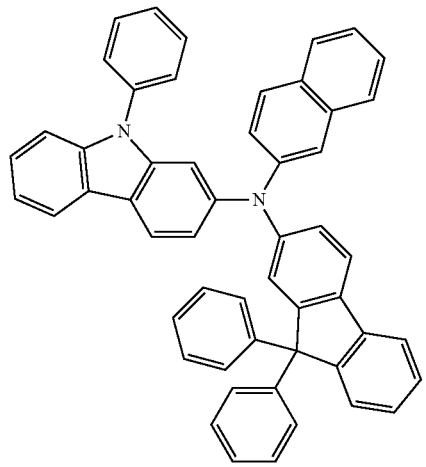
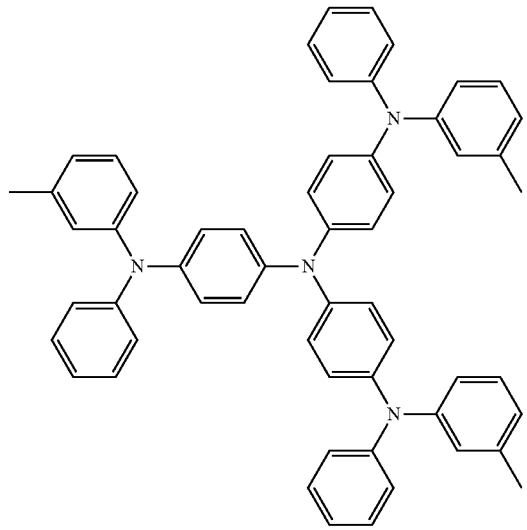
m-MTDATA
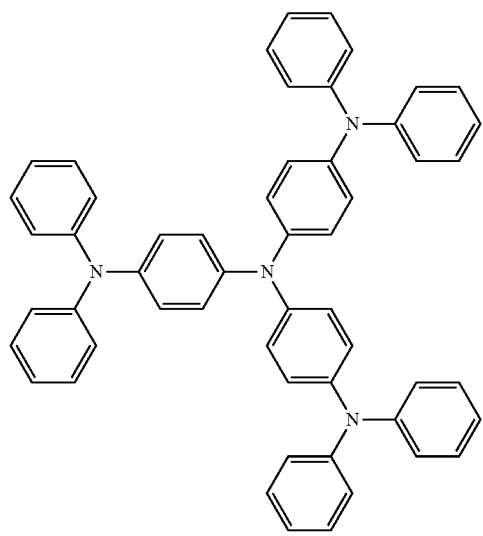
TDATA
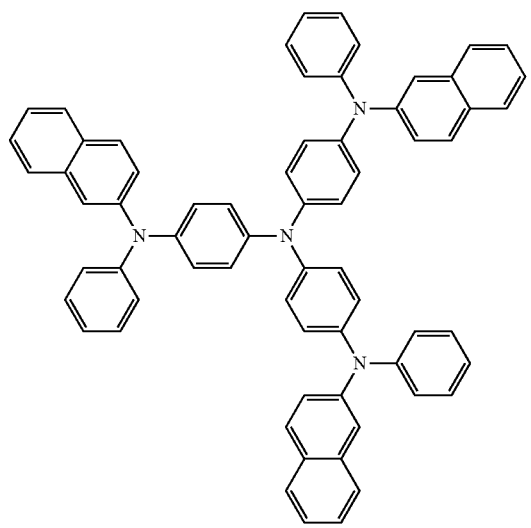
2-TNATA
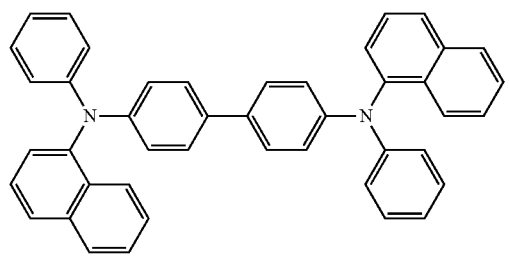
NPB
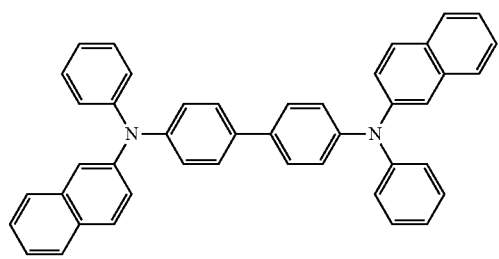
β-NPB -continued

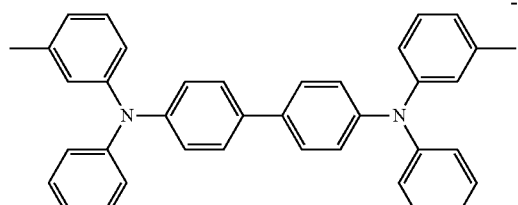

TPD

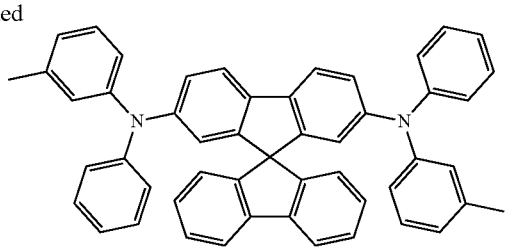

Spiro-TPD

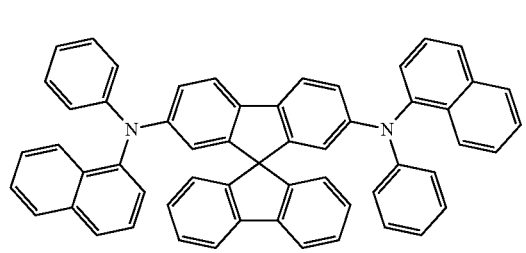

Sprio-NPB

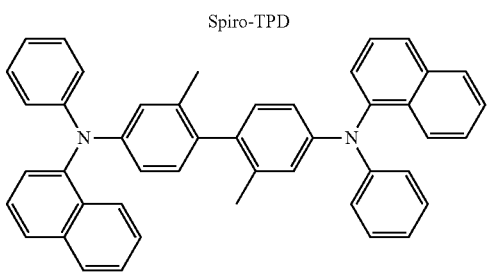

methylated-NPB

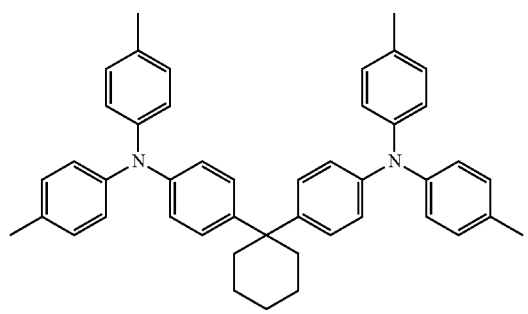

TAPC

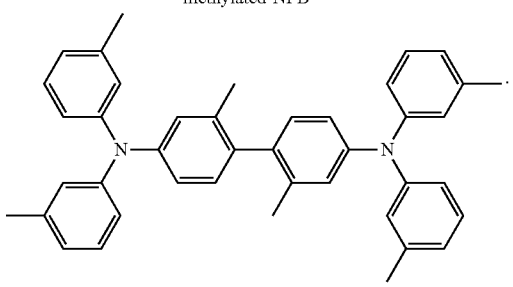

HMTPD

The thickness of the hole transport region may be in a range of about 50 Angstroms (Å) to about 10,000 Å, for example, about 100 Å to about 4,000 Å, about 200 Å to about 9,000 Å, about 300 Å to about 8,000 Å, about 500 Å to about 7,000 Å, about 600 Å to about 6,000 Å, about 700 Å to about 5,000 Å, about 800 Å to about 4,000 Å, about 900 Å to about 3,000 Å, and about 1000 Å to about 2,000 Å. When the hole transport region includes a hole injection layer, a hole transport layer, and any combination thereof, the thickness of the hole injection layer may be in a range of about 100 Å to about 9,000 Å, for example, about 100 Å to about 1,000 Å, about 200 Å to about 9000 Å, about 300 Å to about 8000 Å, about 400 Å to about 7000 Å, and about 500 Å to about 6000 Å, 1000 Å to about 6000 Å, 1000 Å to about 5000 Å, 1000 Å to about 4000 Å, 1000 Å to about 3000 Å, or 1000 Å to about 2000 Å; the thickness of the hole transport layer may be in a range of about 50 Å to about 2,000 Å, for example, about 100 Å to about 1,500 Å, about 200 Å to about 1,000 Å, or about 300 Å to about 500 Å. While not wishing to be bound by theory, it is understood that when the thicknesses of the hole transport region, the hole injection layer, and the hole transport layer are within any of these ranges, excellent or improved hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

p-Dopant

The hole transport region may include a charge generating material as well as the aforementioned materials to improve conductive properties of the hole transport region. The charge generating material may be substantially homogeneously or non-homogeneously dispersed (for example, as a single layer including of charge generating material) in the hole transport region.

The charge generating material may include, for example, a p-dopant.

In an embodiment, a lowest unoccupied molecular orbital (LUMO) energy level of the p-dopant may be about −3.5 electronvolt (eV) or less.

In an embodiment, the p-dopant may include a quinone derivative, a cyano group-containing compound, an elements EL1 and EL2-containing compound, or any combination thereof.

Examples of the quinone derivative may include TCNQ, F4-TCNQ, and the like.

Examples of the cyano group-containing compound include HAT-CN, a compound represented by Formula 221, and the like:

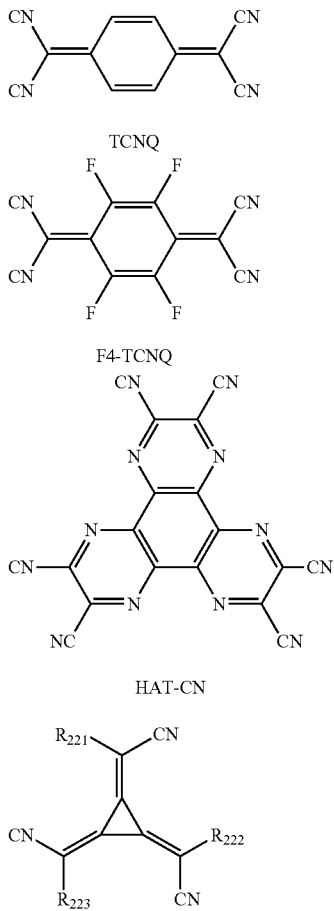

TCNQ

F4-TCNQ

HAT-CN

Formula 221 wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, each independently substituted with a cyano group; —F; —Cl; —Br; —I; a $C_1$-$C_{20}$ alkyl group substituted with a cyano group, —F, —Cl, —Br, —I, or any combination thereof; or any combination thereof.

In the elements EL1 and EL2-containing compound, element EL1 may be a metal, a metalloid, or a combination thereof, and element EL2 may be a non-metal, a metalloid, or a combination thereof.

Examples of the metal may include: an alkali metal (e.g., lithium (Li), sodium (Na), potassium (K), rubidium (Rb), cesium (Cs), or the like; an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the elements EL1 and EL2-containing compound may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include tungsten oxide (e.g., WO, $W_2O_3$, $WO_2$, $WO_3$, $W_2O_5$, and the like), vanadium oxide (e.g., VO, $V_2O_3$, $VO_2$, $V_2O_5$, and the like), molybdenum oxide (MoO, $Mo_2O_3$, $MoO_2$, $MoO_3$, $Mo_2O_5$, and the like), rhenium oxide (e.g., $ReO_3$, and the like), and the like.

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include titanium halide (e.g., $TiF_4$, $TiCl_4$, $TiBr_4$, $TiI_4$, and the like), zirconium halide (e.g., $ZrF_4$, $ZrCl_4$, $ZrBr_4$, $ZrI_4$, and the like), hafnium halide (e.g., $HfF_4$, $HfCl_4$, $HfBr_4$, $HfI_4$, and the like), vanadium halide (e.g., $VF_3$, $VCl_3$, $VBr_3$, $VI_3$, and the like), niobium halide (e.g., $NbF_3$, $NbCl_3$, $NbBr_3$, $NbI_3$, and the like), tantalum halide (e.g., $TaF_3$, $TaCl_3$, $TaBr_3$, $TaI_3$, and the like), chromium halide (e.g., $CrF_3$, $CrCl_3$, $CrBr_3$, $CrI_3$, and the like), molybdenum halide (e.g., $MoF_3$, $MoCl_3$, $MoBr_3$, $MoI_3$, and the like), tungsten halide (e.g., $WF_3$, $WCl_3$, $WBr_3$, $WI_3$, and the like), manganese halide (e.g., $MnF_2$, $MnCl_2$, $MnBr_2$, $MnI_2$, and the like), technetium halide (e.g., $TcF_2$, $TcCl_2$, $TcBr_2$, $TcI_2$, and the like), rhenium halide (e.g., $ReF_2$, $ReCl_2$, $ReBr_2$, $ReI_2$, and the like), iron halide (e.g., $FeF_2$, $FeCl_2$, $FeBr_2$, $FeI_2$, and the like), ruthenium halide (e.g., $RuF_2$, $RuCl_2$, $RuBr_2$, $RuI_2$, and the like), osmium halide (e.g., $OsF_2$, $OsCl_2$, $OsBr_2$, $OsI_2$, and the like), cobalt halide (e.g., $CoF_2$, $CoCl_2$, $CoBr_2$, $CoI_2$, and the like), rhodium halide (e.g., $RhF_2$, $RhCl_2$, $RhBr_2$, $RhI_2$, and the like), iridium halide (e.g., $IrF_2$, $IrCl_2$, $IrBr_2$, $IrI_2$, and the like), nickel halide (e.g., $NiF_2$, $NiCl_2$, $NiBr_2$, $NiI_2$, and the like), palladium halide (e.g., $PdF_2$, $PdCl_2$, $PdBr_2$, $PdI_2$, and the like), platinum halide (e.g., $PtF_2$, $PtCl_2$, $PtBr_2$, $PtI_2$, and the like), copper halide (e.g., CuF, CuCl, CuBr, CuI, and the like), silver halide (e.g., AgF, AgCl, AgBr, AgI, and the like), gold halide (e.g., AuF, AuCl, AuBr, AuI, and the like), and the like.

Examples of the post-transition metal halide may include zinc halide (e.g., $ZnF_2$, $ZnCl_2$, $ZnBr_2$, $ZnI_2$, and the like), indium halide (e.g., $InI_3$ and the like), tin halide (e.g., $SnI_2$ and the like), and the like.

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and the like.

Examples of the metalloid halide may include antimony halide (e.g., $SbCl_5$ and the like) and the like.

Examples of the metal telluride may include alkali metal telluride (e.g., $Li_2Te$, $Na_2Te$, $K_2Te$, $Rb_2Te$, $Cs_2Te$, and the like), alkaline earth metal telluride (e.g., BeTe, MgTe, CaTe, SrTe, BaTe, and the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and the like), post-transition metal telluride (e.g., ZnTe and the like), lanthanide metal telluride (e.g., LaTe, CeTe, PrTe, NdTe, PmTe, EuTe, GdTe, TbTe, DyTe, HoTe, ErTe, TmTe, YbTe, LuTe, and the like), and the like.

Emission Layer in Interlayer 130

When the light-emitting device 10 is a full color light-emitting device, the emission layer may be patterned into a red emission layer, a green emission layer, and/or a blue emission layer, according to a sub-pixel. In an embodiment, the emission layer may have a stacked structure. The stacked structure may include two or more layers of a red emission layer, a green emission layer, and a blue emission layer. The two or more layers may be in direct contact with each other. In an embodiment, the two or more layers may be separated from each other. In an embodiment, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include the cross-linked material 132.

The emission layer may further include a host and a dopant. The dopant may be a phosphorescent dopant, a fluorescent dopant, or any combination thereof.

The amount of the dopant in the emission layer may be in a range of about 0.01 parts to about 15 parts by weight based on 100 parts by weight of the host, for example, about 0.01 parts by weight to about 12 parts by weight, about 0.01 parts by weight to about 10 parts by weight, about 0.01 parts by weight to about 8 parts by weight, about 0.01 parts by weight to about 6 parts by weight, about 0.01 parts by weight to about 4 parts by weight, about 0.01 parts by weight to about 2 parts by weight, about 0.01 parts by weight to about 1 parts by weight, about 1 parts by weight to about 15 parts by weight, and about 5 parts by weight to about 15 parts by weight, and about 10 parts by weight to about 15 parts by weight based on total 100 parts by weight of the host.

In an embodiment, the emission layer may further include a quantum dot.

The emission layer may further include a delayed fluorescence material. The delayed fluorescence material may serve as a host or a dopant in the emission layer.

The thickness of the emission layer may be in a range of about 100 Å to about 1,000 Å, and in some embodiments, about 200 Å to about 600 Å, about 200 Å to about 900 Å, about 300 Å to about 800 Å, about 400 Å to about 700 Å, or about 500 Å to about 600 Å.

While not wishing to be bound by theory, it is understood that when the thickness of the emission layer is within any of these ranges, improved luminescence characteristics may be obtained without a substantial increase in driving voltage.

Host

The host may include a compound represented by Formula 301:

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and wherein $Q_{301}$ to $Q_{303}$ may each be understood by referring to the description of $Q_1$ provided herein.

In an embodiment, when xb11 in Formula 301 is 2 or greater, at least two $Ar_{301}$(s) may be bound via a single bond.

In an embodiment, the host may include a compound represented by Formula 301-1, a compound represented by Formula 301-2, or any combination thereof:

Formula 301-1

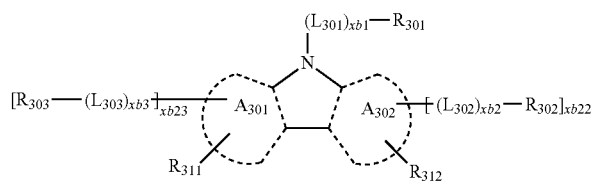

Formula 301-2

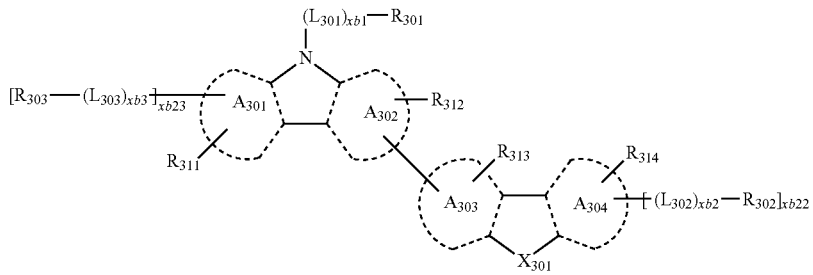

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In an embodiment, the host may include an alkaline earth metal complex. For example, the host may include a Be complex (e.g., Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

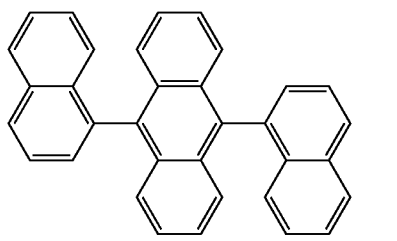

H2

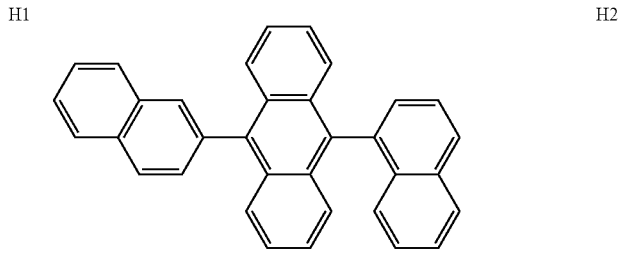

H3

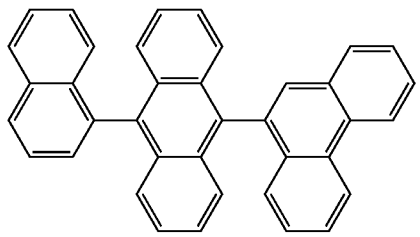

H4

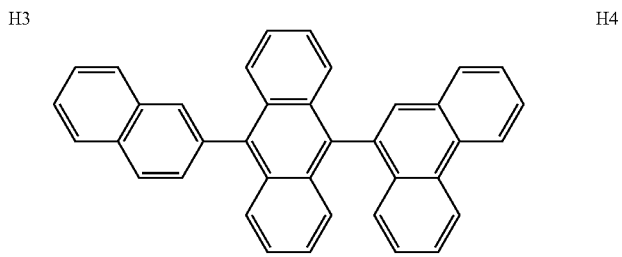

H5

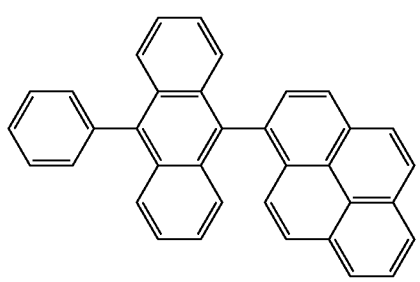

H6

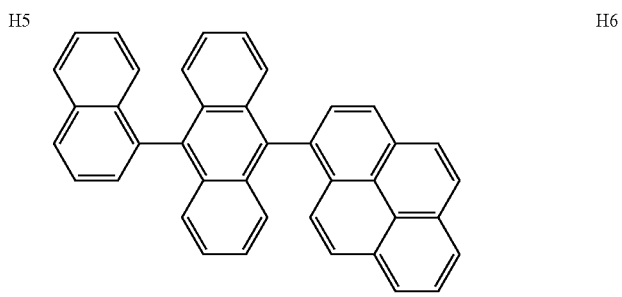

-continued
H7
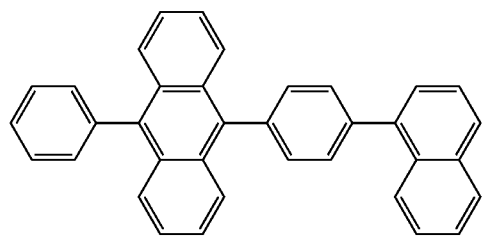
H8
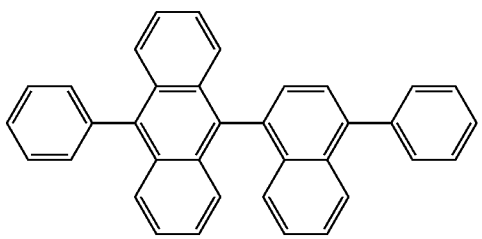
H9
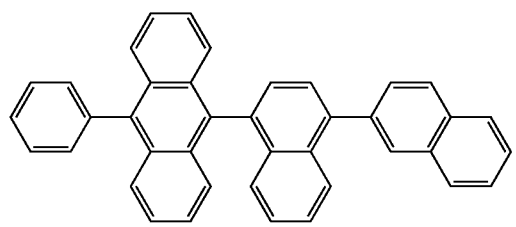
H10
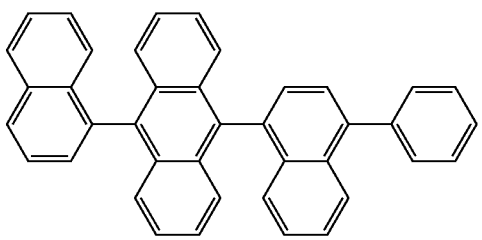
H11
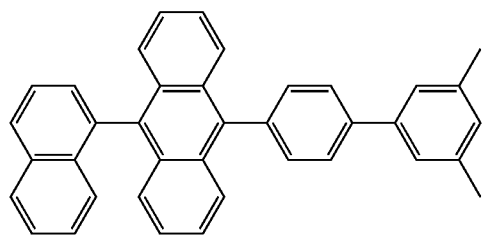
H12
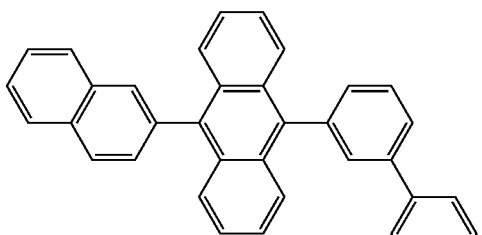
H13
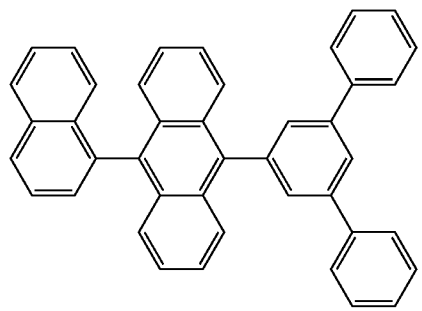
H14
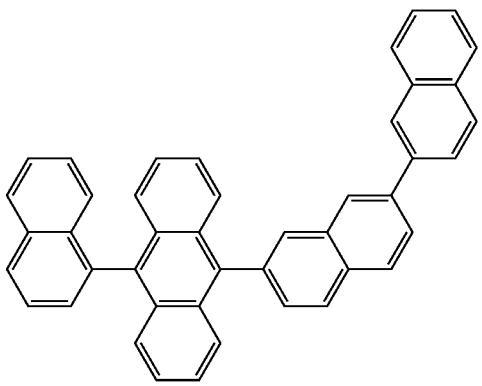
H15
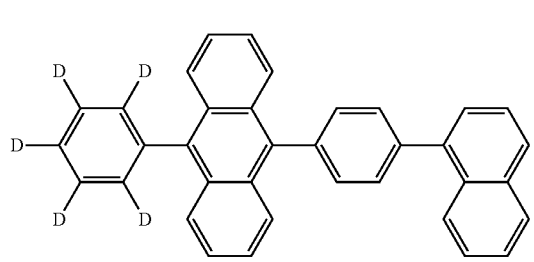
H16
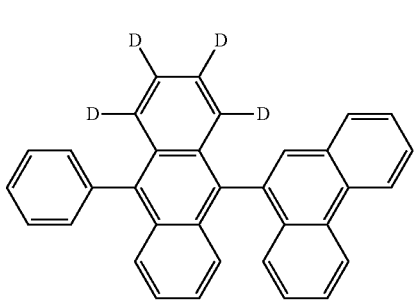

-continued
H17
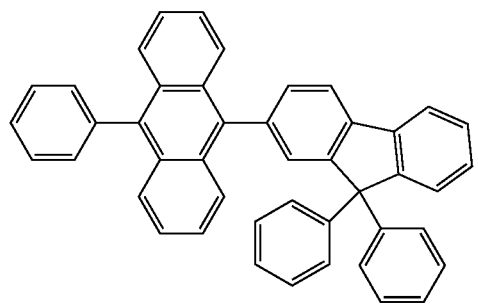
H18
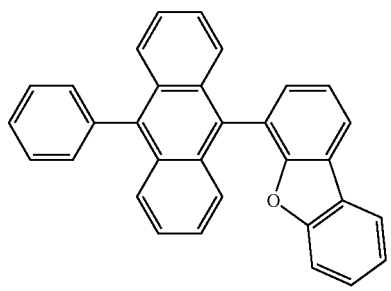
H19
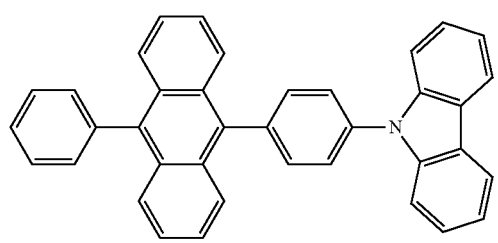
H20
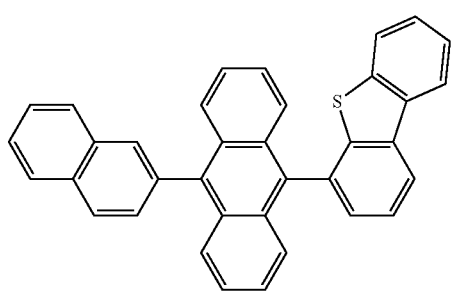
H21
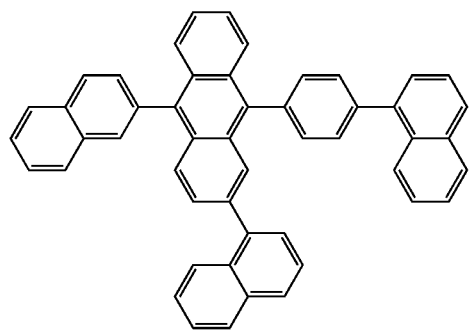
H22
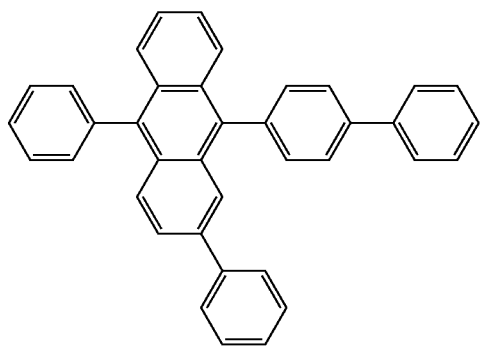
H23
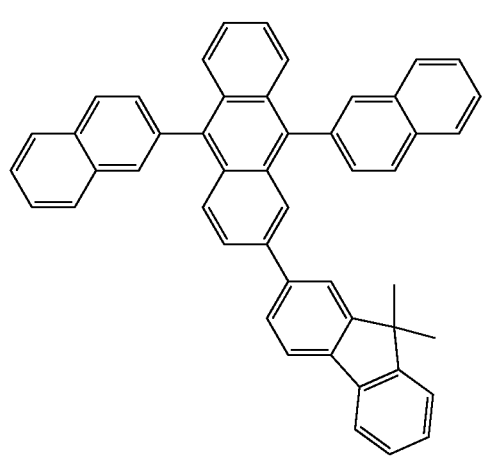
H24
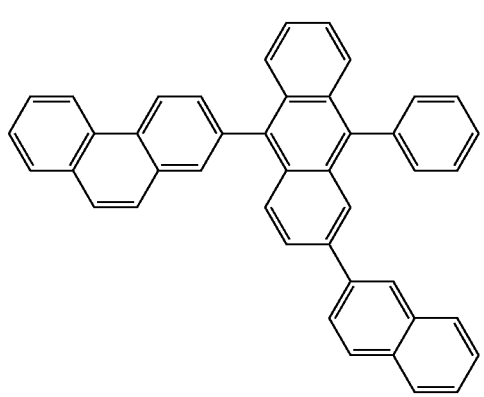

-continued
H25
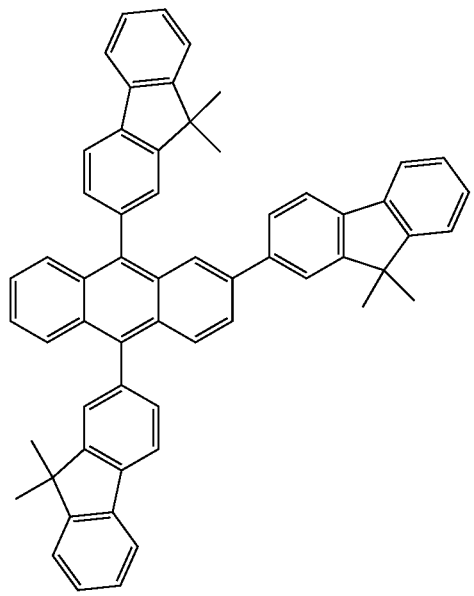
H26
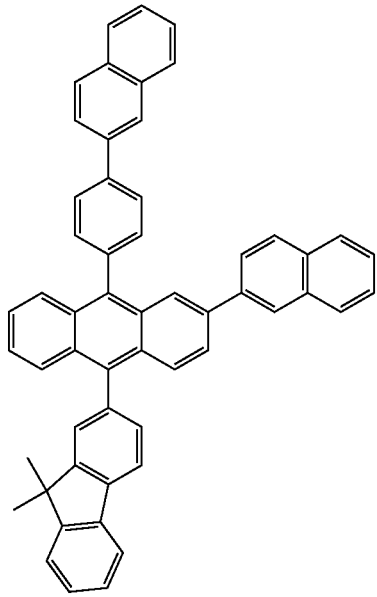
H27
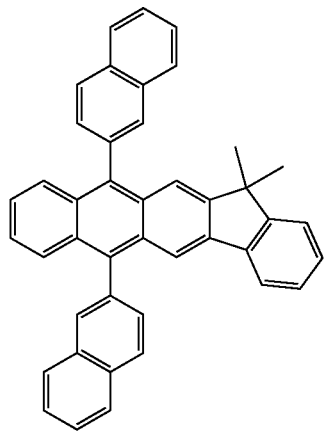
H28
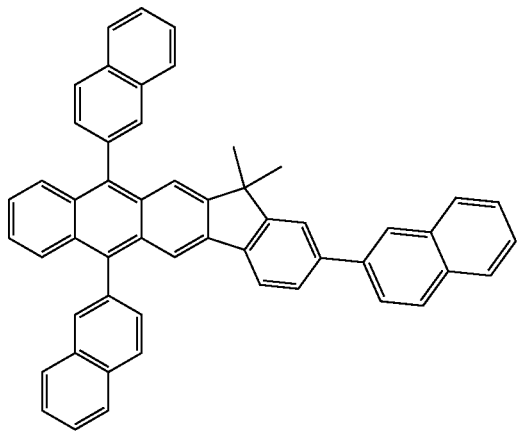
H29
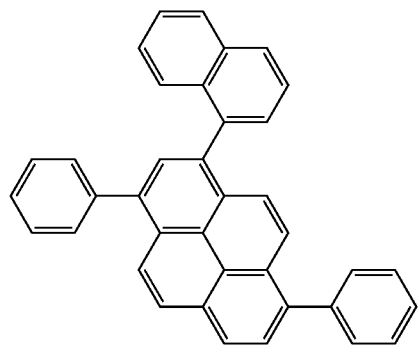
H30
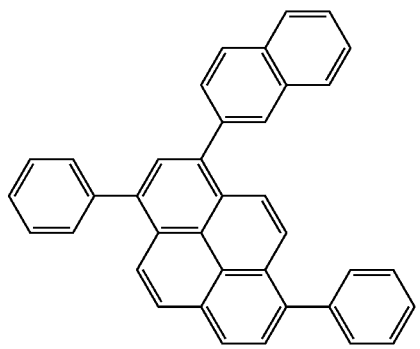

-continued
H31
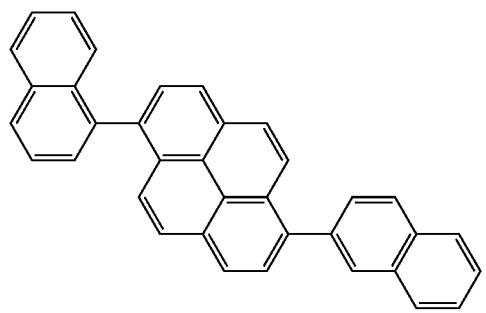
H32
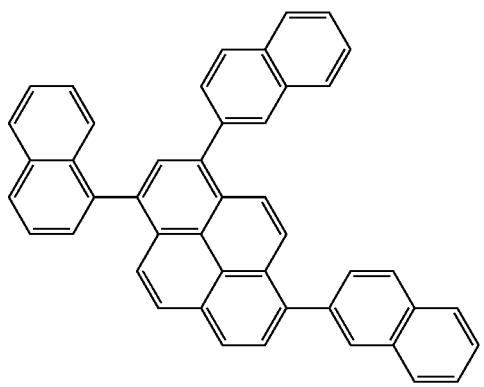
H33
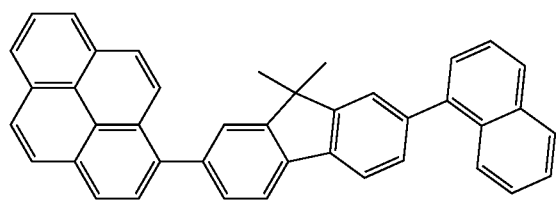
H34
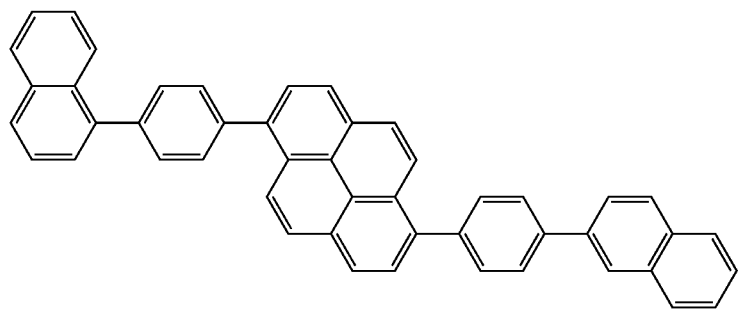
H35
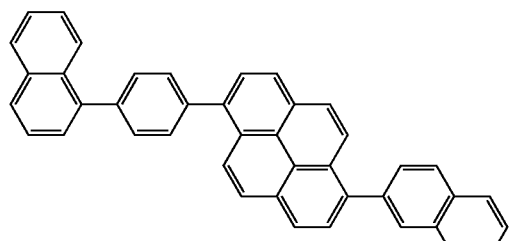
H36
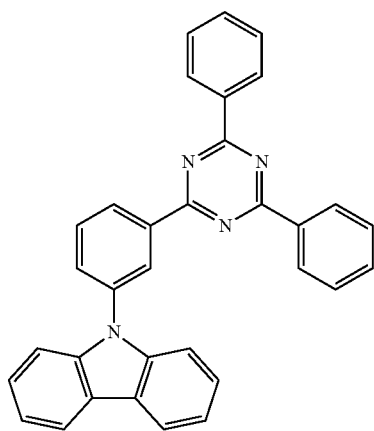

-continued
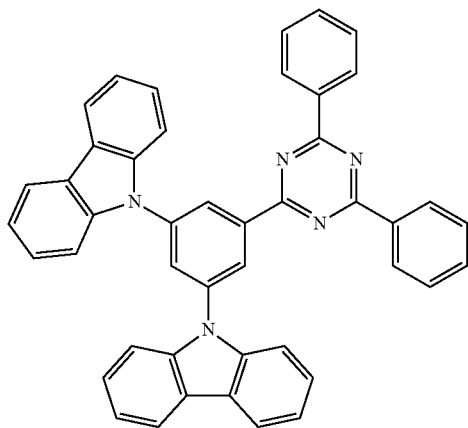
H37
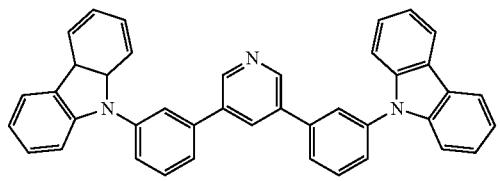
H38
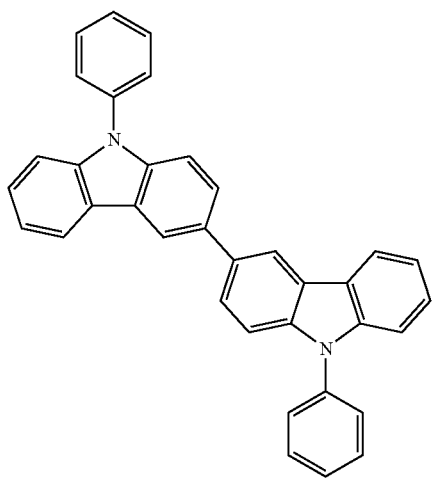
H39
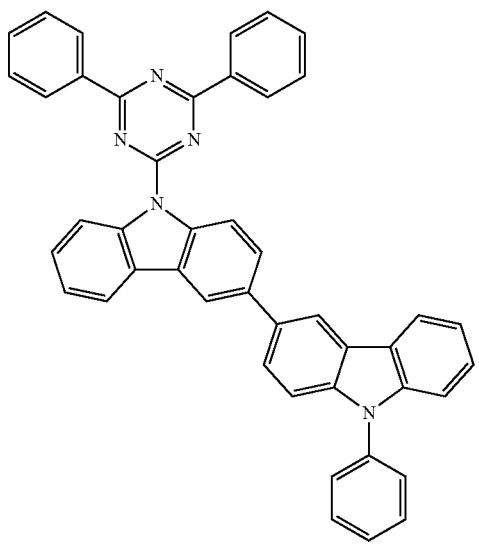
H40
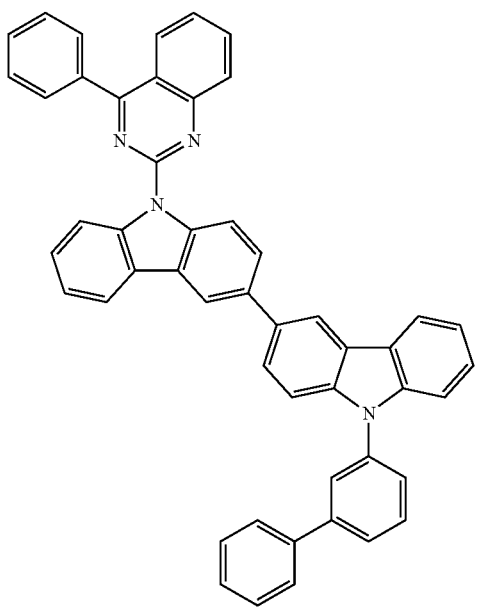
H41
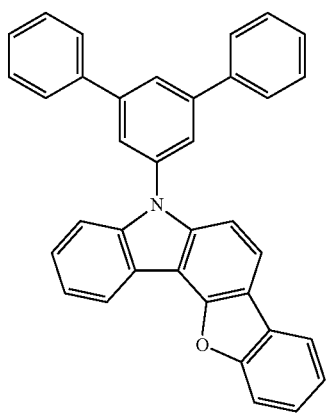
H42

-continued
H43
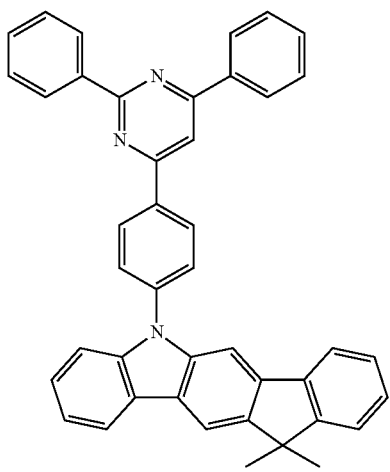
H44
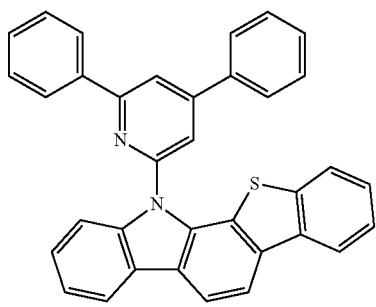
H45
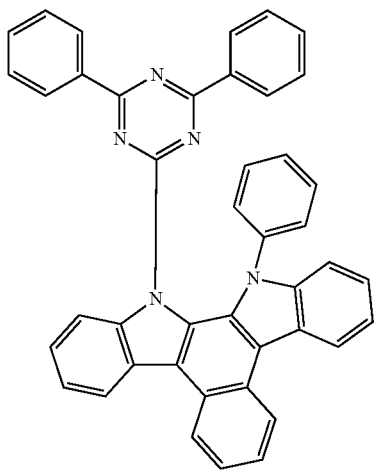
H46
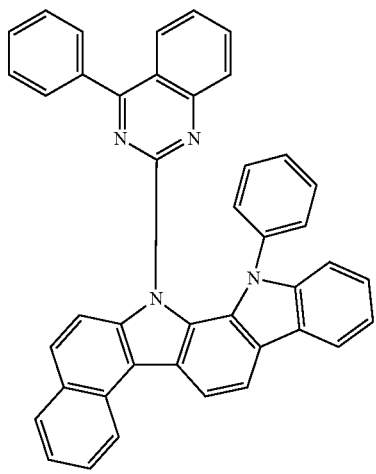
H47
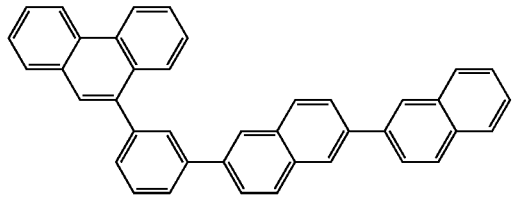
H48
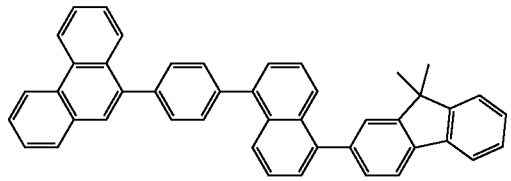
H49
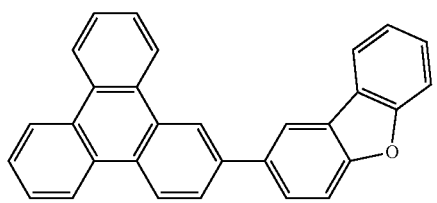
H50
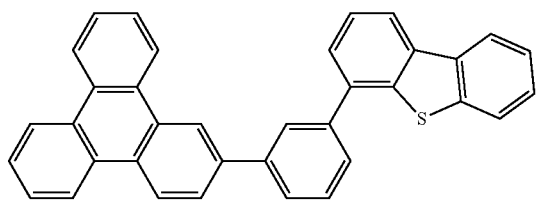

-continued
H51
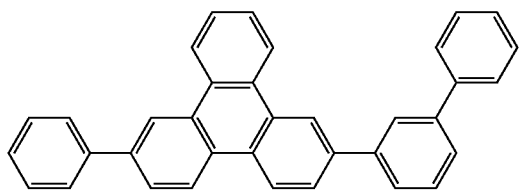
H52
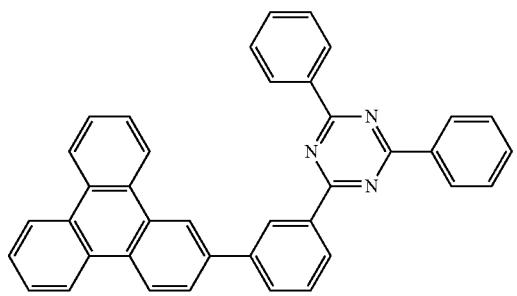
H53
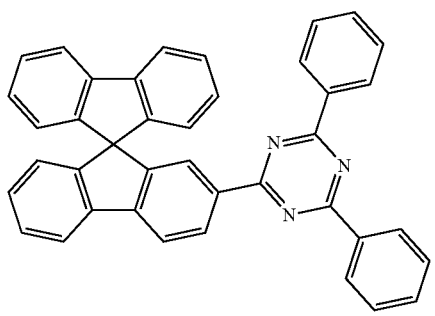
H54
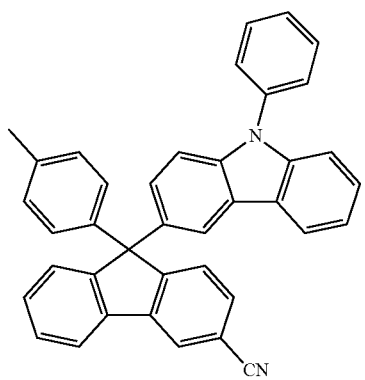
H55
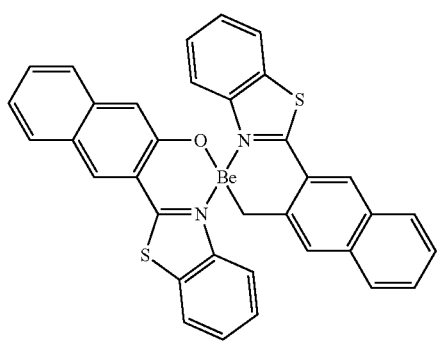
H56
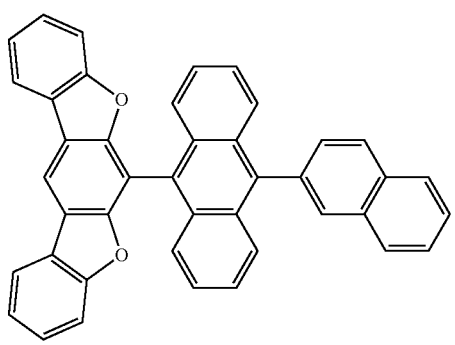
H57
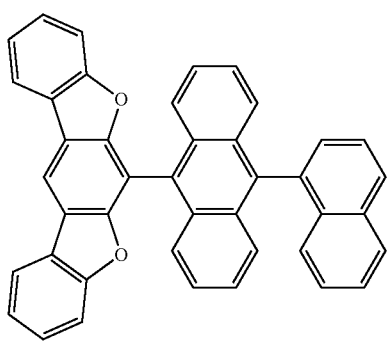
H58
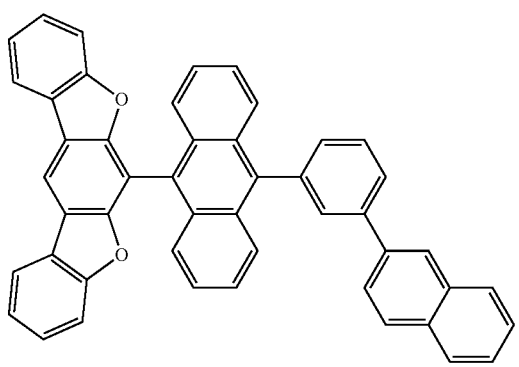

-continued
H59
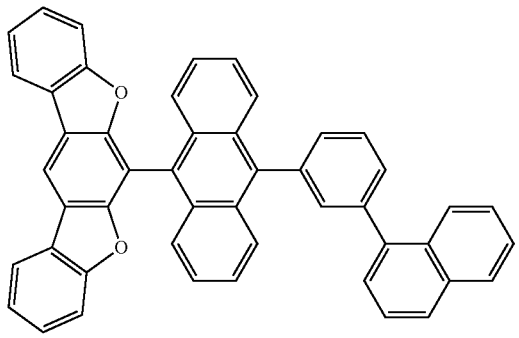
H60
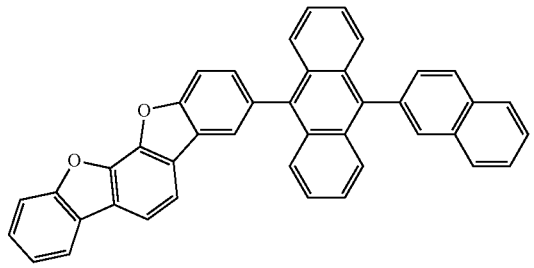
H61
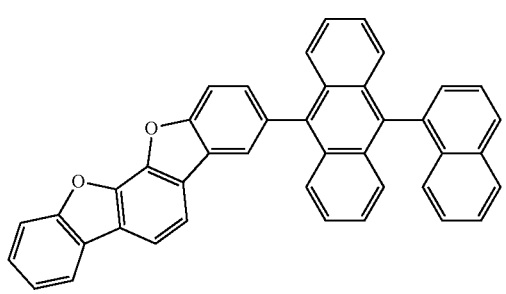
H62
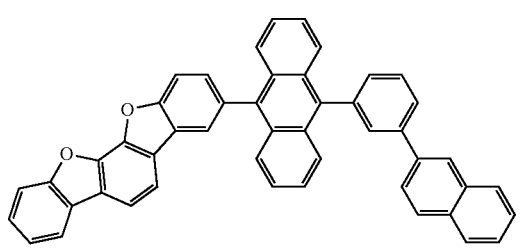
H63
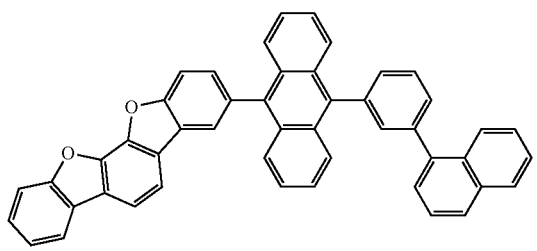
H64
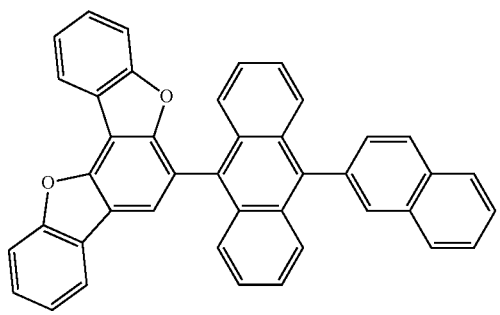
H65
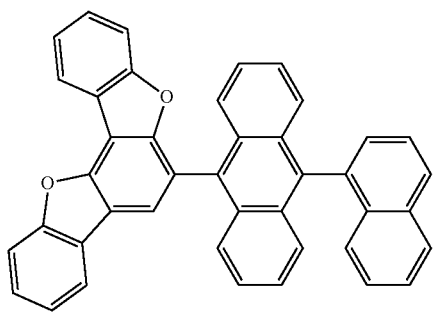
H66
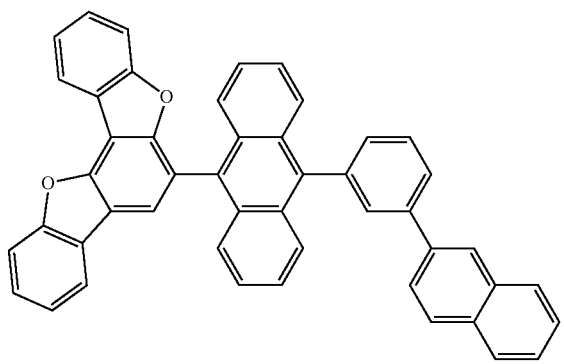

-continued
H67
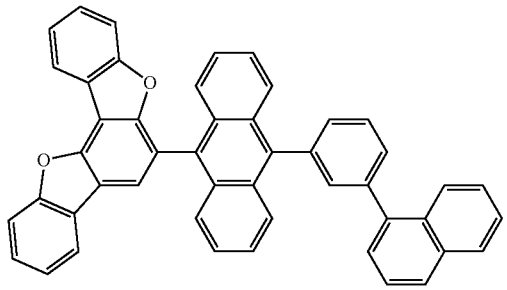
H68
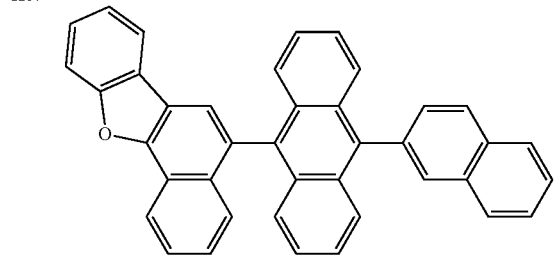
H69
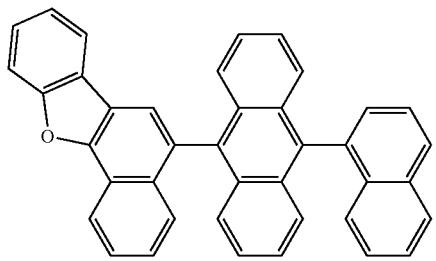
H70
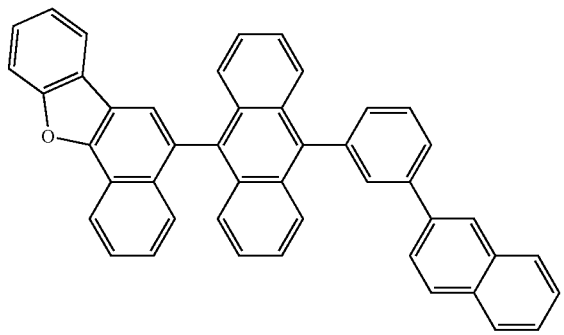
H71
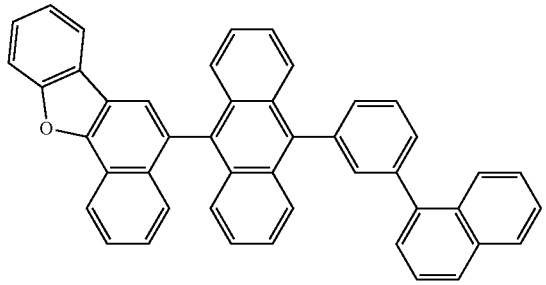
H72
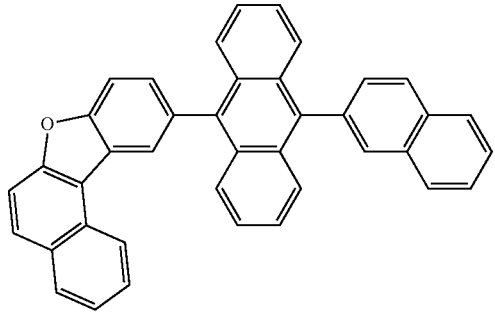
H73
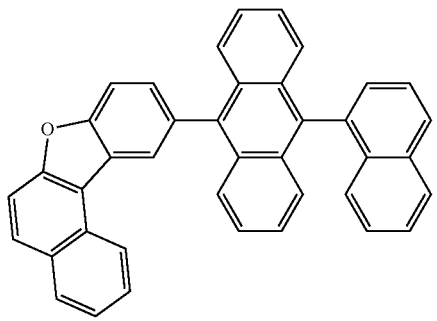
H74
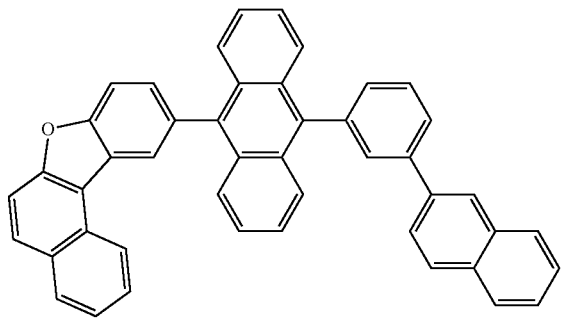
H75
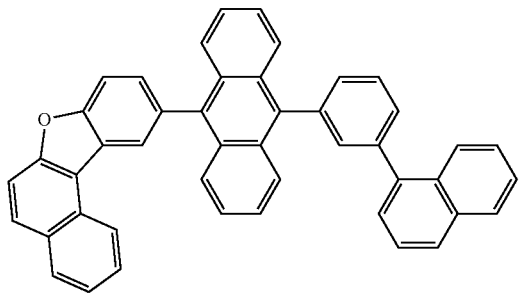
H76
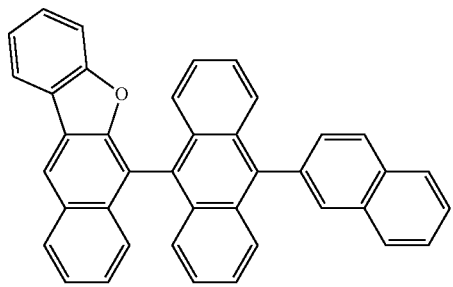

-continued
H77
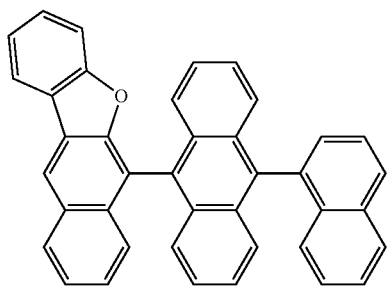
H78
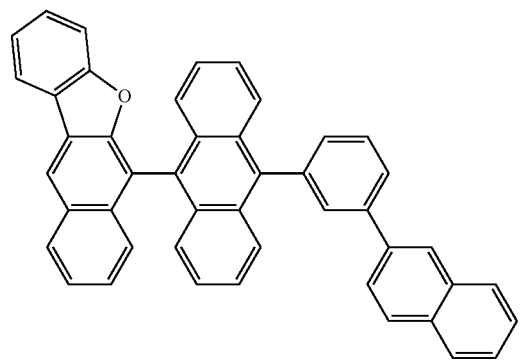
H79
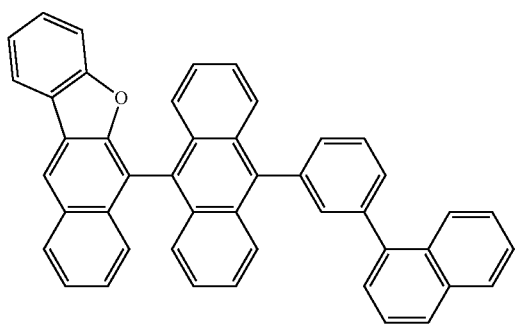
H80
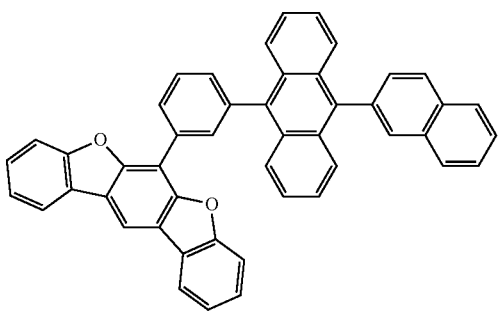
H81
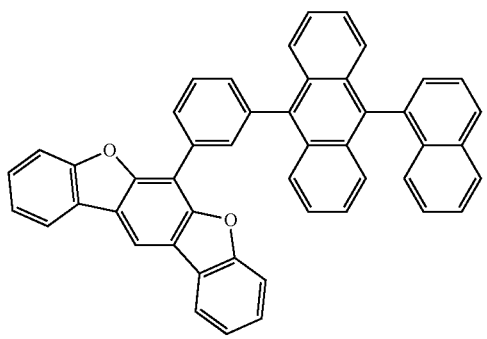
H82
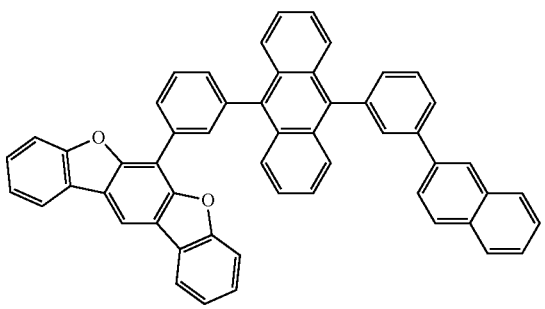
H83
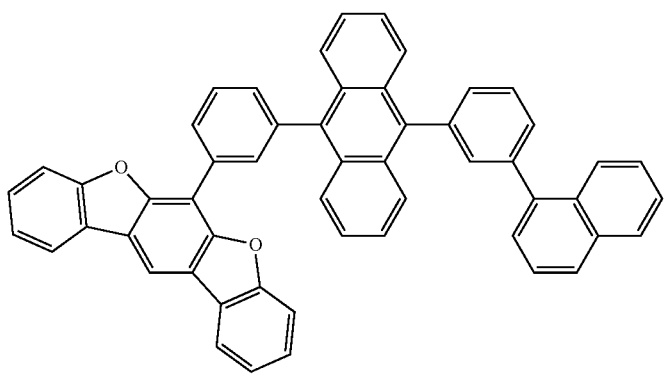

-continued
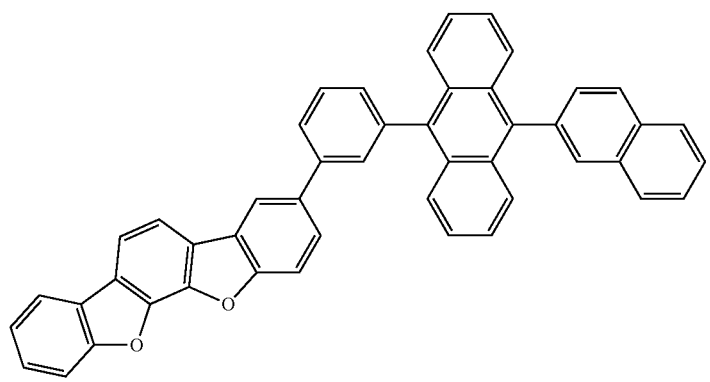
H84
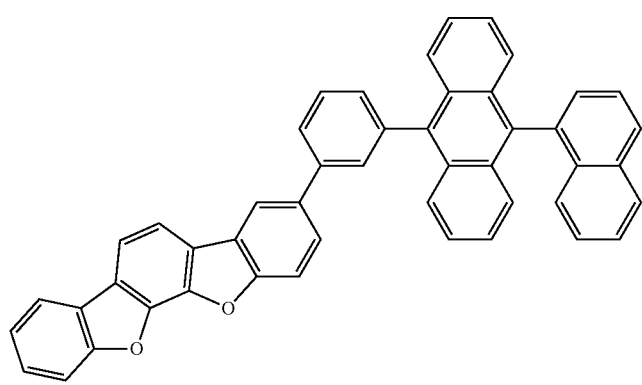
H85
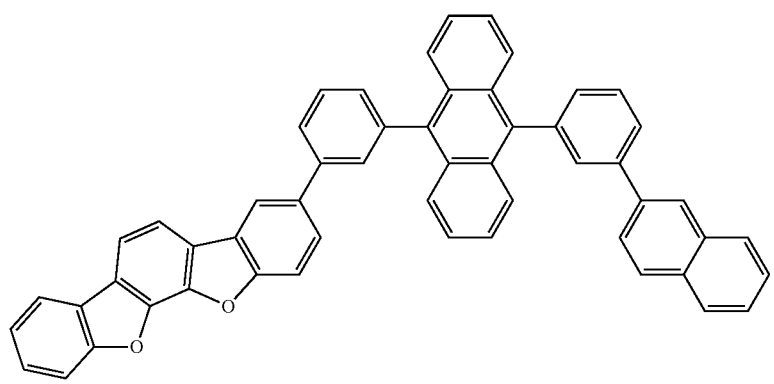
H86
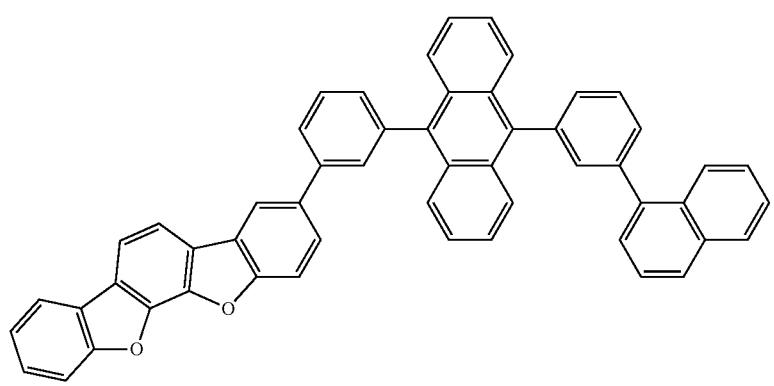
H87

-continued
H88
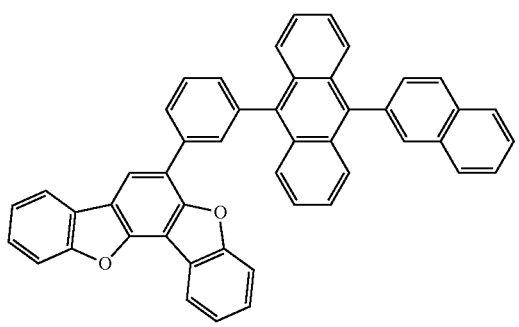
H89
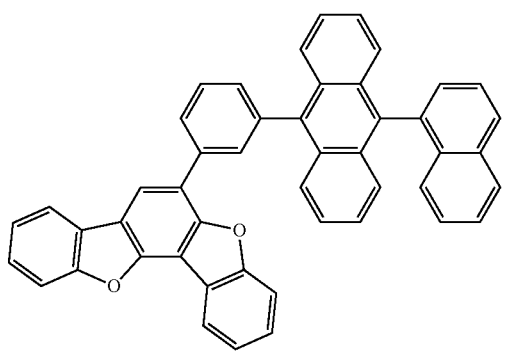
H90
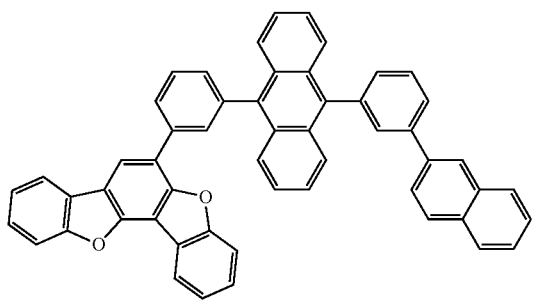
H91
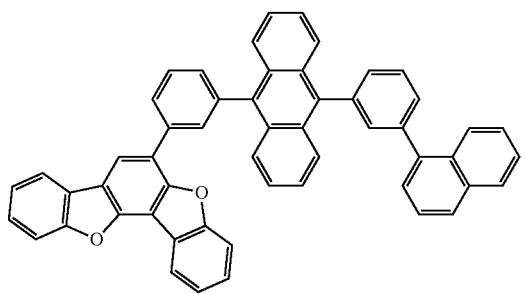
H92
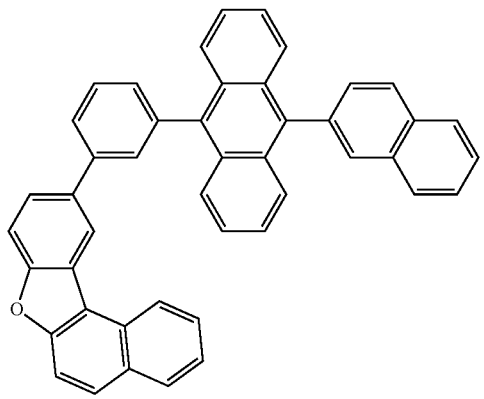
H93
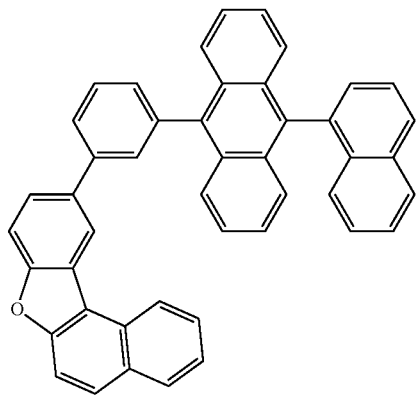
H94
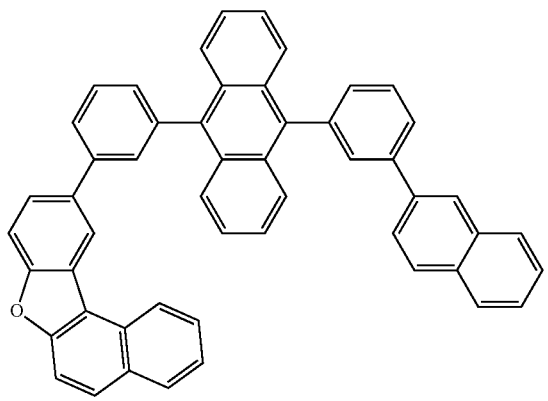
H95
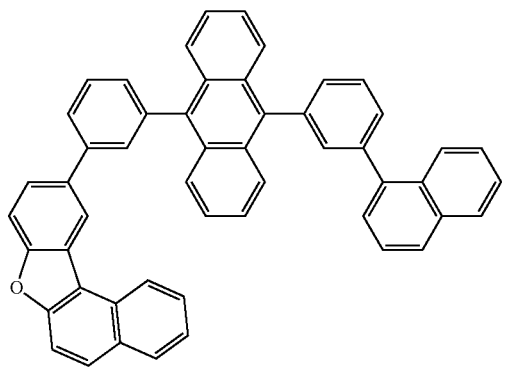

-continued
H96
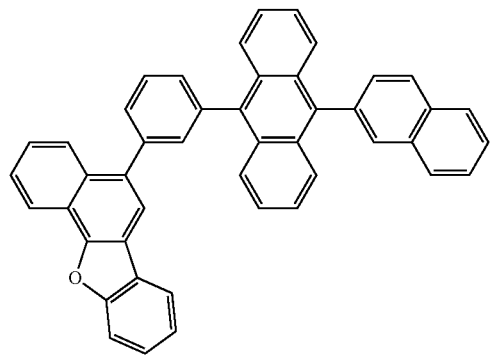
H97
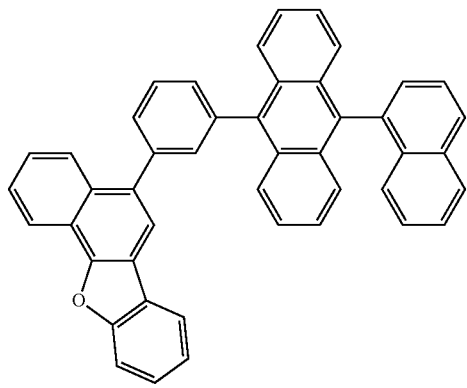
H98
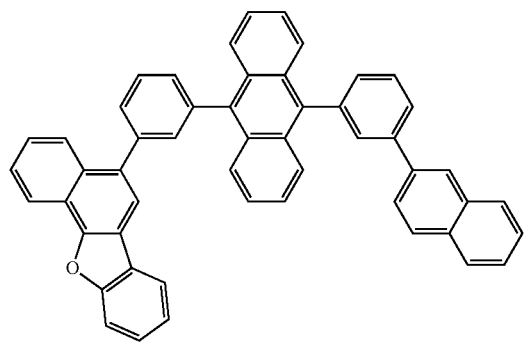
H99
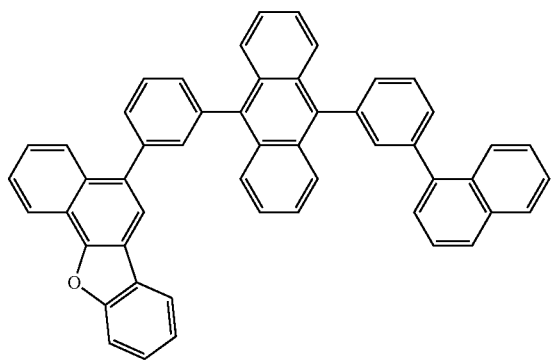
H100
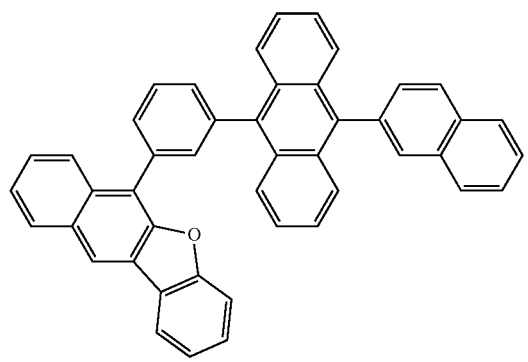
H101
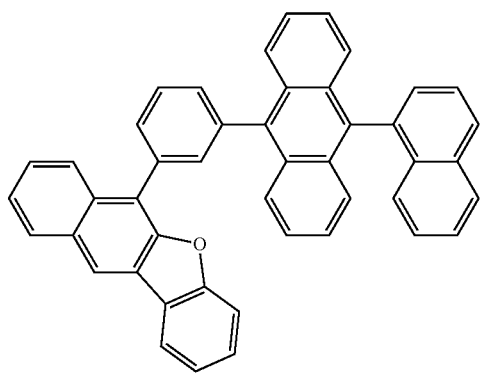
H102
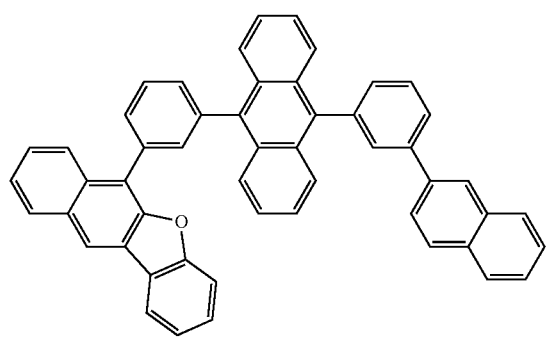
H103
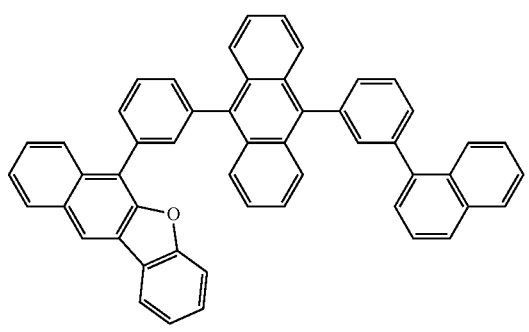

-continued
H104
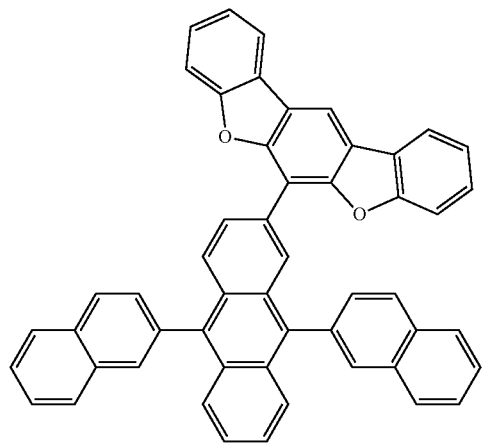
H105
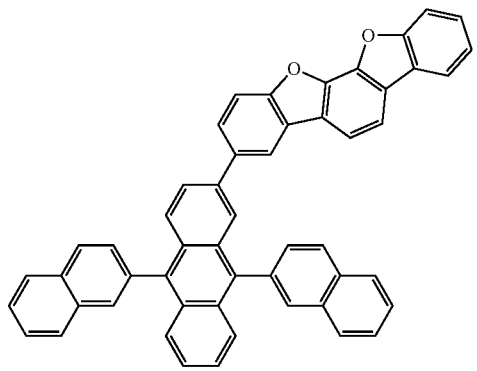
H106
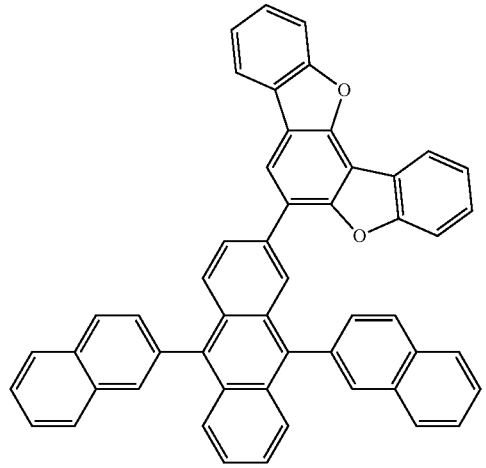
H107
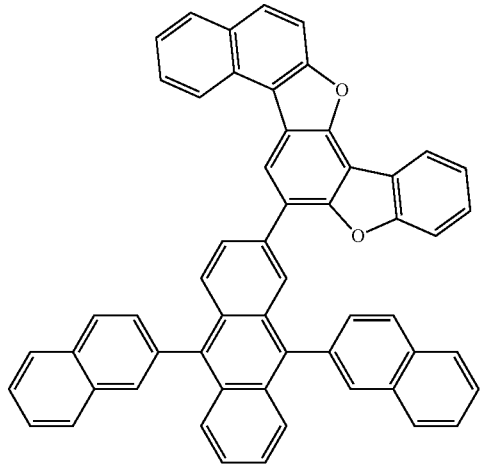
H108
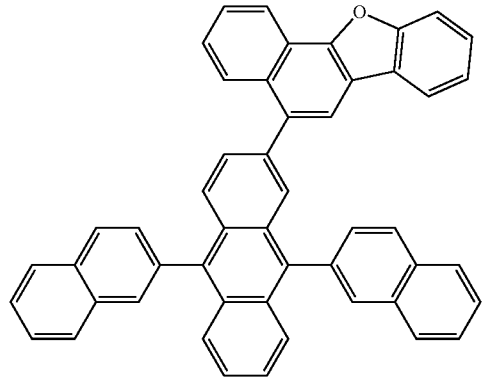
H109
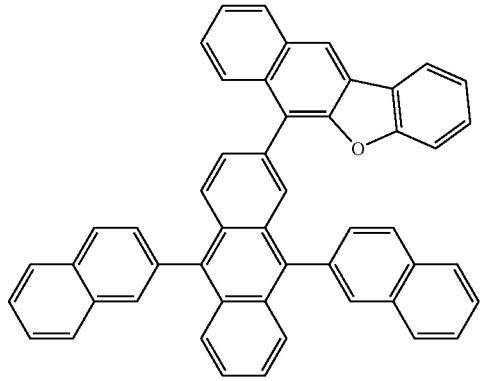
H110
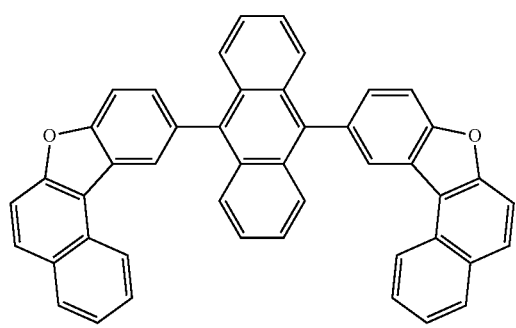
H111
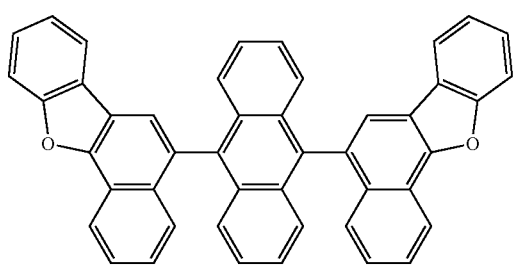

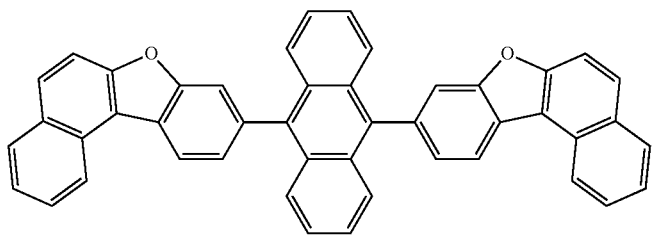
H112
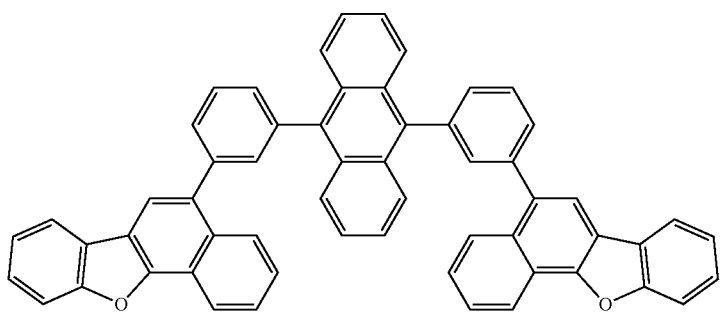
H113
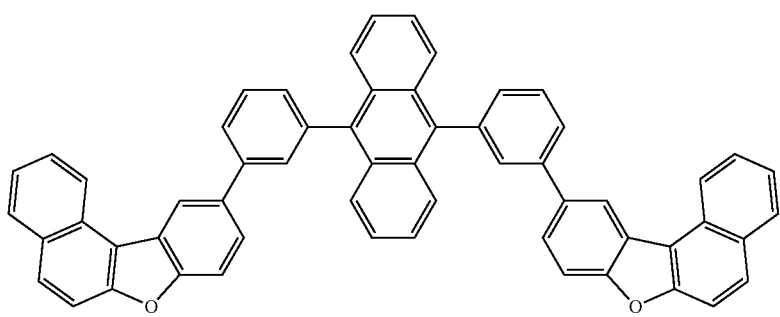
H114
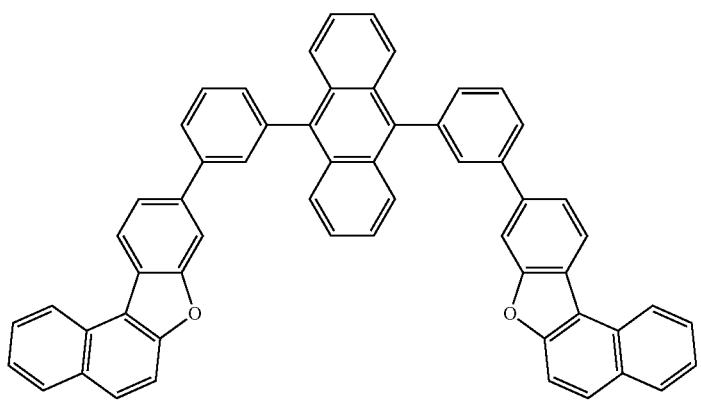
H115

-continued
H116
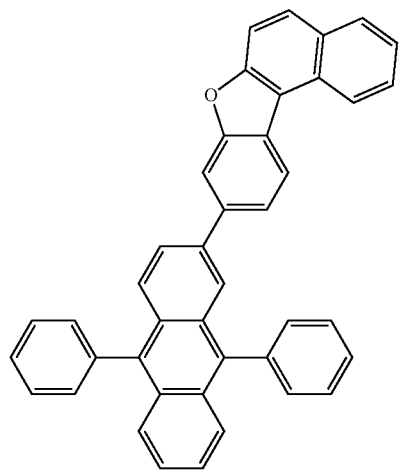
H117
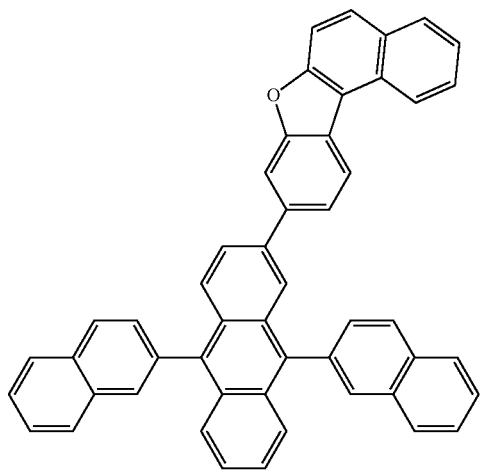
H118
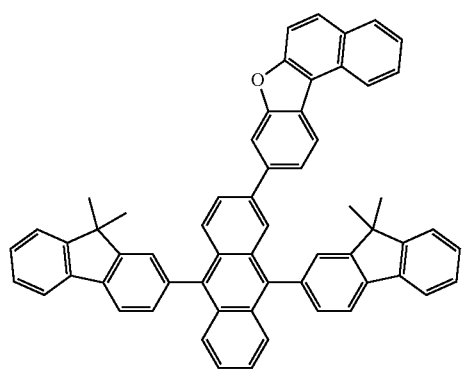
H119
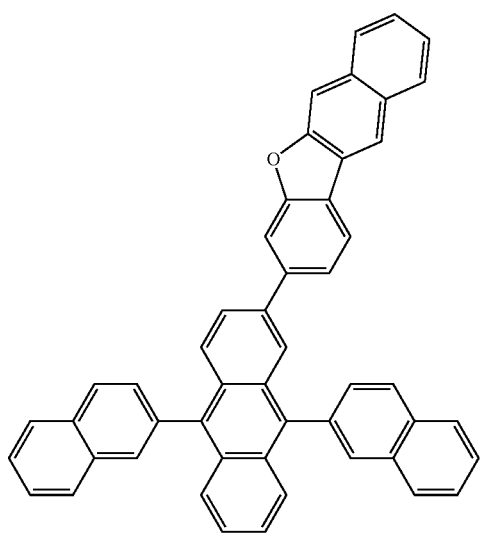
H120
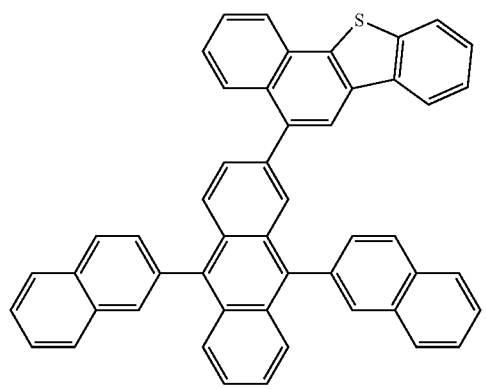
H121
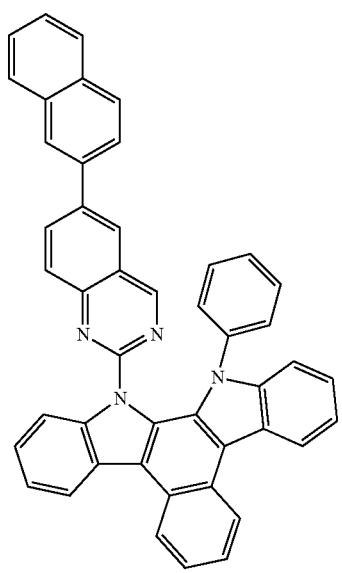

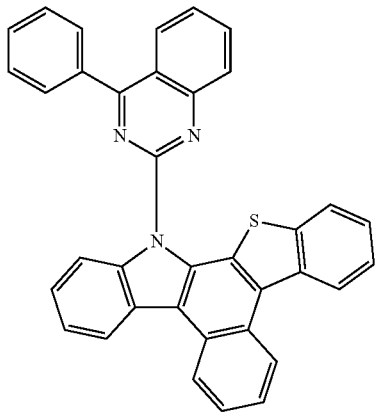
H122

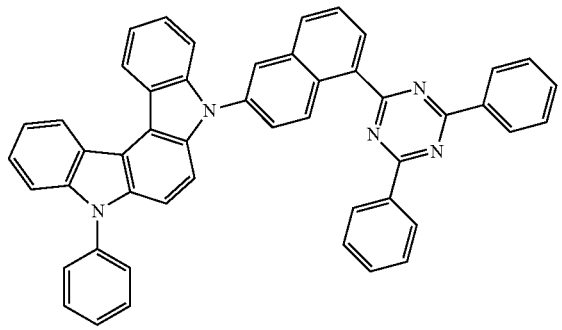
H123

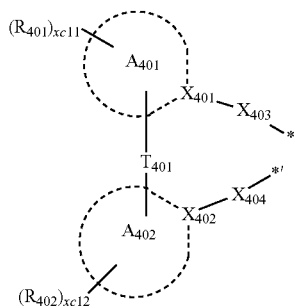

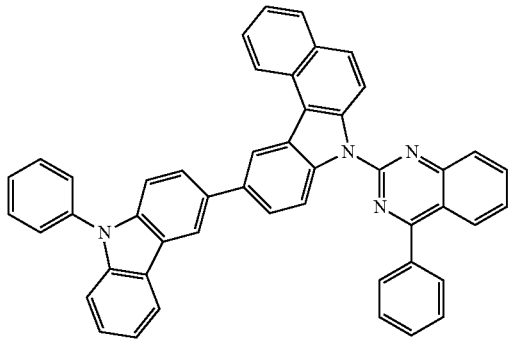
H124

Phosphorescent Dopant

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic complex represented by Formula 401:

$$M(L_{401})_{xc1}(L_{402})_{xc2}$$  Formula 401 wherein $L_{401}$ may be a ligand represented by Formula 402,

Formula 402

wherein, in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($O_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_1$-$C_{20}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)

$(Q_{402})(Q_{403})$, —N$(Q_{401})(Q_{402})$, —B$(Q_{401})(Q_{402})$, —C(=O)$(Q_{401})$, —S(=O)$_2(Q_{401})$, or —P(=O)$(Q_{401})$ $(Q_{402})$, $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) $X_{401}$ and $X_{402}$ may both be nitrogen.

In an embodiment, when xc1 in Formula 401 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1
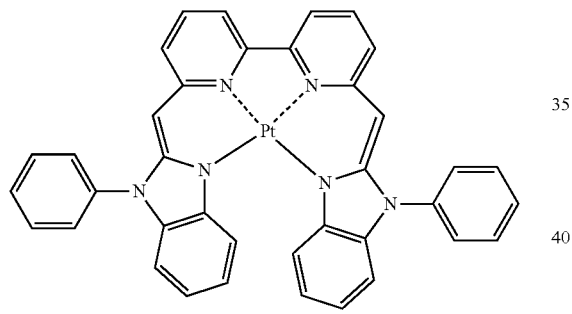

PD2
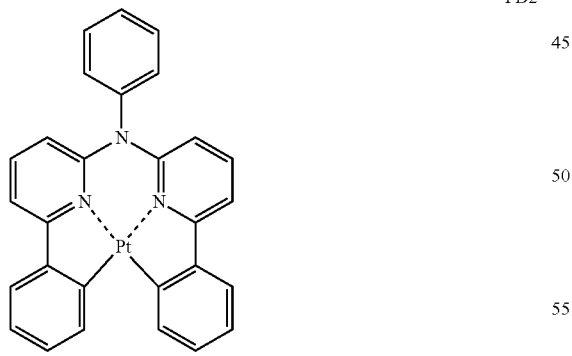

PD3
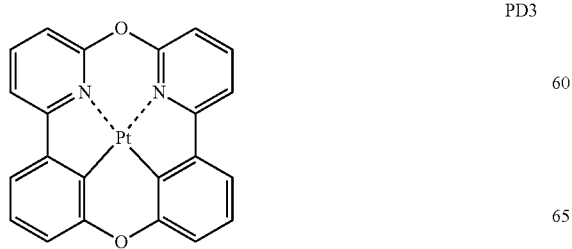

-continued

PD4
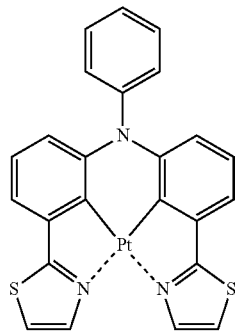

PD5
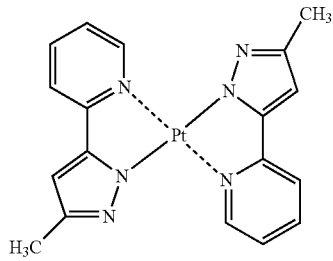

PD6
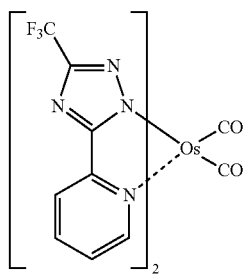

PD7
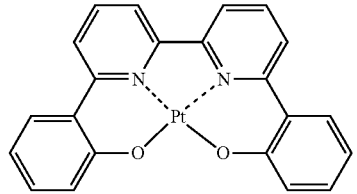

PD8
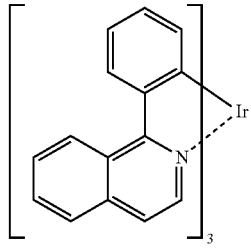

PD9
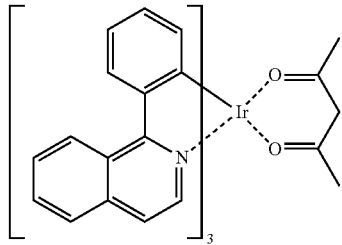

-continued
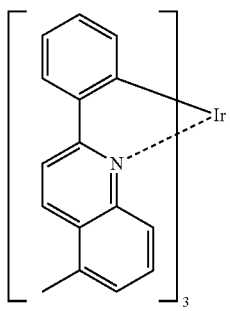 PD10
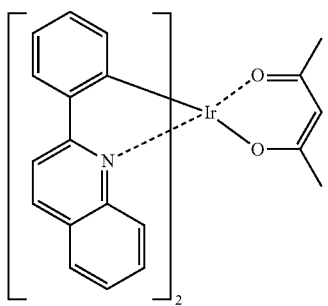 PD11
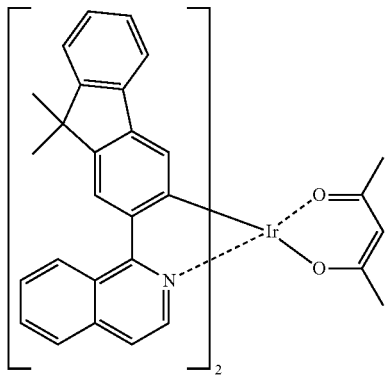 PD12
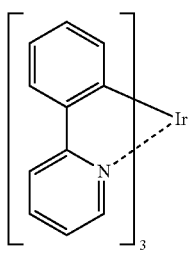 PD13
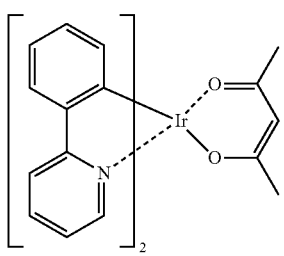 PD14
-continued
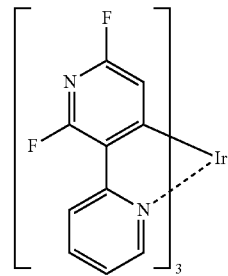 PD15
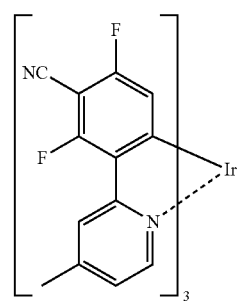 PD16
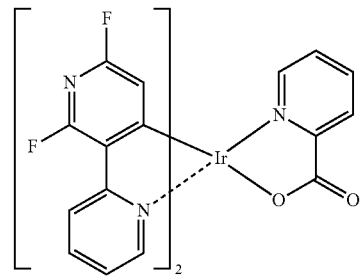 PD17
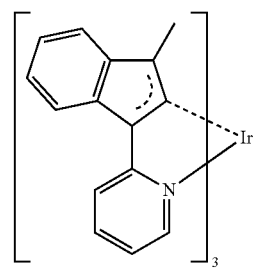 PD18
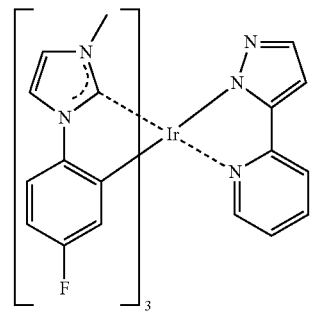 PD19

PD20 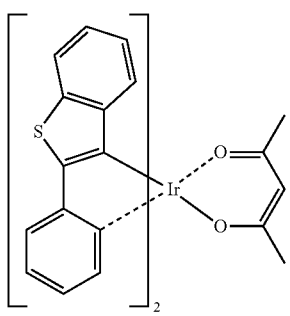

PD21 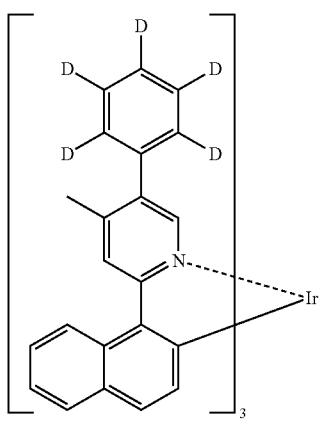

PD22 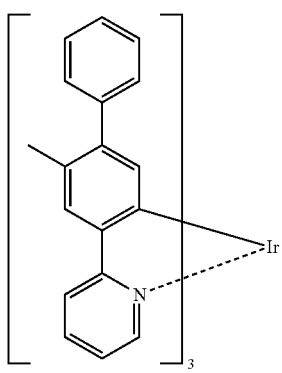

PD23 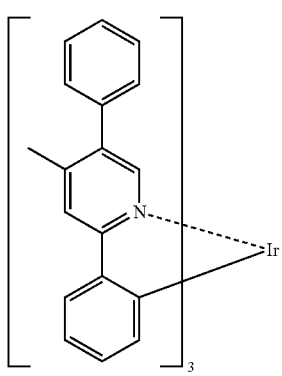

PD24 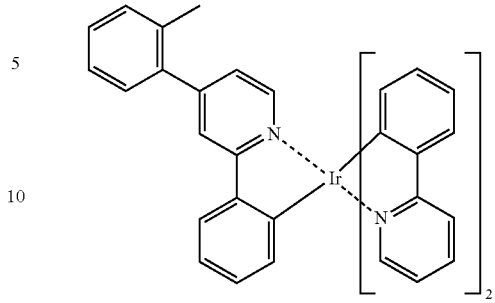

PD25 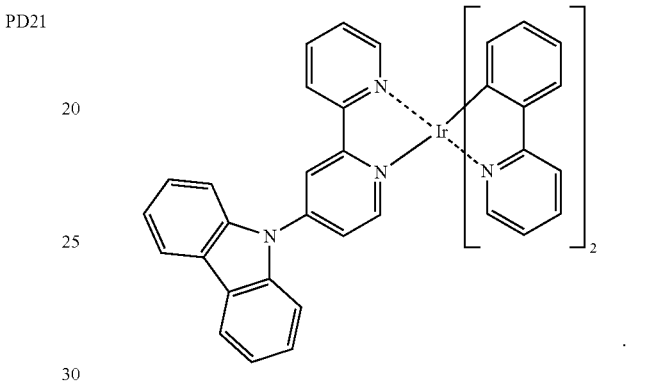

Fluorescent Dopant

The fluorescent dopant may include an amine group-containing compound, a styryl group-containing compound, or any combination thereof.

In an embodiment, the fluorescent dopant may include a compound represented by Formula 501:

Formula 501

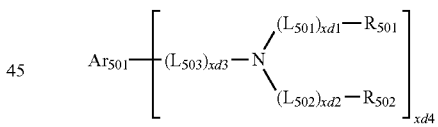

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may include a condensed ring group (e.g., an anthracene group, a chrysene group, or a pyrene group) in which at least three monocyclic groups are condensed.

In an embodiment, xd4 in Formula 501 may be 2.

In an embodiment, the fluorescent dopant may include one of Compounds FD1 to FD36, DPVBi, DPAVBi, or any combination thereof:

85
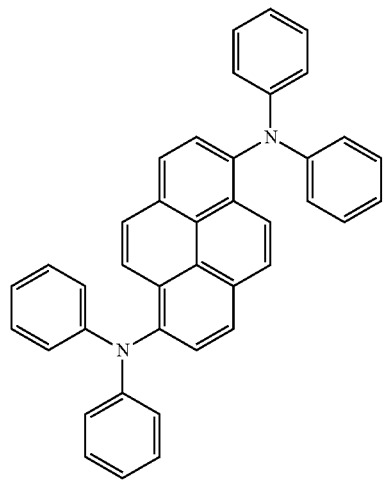
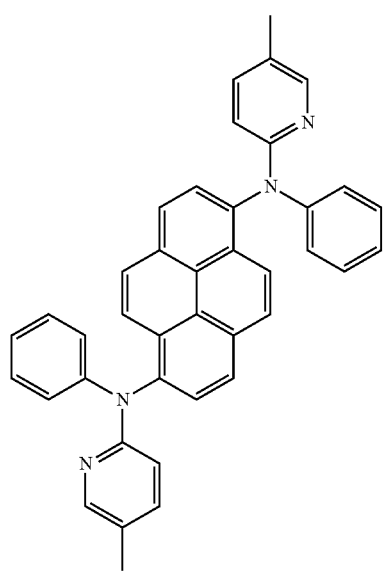
86
FD1
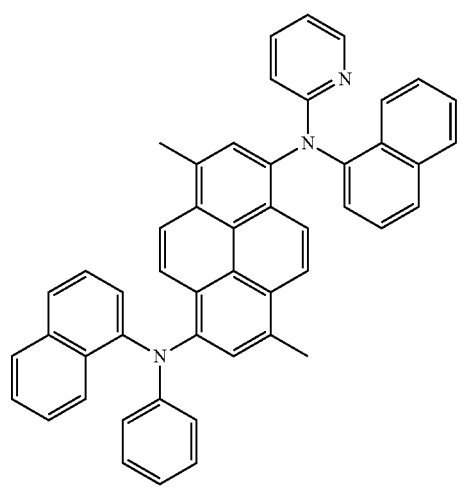
FD2
FD3
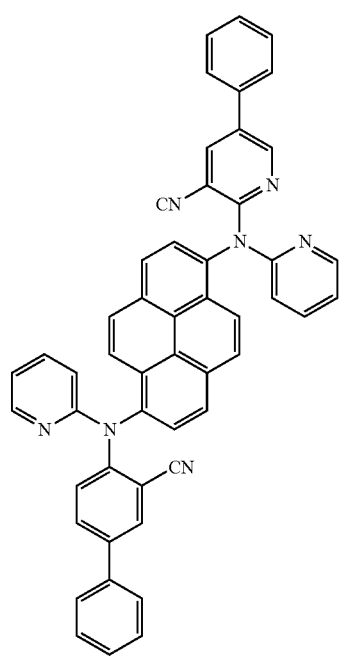
FD4
FD5
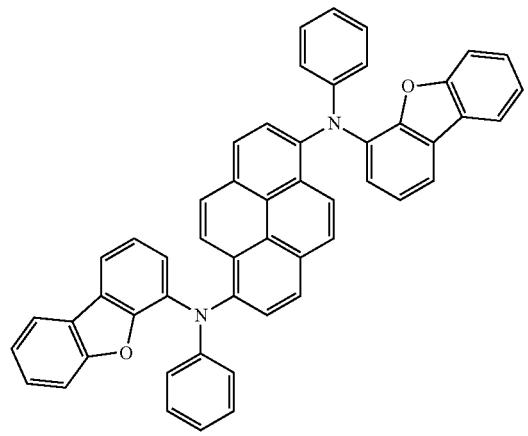
FD6
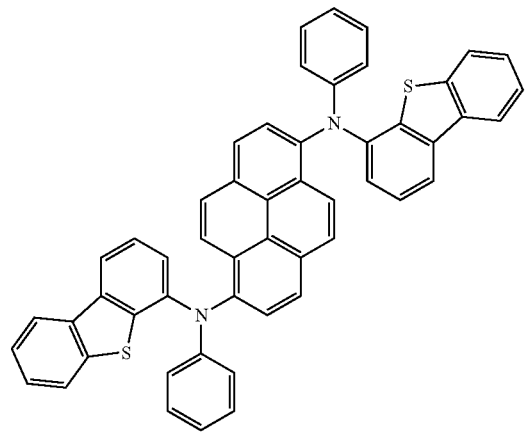

-continued
FD7
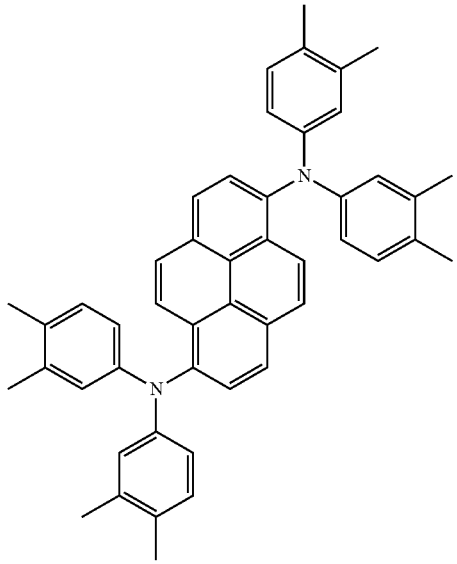
FD8
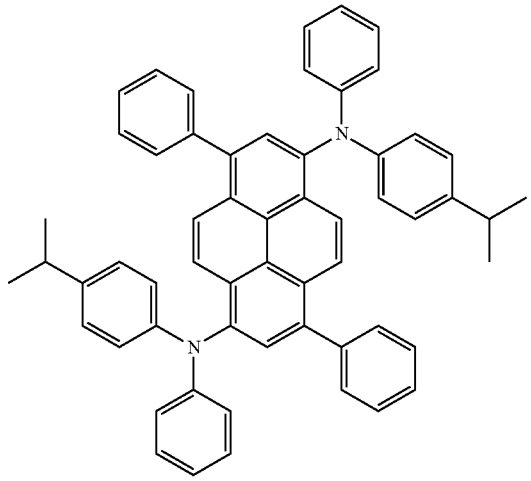
FD9
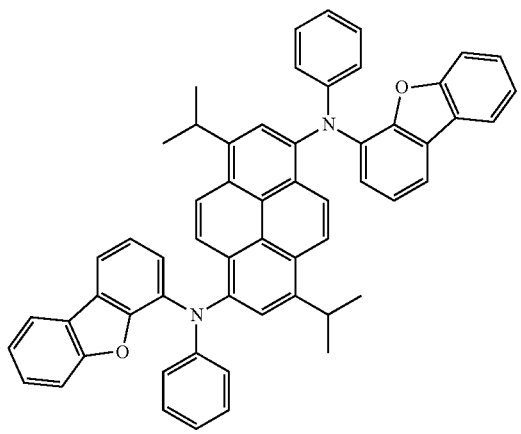
FD10
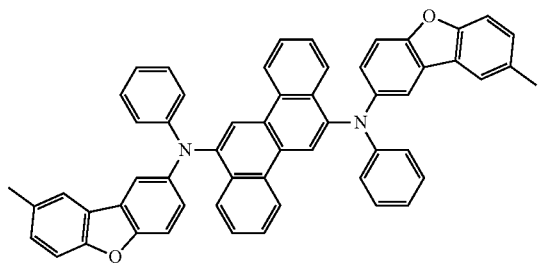
FD11
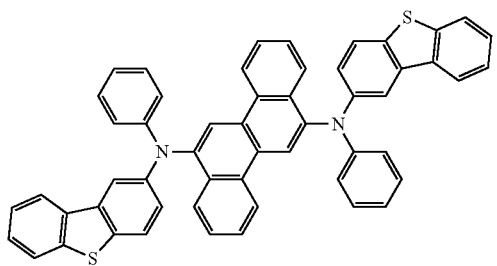
FD12
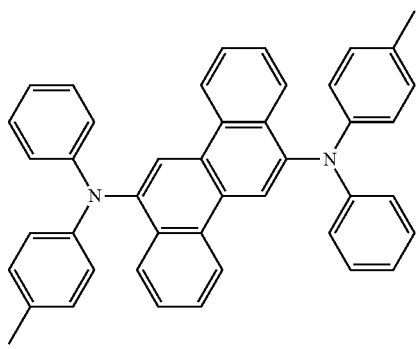
FD13
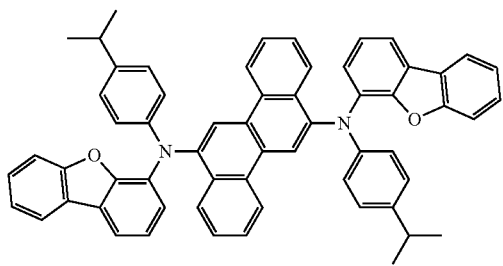
FD14
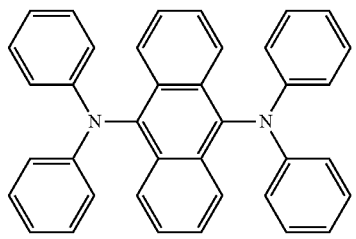

-continued
FD15
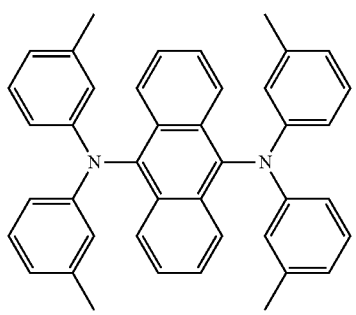
FD16
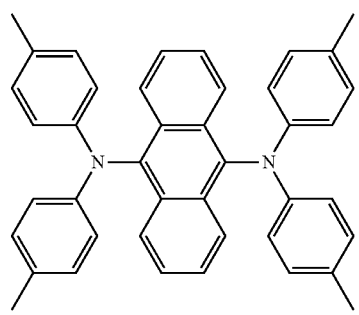
FD17
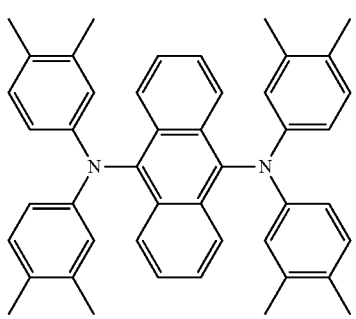
FD18
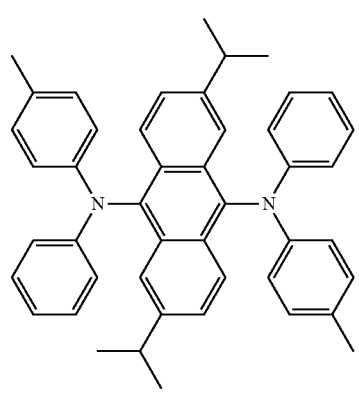
FD19
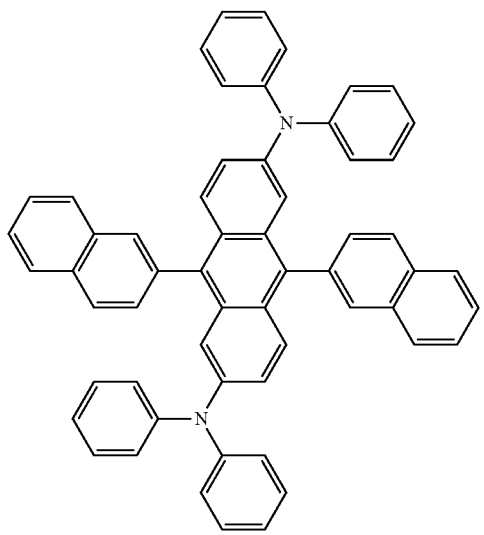
FD20
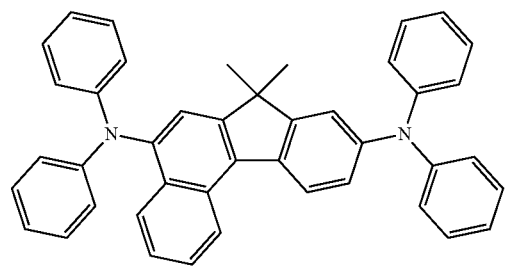
FD21
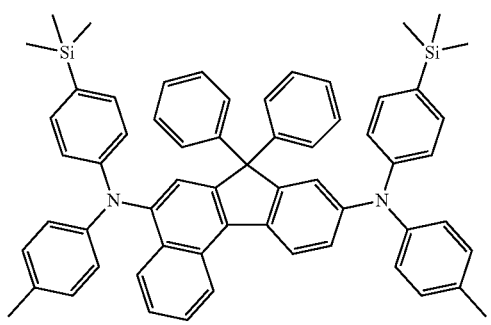
FD22
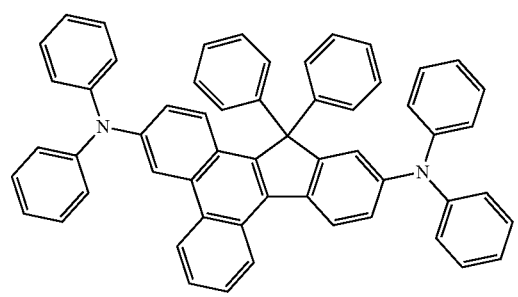

-continued
FD23
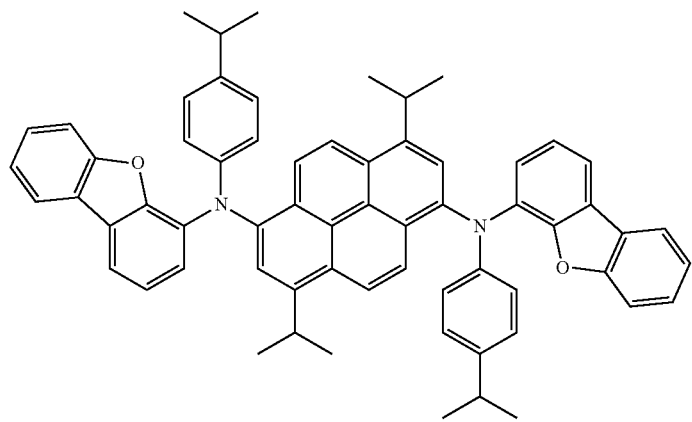
FD24
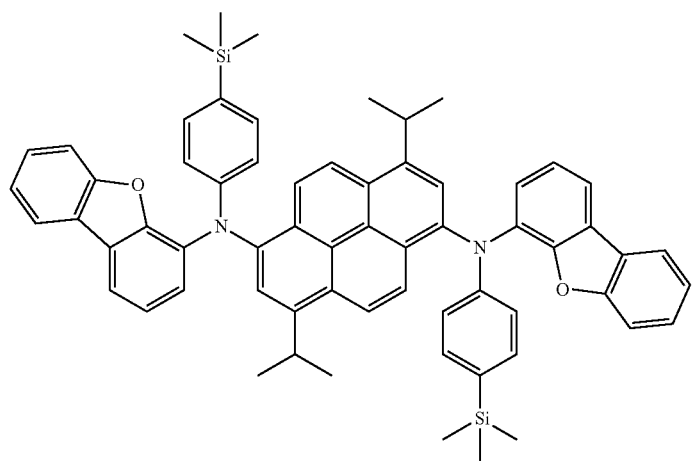
FD25
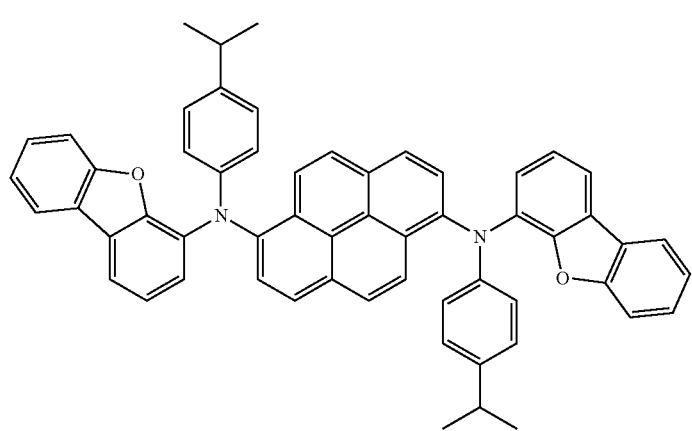

-continued
FD26
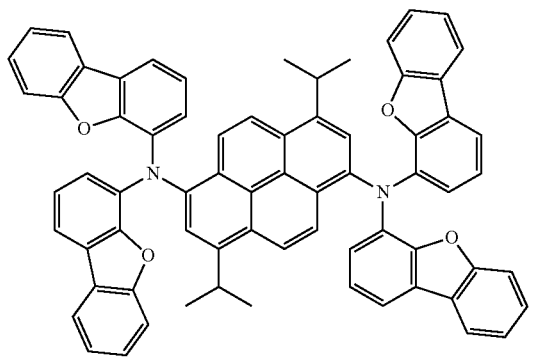
FD27
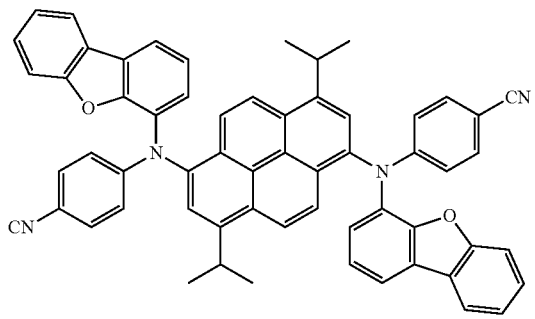
FD28
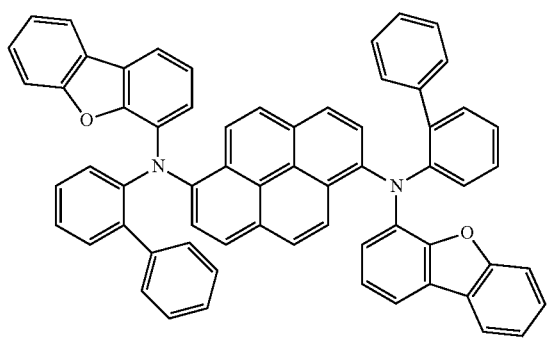
FD29
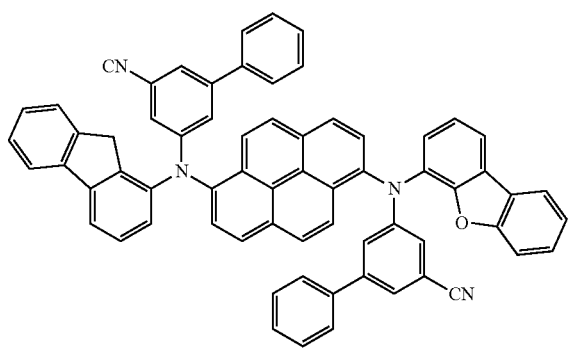
FD30
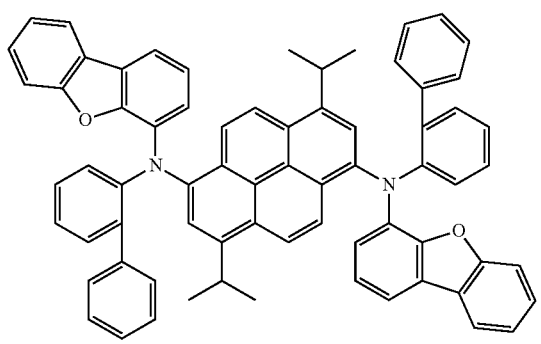
FD31
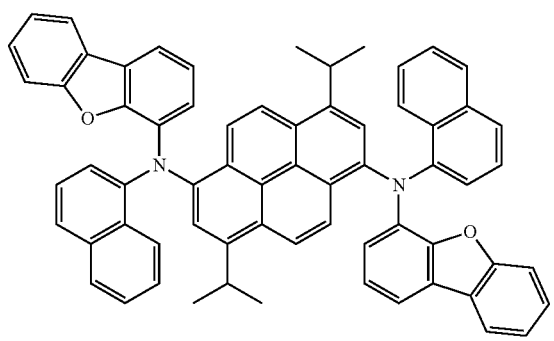
FD32
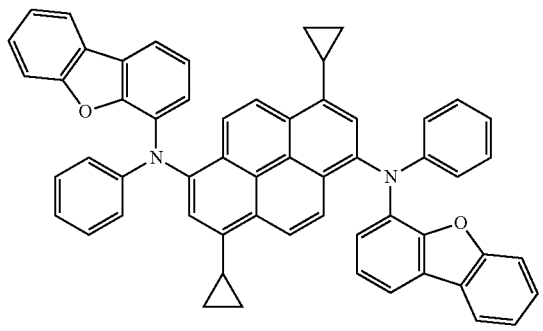
FD33
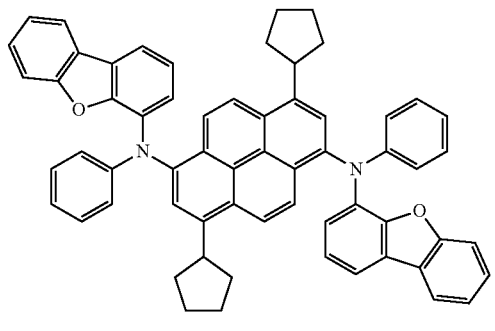

-continued

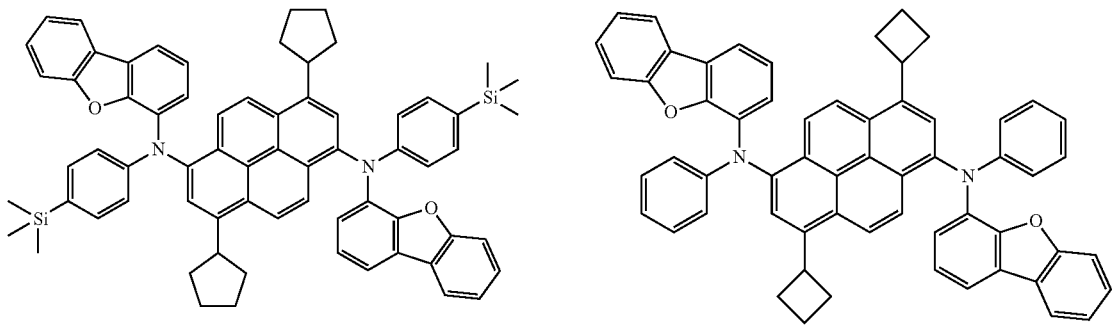

FD34

FD35

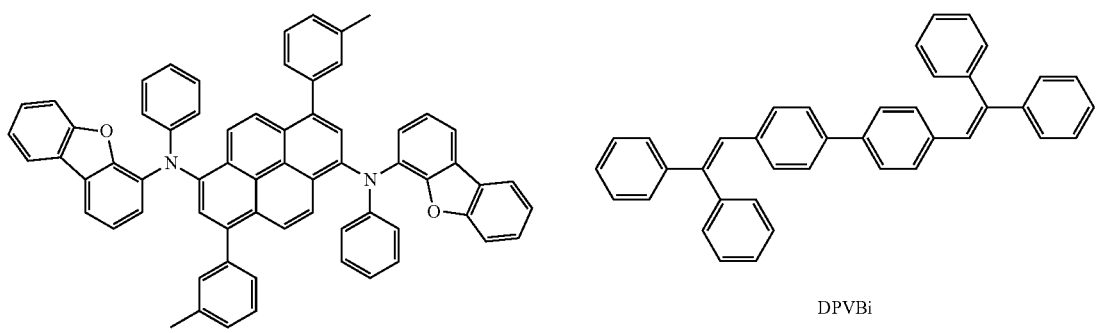

FD36

DPVBi

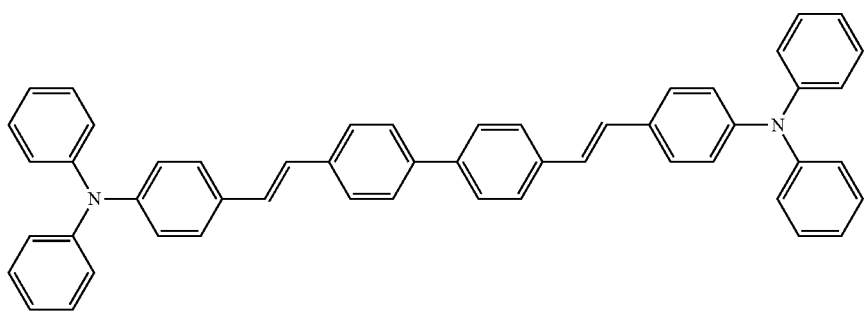

DPAVBi

Delayed Fluorescence Material

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In an embodiment, a difference between a triplet energy level (eV) of the delayed fluorescence material and a singlet energy level (eV) of the delayed fluorescence material may be about 0 eV or greater and about 0.5 eV or less. While not wishing to be bound by theory, it is understood that when the difference between a triplet energy level (eV) of the delayed fluorescence material and a singlet energy level (eV) of the delayed fluorescence material is within this range, up-conversion from a triplet state to a singlet state in the delayed fluorescence material may be effectively occurred, thus improving luminescence efficiency and the like of the light-emitting device 10.

In an embodiment, the delayed fluorescence material may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

Examples of the delayed fluorescence material may include at least one of Compounds DF1 to DF9:

DF1
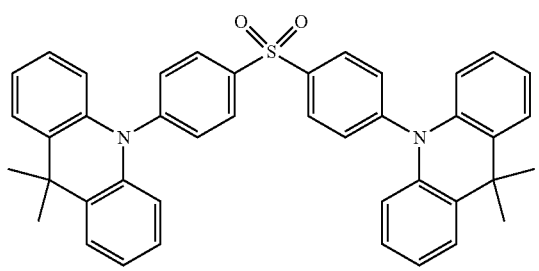
(DMAC-DPS)
DF2
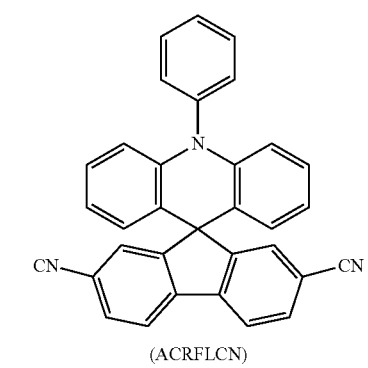
(ACRFLCN)
DF3
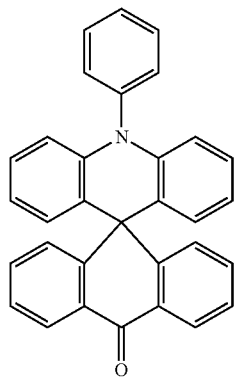
(ACRSA)
DF4
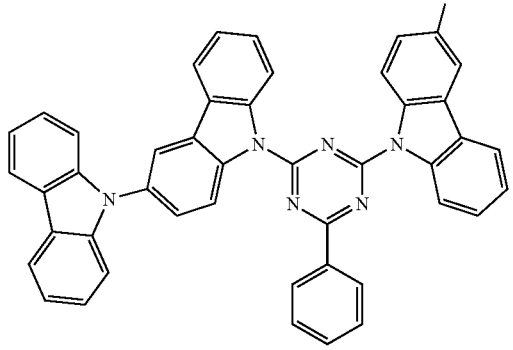
(CC2TA)
DF5
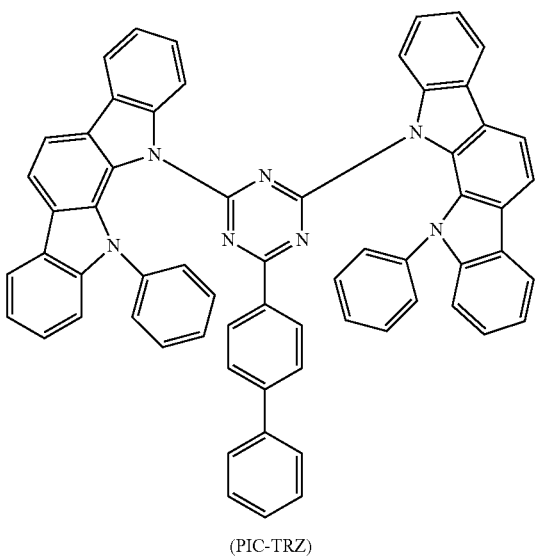
(PIC-TRZ)
DF6
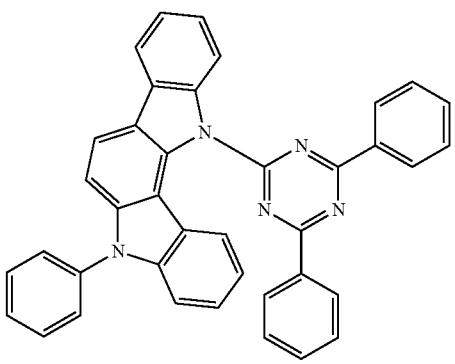
(PIC-TRZ2)
DF7
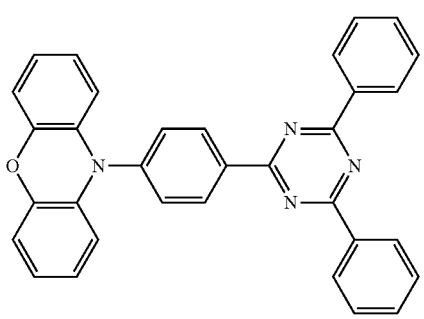
(PXZ-TRZ)
DF8
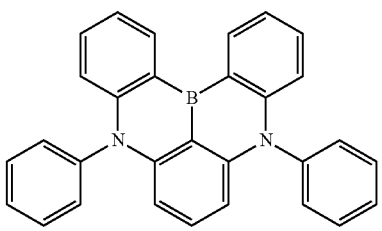
(DABNA-1)

-continued

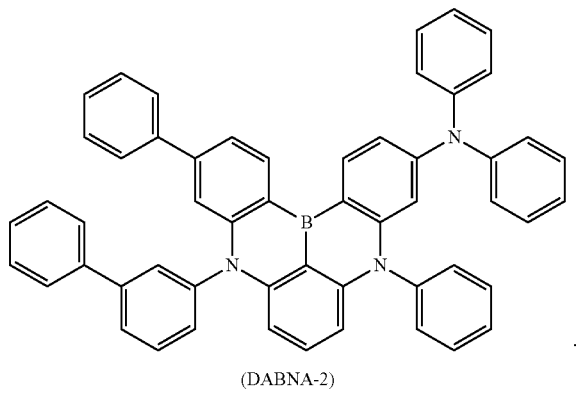

(DABNA-2)

Quantum Dots

The emission layer may include quantum dots.

The emission layer may include the quantum dot-containing material 131.

The quantum dot-containing material 131 may include the quantum dot 131A and the organic group 131B.

The emission layer may include the quantum dot-containing material 131 and may further include a different quantum dot.

A quantum dot as used herein may include the quantum dot 131A or a quantum dot different therefrom.

The term "quantum dot" as used herein refers to a crystal of a semiconductor compound and may include any suitable material capable of emitting emission wavelengths of various lengths according to the size of the crystal.

The diameter of the quantum dot may be, for example, in a range of about 1 nm to about 10 nm, for example, about 1 nm to about 8 nm, about 1 nm to about 6 nm, about 1 nm to about 4 nm, about 1 nm to about 2 nm, about 3 nm to about 10 nm, about 5 nm to about 10 nm, about 7 nm to about 10 nm, or about 9 nm to about 10 nm.

Quantum dots may be synthesized by a wet chemical process, a metal organic chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier to perform than the vapor deposition process such a metal organic chemical vapor deposition (MOCVD) or a molecular beam epitaxy (MBE) process. Further, the growth of quantum dot particles may be controlled with a lower manufacturing cost.

The quantum dot may include a group III-VI semiconductor compound; a group II-VI semiconductor compound; a group III-V semiconductor compound; a group III-VI semiconductor compound; a group I-III-VI semiconductor compound; a group IV-VI semiconductor compound; a group IV element or compound; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the group III-V semiconductor compound may further include a group II element. Examples of the group III-V semiconductor compound further including the group II element may include InZnP, InGaZnP, InAlZnP, and the like.

Examples of the group III-VI semiconductor compound may include a binary compound such as GaS, GaSe, $Ga_2Se_3$, GaTe, InS, $In_2S_3$, InSe, $In_2Se_3$, InTe, and the like; a ternary compound such as $InGaS_3$, $InGaSe_3$, and the like; or any combination thereof.

Examples of the group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The group IV element or compound may be a single element such as Si or Ge; a binary compound such as SiC or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In an embodiment, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be monolayer or multilayer. An interface between a core and a shell may have a concentration gradient where a concentration of elements present in the shell may decrease toward the core.

Examples of the shell of the quantum dot include metal or nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Example of the semiconductor compound may include a group III-VI semiconductor compound; a group II-VI semiconductor compound; a group III-V semiconductor compound; a group III-VI semiconductor compound; a group I-III-VI semiconductor compound; a group IV-VI semiconductor compound; or any combination thereof. In an embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength of about 45 nm or less, about 40 nm or less, or about 30 nm or less. When the FWHM of the quantum dot is within this range, color purity or color reproducibility may be improved. In an embodiment, because light emitted through the quantum dot is emitted in all directions, an optical viewing angle may be improved.

In an embodiment, the quantum dot may be specifically, a spherical, pyramidal, multi-arm, or cubic nanoparticle, nanotube, nanowire, nanofiber, or nanoplate particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In an embodiment, the size of the quantum dot may be selected such that the quantum dot may emit red, green, and/or blue light. In an embodiment, the size of the quantum dot may be selected such that the quantum dot may emit white light by combining various light colors.

Electron Transport Region in Interlayer 130

The electron transport region may have i) a single-layered structure including of a single layer including of a single material, ii) a single-layered structure including of a single layer including a plurality of different materials, or iii) a multi-layered structure including a plurality of layers including a plurality of different materials.

The electron transport region may include a buffer layer, a hole blocking layer, an electron control layer, an electron transport layer, or an electron injection layer.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers of each structure are sequentially stacked on the emission layer in each stated order.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$[Ar_{601}]_{xe11}$-$[(L_{601})_{xe1}$-$R_{601}]_{xe21}$      Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

In an embodiment, when xe11 in Formula 601 is 2 or greater, at least two $Ar_{601}$(s) may be bound via a single bond.

In an embodiment, in Formula 601, $Ar_{601}$ may be a substituted or unsubstituted anthracene group.

In an embodiment, the electron transport region may include a compound represented by Formula 601-1:

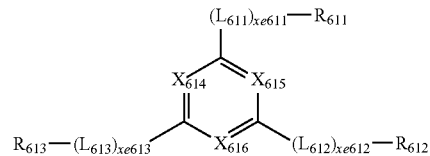

Formula 601-1 wherein, in Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_1$-$C_{20}$ alkylthio group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

103                 104
ET1 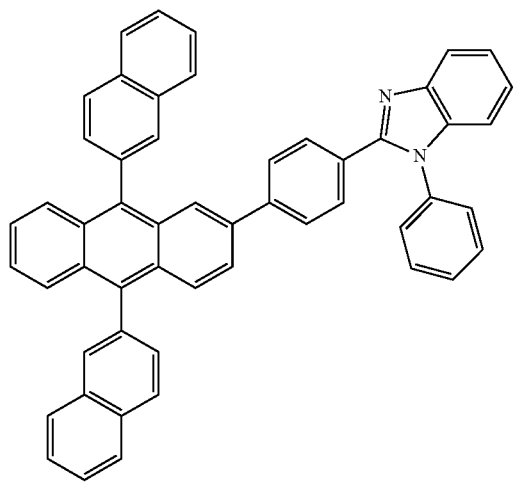 ET2 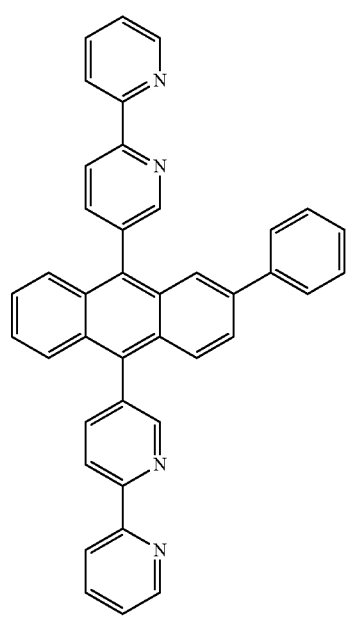
ET3 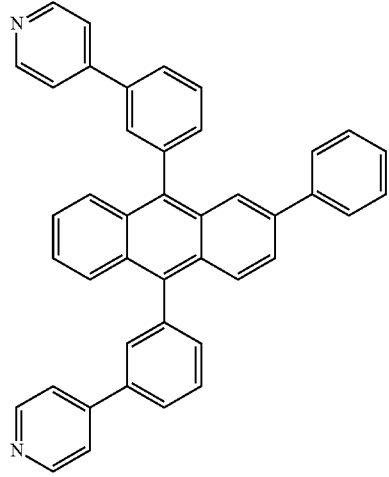 ET4 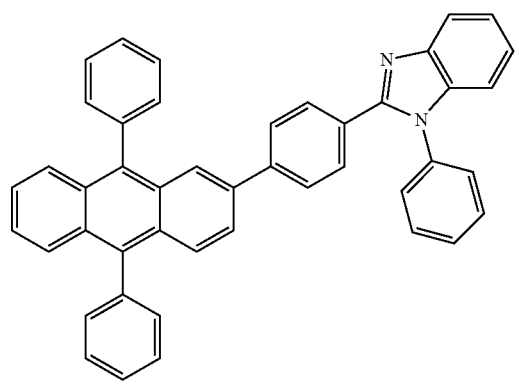
ET5 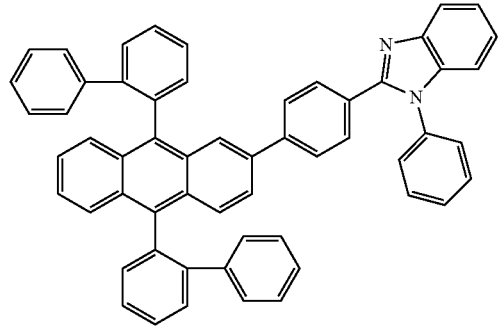 ET6 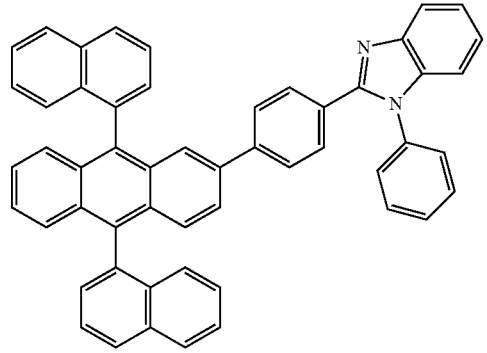

-continued
ET7
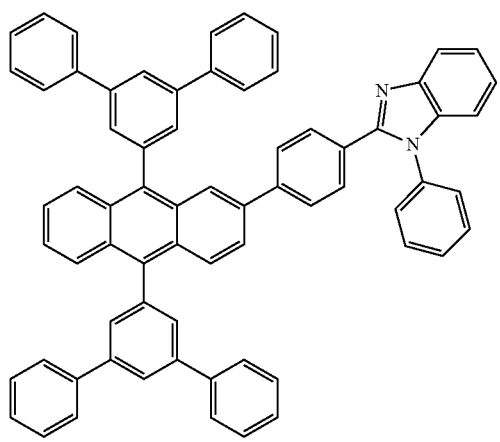
ET8
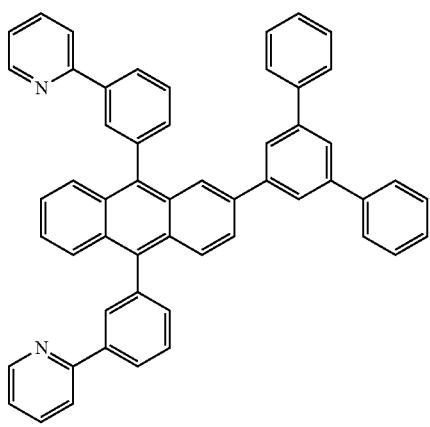
ET9
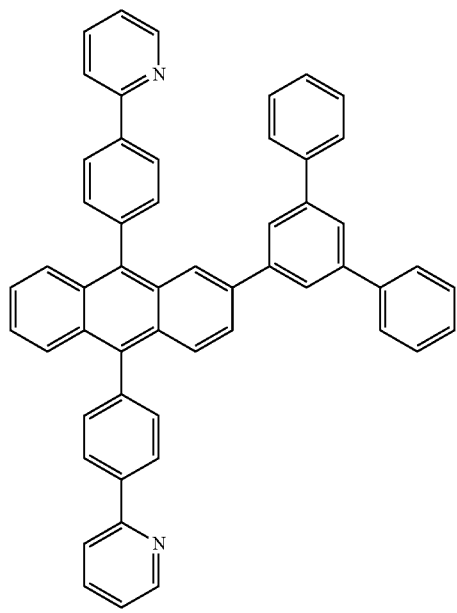
ET10
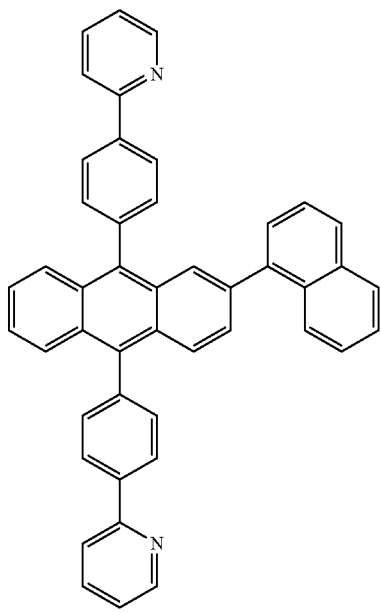
ET11
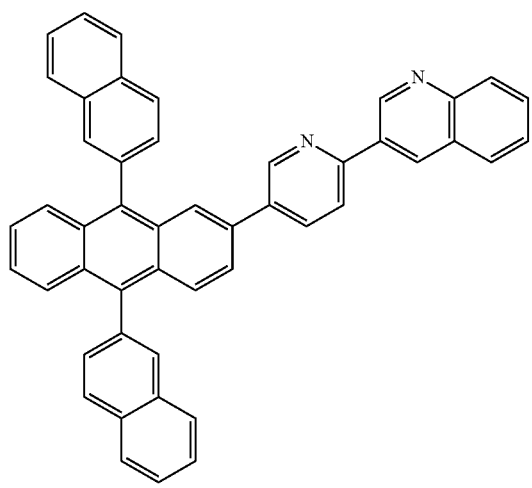
ET12
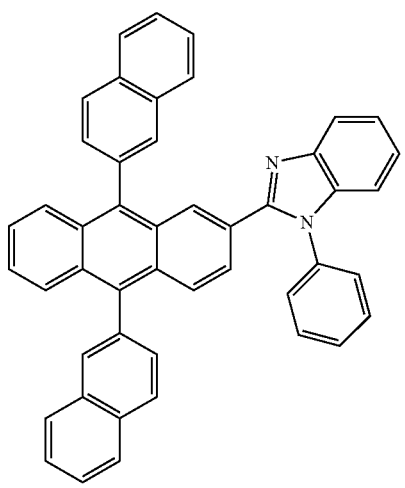

-continued
ET13
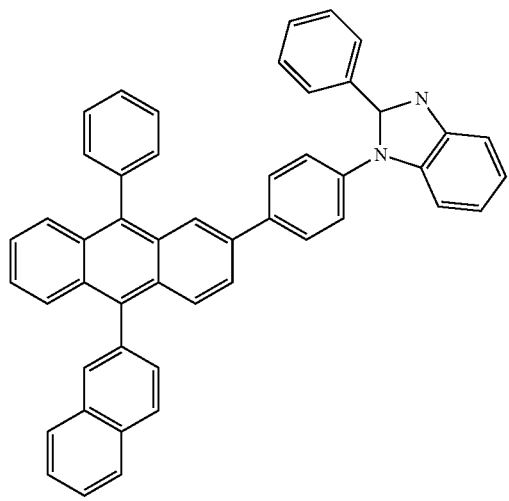
ET14
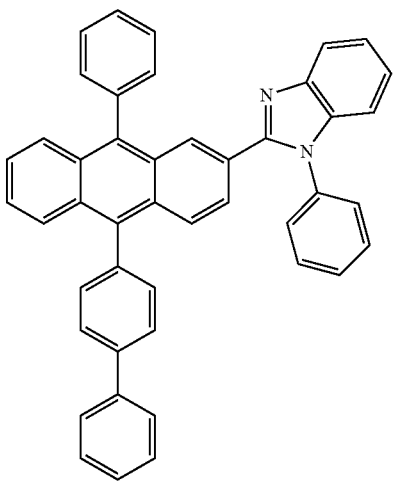
ET15
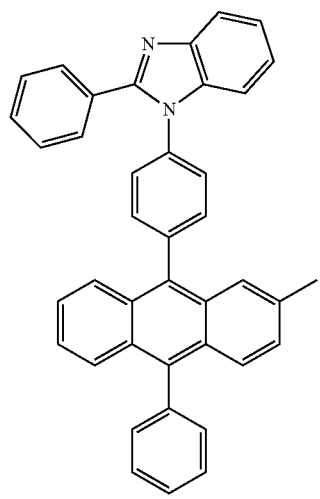
ET16
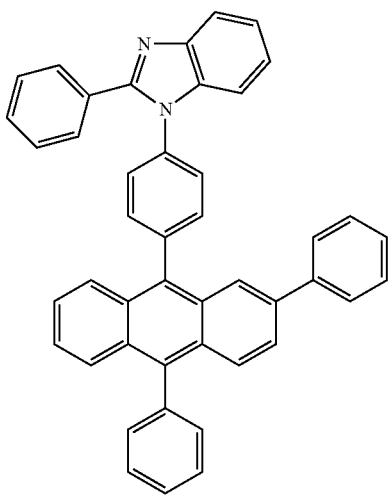
ET17
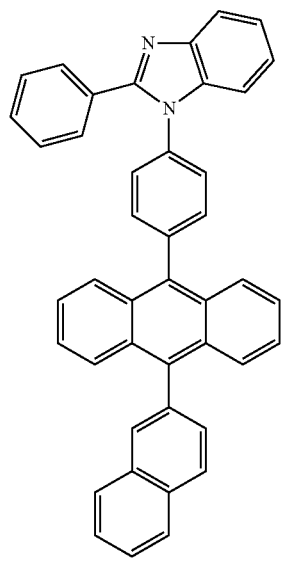
ET18
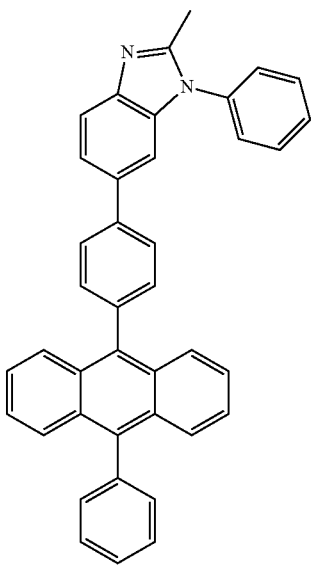

-continued
ET19
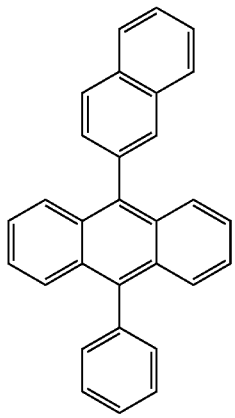
ET20
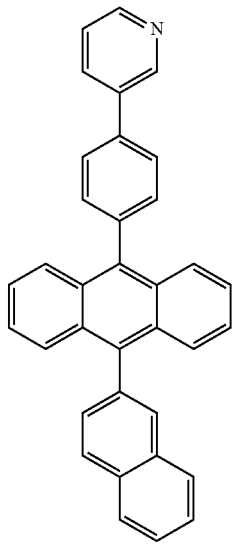
ET21
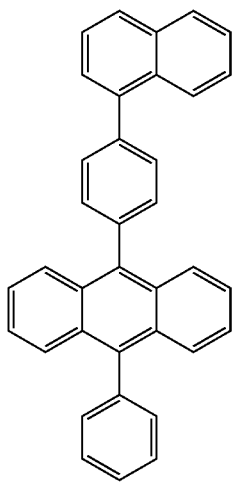
ET22
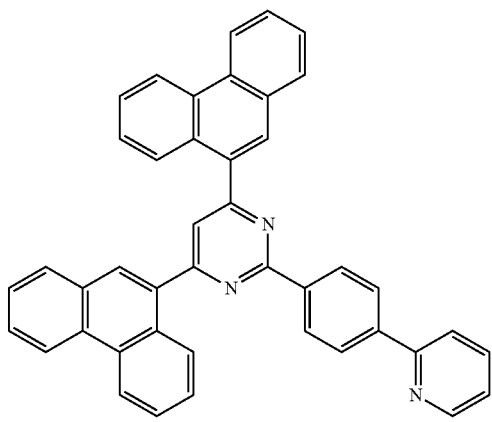
ET23
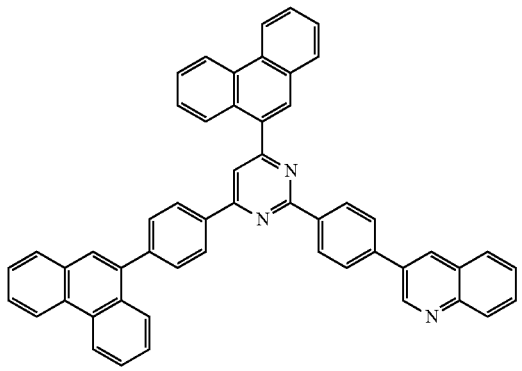
ET24
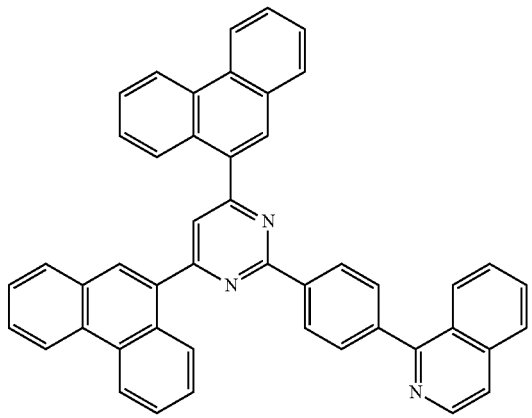

-continued
ET25
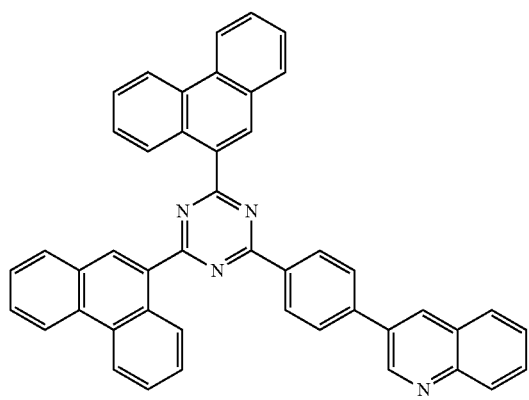
ET26
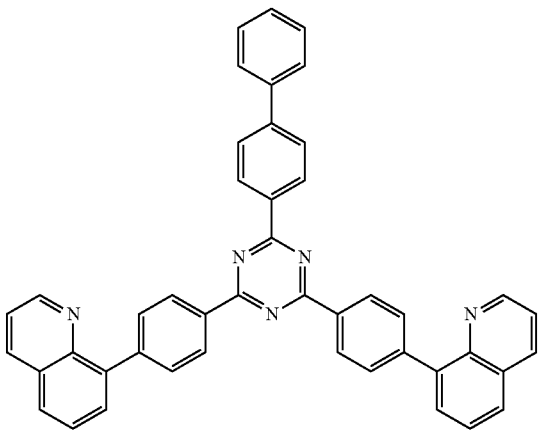
ET27
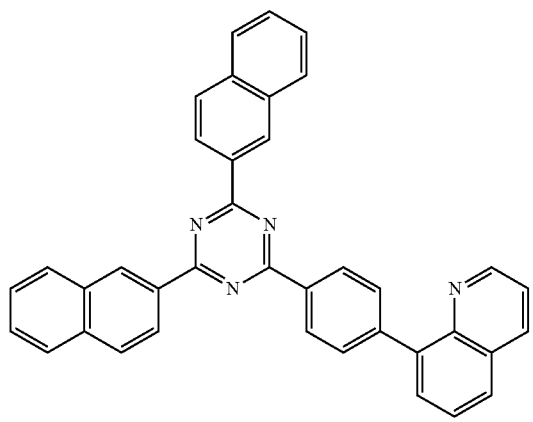
ET28
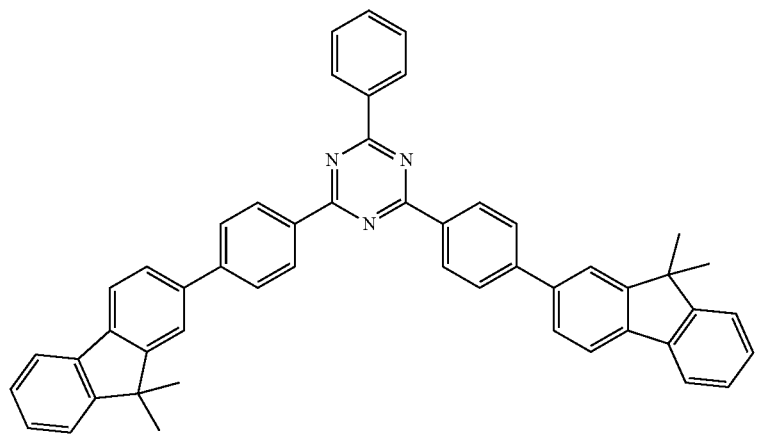

-continued
ET29
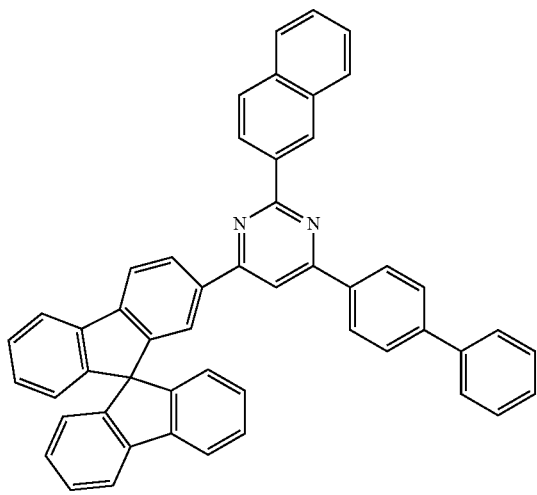
ET30
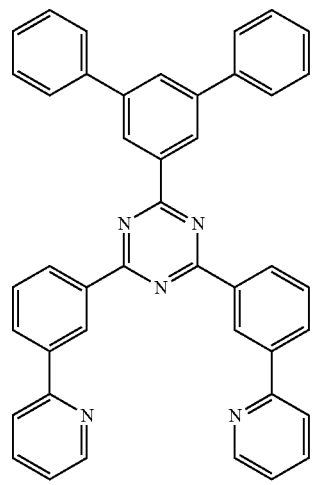
ET31
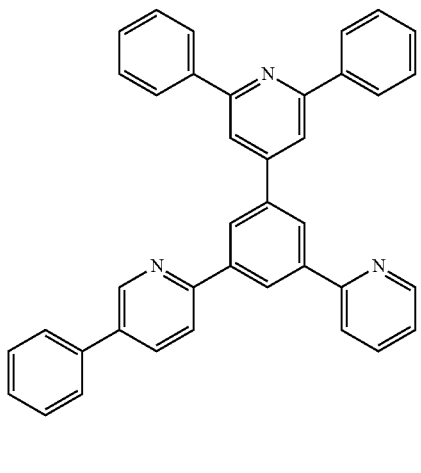
ET32
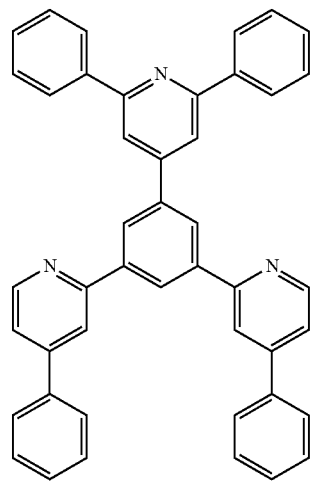
ET33
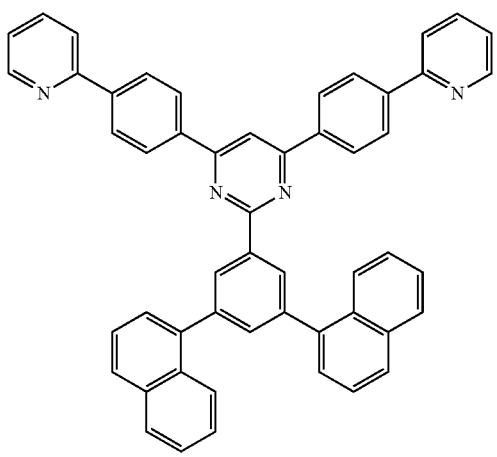
ET34
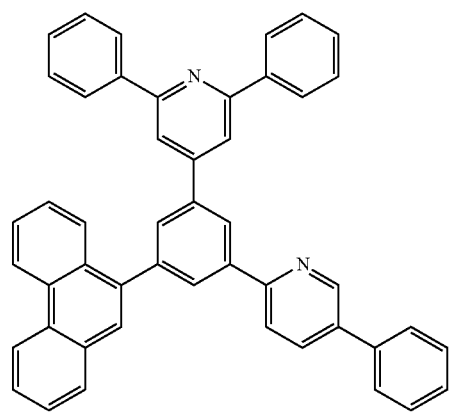

ET35
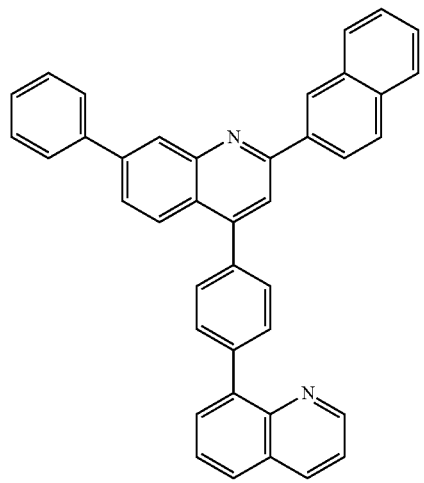
ET36
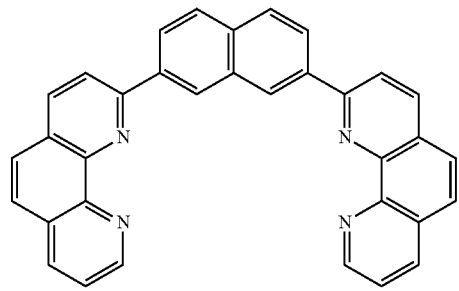
ET37
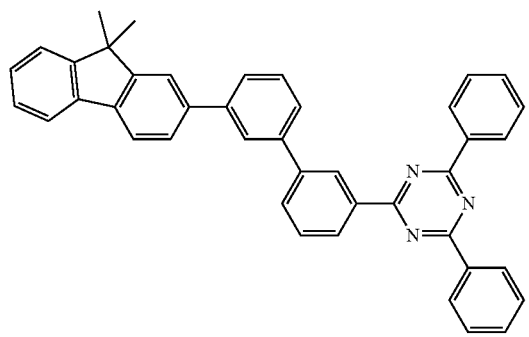
ET38
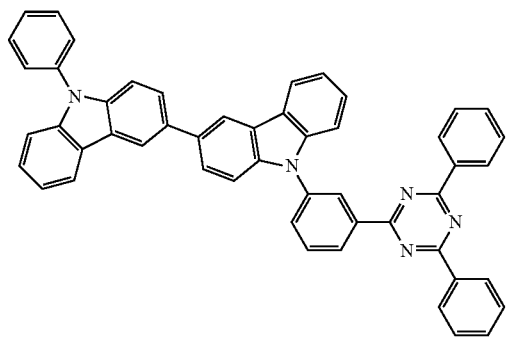
ET39
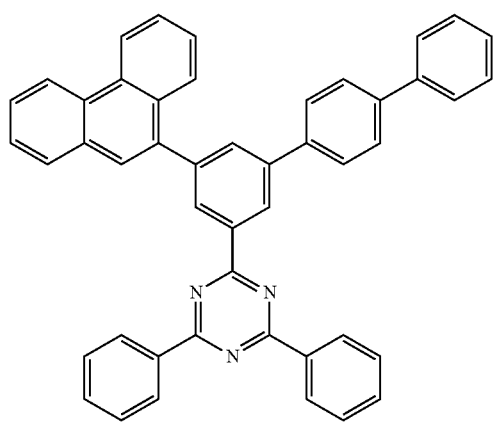
ET40
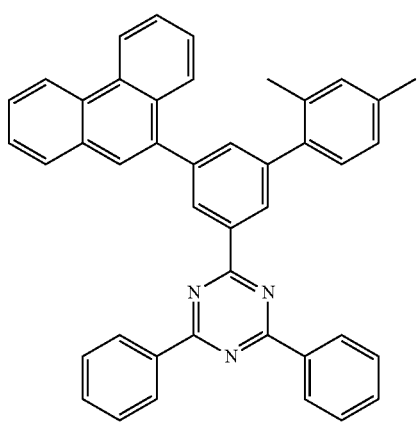

-continued
ET41
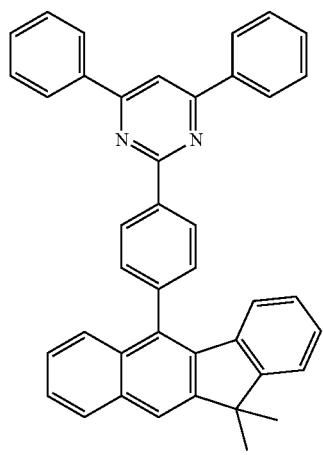
ET42
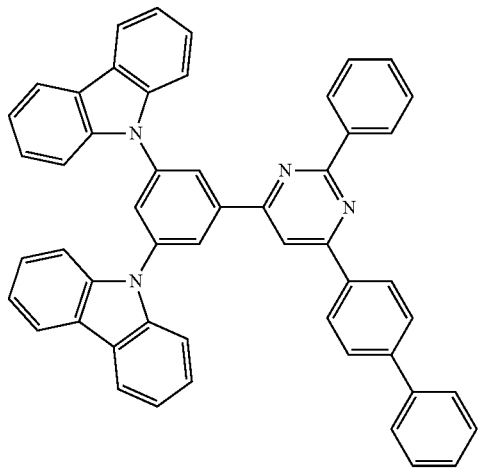
ET43
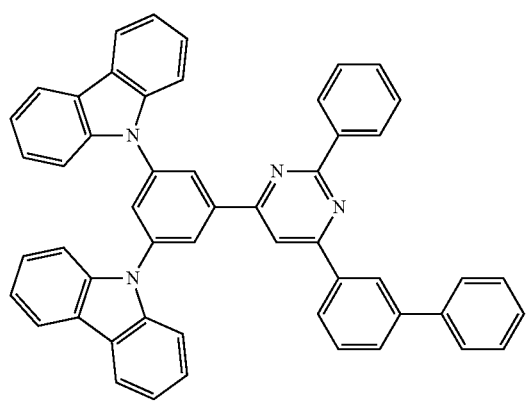
ET44
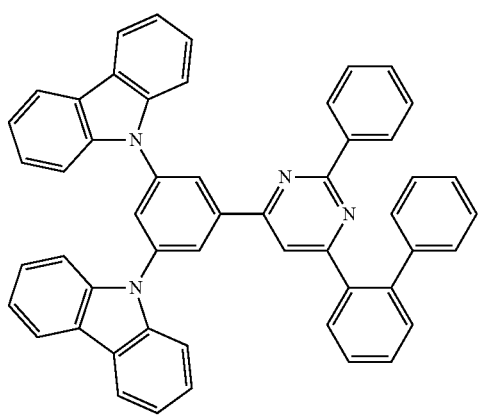
ET45
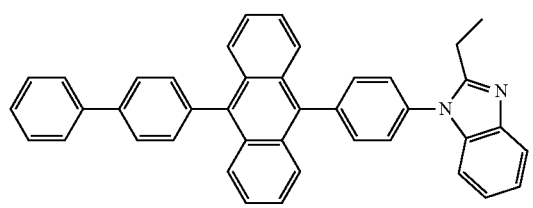
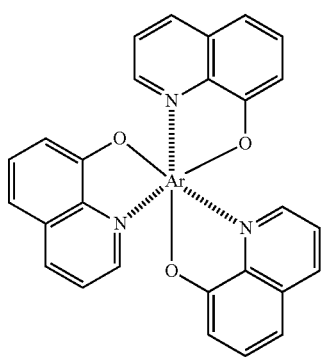
Alq3

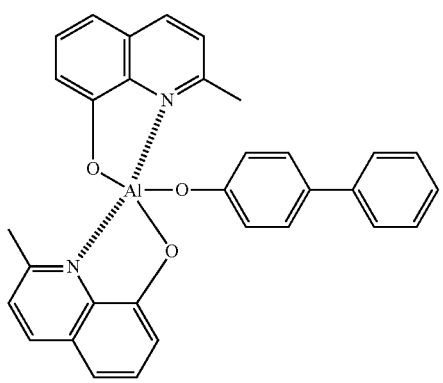

BAlq

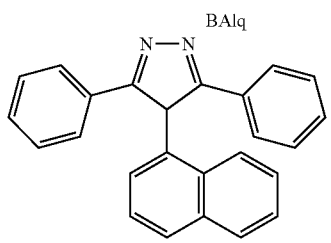

NTAZ

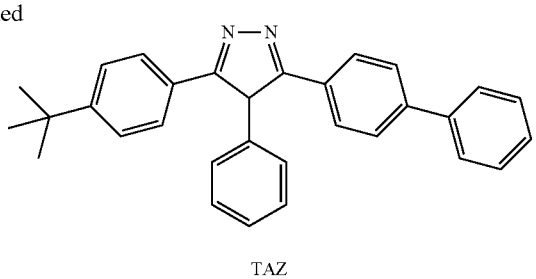

TAZ

The thickness of the electron transport region may be in a range of about 100 Angstroms (Å) to about 5,000 Å, for example, about 100 Å to about 4,000 Å, about 100 Å to about 3,000 Å, about 100 Å to about 2,000 Å, about 100 Å to about 1,000 Å, about 1000 Å to about 5,000 Å, and about 2000 Å to about 4,000 Å. When the electron transport region includes a buffer layer, a hole blocking layer, an electron control layer, an electron transport layer, or any combination thereof, the thicknesses of the buffer layer, the hole blocking layer, and the electron control layer may each independently be in a range of about 20 Å to about 1,000 Å, for example, about 30 Å to about 300 Å, about 40 Å to about 500 Å, about 50 Å to about 500 Å, about 60 Å to about 600 Å, about 70 Å to about 700 Å, about 80 Å to about 800 Å, about 90 Å to about 900 Å, and about 100 Å to about 1000 Å; and the thickness of the electron transport layer may be in a range of about 100 Å to about 1,000 Å, for example, about 150 Å to about 500 Å, about 200 Å to about 600 Å, about 300 Å to about 700 Å, about 400 Å to about 800 Å, and about 500 Å to about 900 Å. While not wishing to be bound by theory, it is understood that when the thicknesses of the buffer layer, the hole blocking layer, the electron control layer, the electron transport layer, and/or the electron transport region are each within these ranges, excellent or improved electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a $L_1$ complex. The Li complex may include, e.g., Compound ET-D1 (LiQ) or Compound ET-D2:

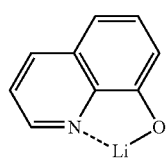

ET-D1

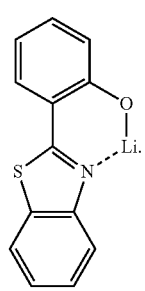

ET-D2

The electron transport region may include an electron injection layer that facilitates injection of electrons from the second electrode 150. The electron injection layer may be in direct contact with the second electrode 150.

The electron injection layer may have i) a single-layered structure including of a single layer including of a single material, ii) a single-layered structure including of a single layer including a plurality of different materials, or iii) a multi-layered structure including a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $Ba_xSr_{1-x}O$ (wherein x is a real number satisfying 0<x<1), or $Ba_xCa_{1-x}O$ (wherein x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxyquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may include or may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (e.g., a compound represented by Formula 601).

In an embodiment, the electron injection layer may include or may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In an embodiment, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof, may be homogeneously or non-homogeneously dispersed in a matrix including the organic material.

The thickness of the electron injection layer may be in a range of about 1 Å to about 100 Å, and in some embodiments, about 3 Å to about 90 Å, about 5 Å to about 80 Å, about 7 Å to about 70 Å, about 9 Å to about 70 Å, about 10 Å to about 60 Å, about 15 Å to about 50 Å, about 20 Å to about 40 Å, or about 25 Å to about 30 Å. While not wishing to be bound by theory, it is understood that when the thickness of the electron injection layer is within any of these ranges, excellent or improved electron injection characteristics may be obtained without a substantial increase in driving voltage.

Second Electrode 150

The second electrode 150 may be on the interlayer 130. In an embodiment, the second electrode 150 may be a cathode that is an electron injection electrode. In an embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

Capping Layer

A first capping layer may be located outside the first electrode 110, and/or a second capping layer may be located outside the second electrode 150. In an embodiment, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. In an embodiment, the optical extraction efficiency of the light-emitting device 10 may be increased, thus improving the luminescence efficiency of the light-emitting device 10.

The first capping layer and the second capping layer may each include a material having a refractive index of 1.6 or higher (at 589 nm).

The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include the compound represented by Formula 201, the compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

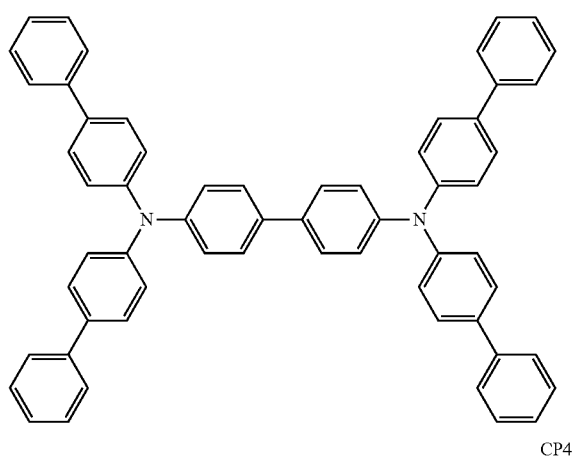

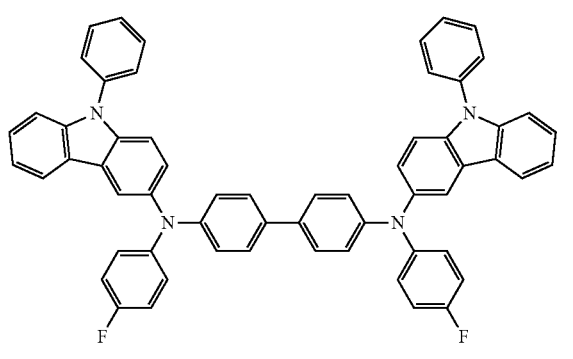

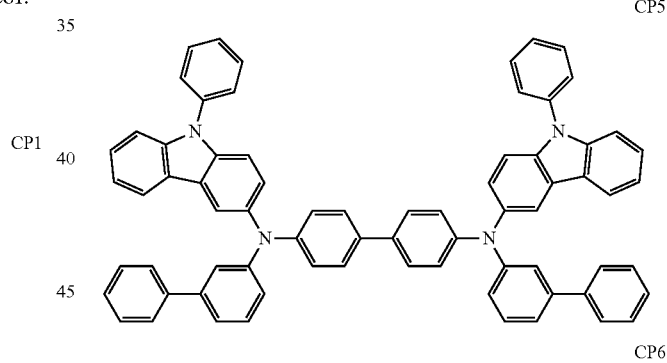

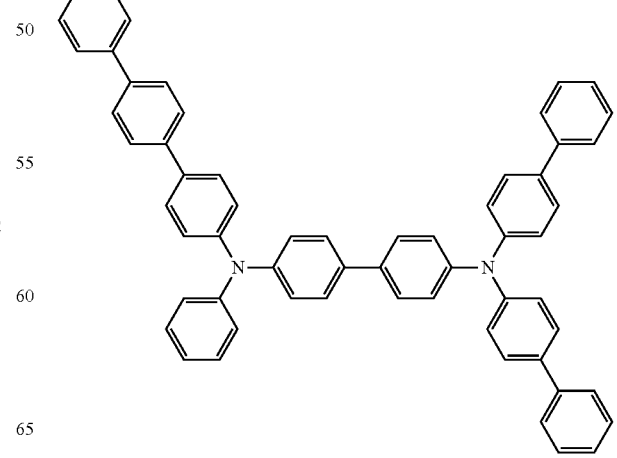

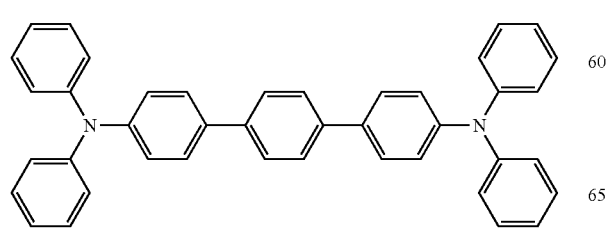

-continued

β-NPB

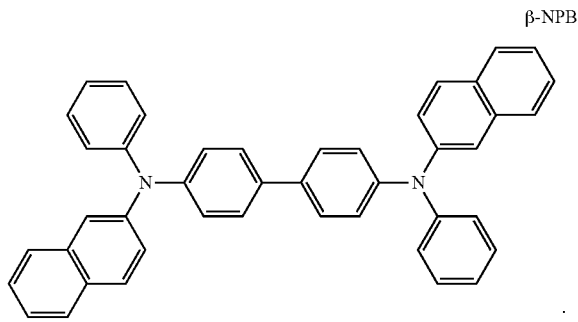

Electronic Apparatus

The light-emitting device may be included in various electronic apparatuses. In an embodiment, an electronic apparatus including the light-emitting device may be a light-emitting apparatus or an authentication apparatus.

The electronic apparatus (e.g., a light-emitting apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light or white light. The light-emitting device may be understood by referring to the descriptions provided herein. In an embodiment, the color-conversion layer may include quantum dots. The quantum dot may be, for example, the quantum dot described herein.

The electronic apparatus may include a first substrate. The first substrate may include a plurality of sub-pixel areas, the color filter may include a plurality of color filter areas respectively corresponding to the plurality of sub-pixel areas, and the color-conversion layer may include a plurality of color-conversion areas respectively corresponding to the plurality of sub-pixel areas.

A pixel defining film may be located between the plurality of sub-pixel areas to define each sub-pixel area.

The color filter may further include a plurality of color filter areas and light-blocking patterns between the plurality of color filter areas, and the color-conversion layer may further include a plurality of color-conversion areas and light-blocking patterns between the plurality of color-conversion areas.

The plurality of color filter areas (or a plurality of color-conversion areas) may include: a first area emitting first color light; a second area emitting second color light; and/or a third area emitting third color light, and the first color light, the second color light, and/or the third color light may have different maximum emission wavelengths. In an embodiment, the first color light may be red light, the second color light may be green light, and the third color light may be blue light. In an embodiment, the plurality of color filter areas (or the plurality of color-conversion areas) may each include quantum dots. In an embodiment, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In an embodiment, the light-emitting device may emit first light, the first area may absorb the first light to emit first first-color light, the second area may absorb the first light to emit second first-color light, and the third area may absorb the first light to emit third first-color light. In an embodiment, the first first-color light, the second first-color light, and the third first-color light may each have a different maximum emission wavelength. In an embodiment, the first light may be blue light, the first first-color light may be red light, the second first-color light may be green light, and the third first-color light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent the air and moisture to permeate to the light-emitting device at the same time. The encapsulation unit may be a sealing substrate including transparent glass or a plastic substrate. The encapsulation unit may be a thin-film encapsulating layer including at least one of an organic layer and an inorganic layer. When the encapsulation unit is a thin film encapsulating layer, the electronic apparatus may be flexible.

In addition to the color filter and/or the color-conversion layer, various functional layers may be disposed on the encapsulation unit depending on the use of an electronic apparatus. Examples of the functional layer may include a touch screen layer, a polarization layer, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector.

Figure 4:
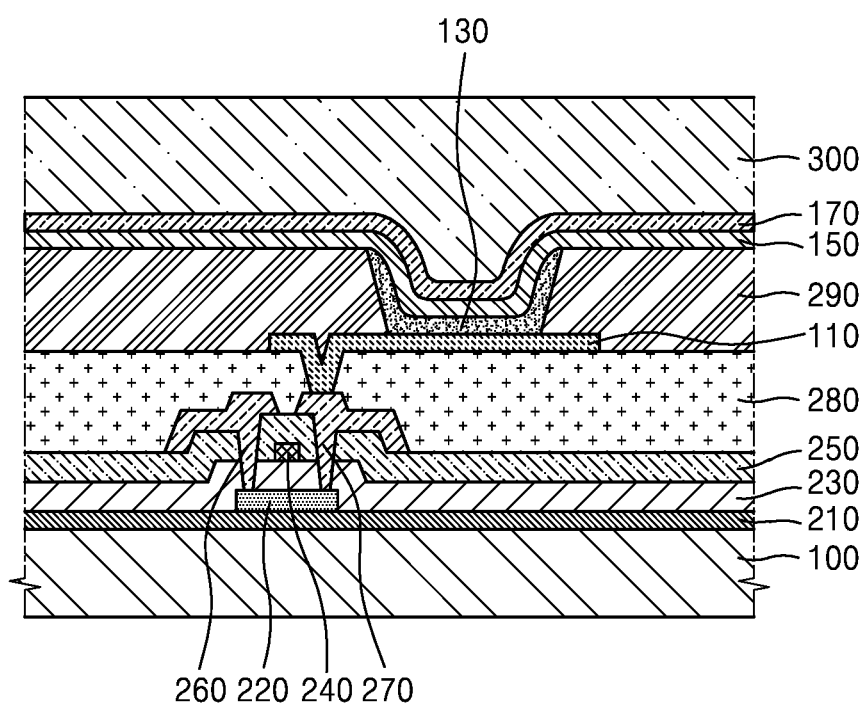
FIG. 4 is a schematic cross-sectional view of a light-emitting device according to an embodiment.
Figure 5:
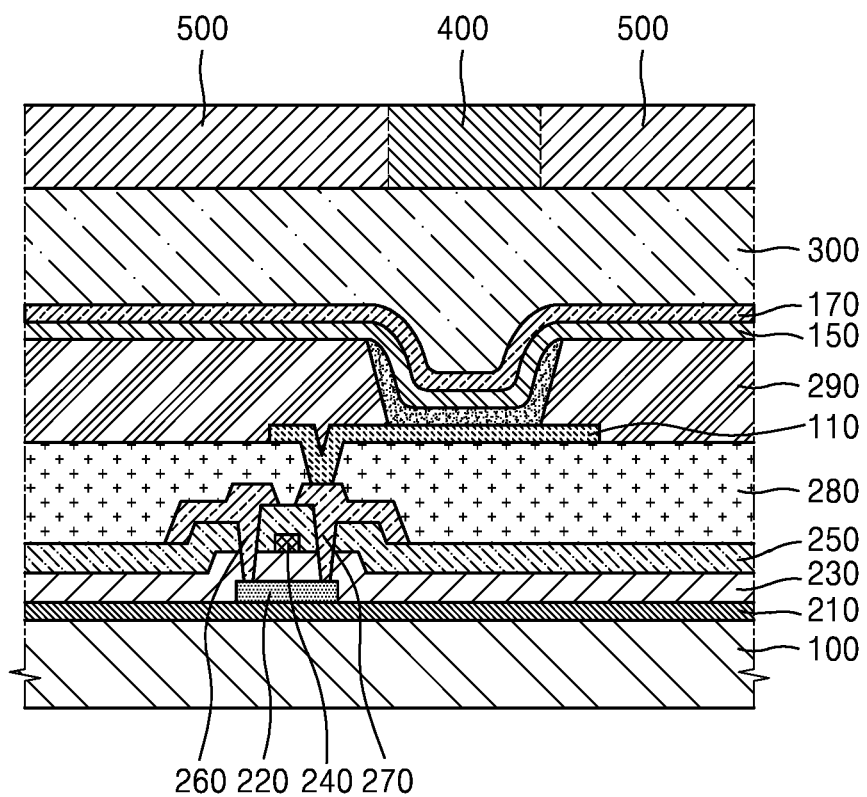
FIG. 5 is a schematic cross-sectional view of a light-emitting device according to an embodiment.

Descriptions of FIGS. 4 and 5

FIG. 4 is a schematic cross-sectional view of a light-emitting apparatus according to an embodiment.

A light-emitting apparatus in FIG. 4 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

In an embodiment a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to connect to the exposed area of the drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or polyacryl organic film. Although it is not shown in FIG. 4, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, polyarylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 5 is a schematic cross-sectional view of another emission apparatus according to an embodiment.

The light-emitting apparatus shown in FIG. 5 may be substantially identical to the light-emitting apparatus shown in FIG. 4, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In an embodiment, the light-emitting device shown in FIG. 5 included in the light-emitting apparatus may be a tandem light-emitting device.

Manufacturing Method

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an emission layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General Definitions of Terms

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. Both groups, $C_3$-$C_{60}$ carbocyclic group and $C_1$-$C_{60}$ heterocyclic group, include aromatic and nonaromatic cyclic groups. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In an embodiment, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), In an embodiment, the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), In an embodiment, the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like).

In an embodiment, the π electron-deficient nitrogen-containing $C_1$-$C_{60}$ cyclic group may be i) a T4 group, ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like).

In an embodiment, the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group.

The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_1$-$C_{60}$ alkylthio group" used herein refers to a monovalent group represented by —$SA_{104}$ (wherein $A_{104}$ is the $C_1$-$C_{60}$ alkyl group), and examples thereof include a thiomethyl group, a thioethyl group, and a thioisopropyl group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring-forming atoms (e.g., 8 to 60 carbon atoms), wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$C_1$-$C_{60}$ heteroaryloxy group" as used herein refers to —$OA_{105}$ (wherein $A_{105}$ is the $C_1$-$C_{60}$ heteroaryl group), the term "$C_1$-$C_{60}$ heteroarylthio group" as used herein indicates —$SA_{106}$ (wherein $A_{106}$ is the $C_1$-$C_{60}$ heteroaryl group).

The term "$R_{10a}$" as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, a $C_1$-$C_{60}$ heteroaryloxy group, a $C_1$-$C_{60}$ heteroarylthio group, or a $C_6$-$C_{60}$ arylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; or a $C_3$-$C_{60}$ carbocyclic group or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

"Ph" used herein represents a phenyl group, "Me" used herein represents a methyl group, "Et" used herein represents an ethyl group, "ter-Bu" or "Bu$^t$" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols *, *', *", and *'" as used herein, unless defined otherwise, refer to a binding site to an adjacent atom in a corresponding formula.

Hereinafter, compounds and a light-emitting device according to one or more embodiments will be described in more detail with reference to Synthesis Examples and Examples. The wording "B was used instead of A" used in describing Synthesis Examples means that an amount of B used was identical to an amount of A used in terms of molar equivalents.

EXAMPLES

1. Synthesis of Precursor of Organic Group

A thiol-terminal block copolymer was prepared by a reversible addition fragmentation transfer (RAFT) method. Chlorostyrene and a trimethylamine monomer were distilled and purified, and a dithioester structure was used as a RAFT agent.

Synthesis Example 1-1 (Synthesis of Precursor 1)

Precursor 1, m=10, n=10

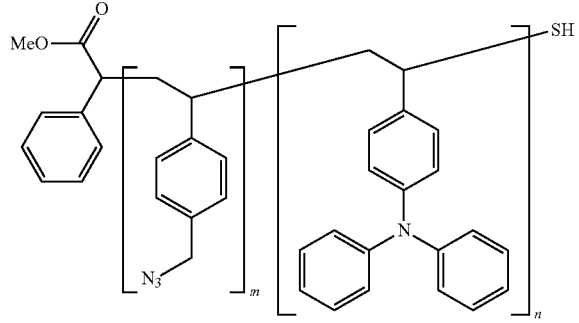

5 grams (g) of 4-vinylbenzyl chloride monomer (0.033 mole (mol)), 0.0028 g of azobisisobutyronitrile (AIBN) (0.00017 mol), 0.5 g of a dithioester RAFT agent (0.0017 mol), and 10 g of benzene were mixed together. By a three freeze-pump-thaw cycles method, gas was removed therefrom. Then, the resulting mixture was stirred under vacuum at a temperature of 70° C. for 2 hours, the product was precipitated in acetone, to thereby obtain 2 g of Intermediate 1-1 (Mn: 1,550 g/mol, PDI: 1.1).

Dithioester RAFT Agent

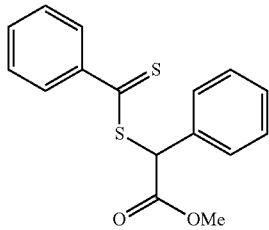 [SMILES: COC(=O)C(SC(=S)c1ccccc1)c1ccccc1]

2.1 g of N,N-diphenyl-4-vinylaniline (TPA) monomer (0.0078 mol), 0.001 g of AIBN (0.000065 mol), 1.0 g of Intermediate 1-1 (0.00065 mol), and 10 g of benzene were mixed together. By a three freeze-pump-thaw cycles method, gas was removed therefrom. Then, the resulting mixture was stirred under vacuum at a temperature of 70° C. for 2 hours, the product was precipitated in acetone, to thereby obtain 1.2 g of Intermediate 1-2 (Mn: 4,350 g/mol, PDI: 1.2).

Intermediate 1-2, 0.057 g of hexylamine (0.00056 mol), and 5 g of anhydrous (dry) tetrahydrofuran (THF) were mixed, and then, the resulting product stirred under nitrogen atmosphere for 12 hours was precipitated in methanol to thereby obtain 1.2 g of Intermediate 1-3.

1.2 g of Intermediate 1-3 (0.00028 mol), 0.022 g of sodium azide (0.00033 mol), and 5 g of dimethyl formamide (DMF) were mixed, and then, the resulting mixture was stirred under nitrogen atmosphere for 12 hours, the product was precipitated in methanol to thereby obtain 1.2 g of Precursor 1.

Synthesis Example 1-2 (Synthesis of Precursor 2)

Precursor 2, m=10, n=30

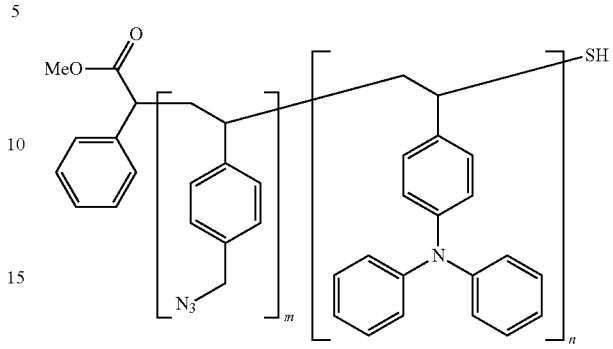

6.3 g of N,N-diphenyl-4-vinylaniline (TPA) monomer (0.0234 mol), 0.001 g of AIBN (0.000065 mol), 1.0 g of Intermediate 1-1 (0.00065 mol), and 20 g of benzene were mixed together. By a three freeze-pump-thaw cycles method, gas was removed therefrom. Then, the resulting mixture was stirred under vacuum at a temperature of 70° C. for 4 hours, the product was precipitated in acetone to thereby obtain 3.0 g of Intermediate 2-2 (Mn: 10,000 g/mol, PDI: 1.2).

3.0 g of Intermediate 2-2 (0.0003 mol), 0.0606 g of hexylamine (0.0006 mol), and 10 g of anhydrous (dry) THF were mixed, and then, the resulting mixture was stirred under nitrogen atmosphere for 12 hours, the product was precipitated in methanol to thereby obtain 3.0 g of Intermediate 2-3.

3.0 g of Intermediate 2-3 (0.0003 mol), 0.24 g of sodium azide (0.00036 mol), and 10 g of DMF were mixed, and then, the resulting mixture was stirred under nitrogen atmosphere for 12 hours, the product was precipitated in methanol to thereby obtain 3.0 g of Precursor 2.

Synthesis Example 1-3 (Synthesis of Precursor 3)

Precursor 3, m=10, n=60

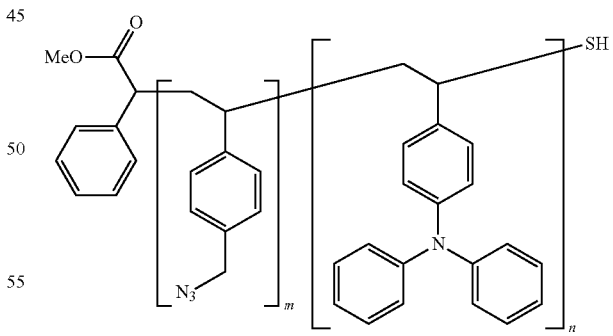

12.6 g of N,N-diphenyl-4-vinylaniline (TPA) monomer (0.0468 mol), 0.001 g of AIBN (0.000065 mol), 1.0 g of Intermediate 1-1 (0.00065 mol), and 30 g of benzene were mixed together. By a three freeze-pump-thaw cycles method, gas was removed therefrom. Then, the resulting mixture was stirred under vacuum at a temperature of 70° C. for 4 hours, the product was precipitated in acetone to thereby obtain 5.0 g of Intermediate 3-2 (Mn: 18,600 g/mol, PDI: 1.3).

5.0 g of Intermediate 3-2 (0.00027 mol), 0.06 g of hexylamine (0.00054 mol), and 10 g of anhydrous (dry) THF were mixed, and then, the mixture was stirred under nitrogen atmosphere for 12 hours. The resulting product was precipitated in methanol to thereby obtain 5.0 g of Intermediate 3-3.

5.0 g of Intermediate 3-3 (0.00027 mol), 0.3 g of sodium azide (0.00033 mol), and 15 g of DMF were mixed, and then, the resulting mixture was stirred under nitrogen atmosphere for 12 hours, the product was precipitated in methanol to thereby obtain 5.0 g of Precursor 3.

Synthesis Example 1-4 (Synthesis of Precursor 4)

Precursor 4, m=10, n=10

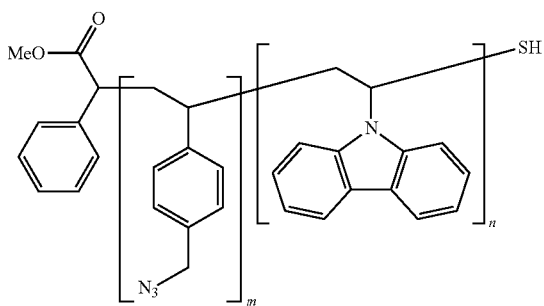

1.5 g of 9-vinylcarbazole monomer (0.0078 mol), 0.001 g of AIBN (0.000065 mol), 1.0 g of Intermediate 1-1 (0.00065 mol), and 10 g of benzene were mixed together. By a three freeze-pump-thaw cycles method, gas was removed therefrom. Then, the resulting mixture was stirred under vacuum at a temperature of 70° C. for 2 hours, the product was precipitated in acetone to thereby obtain 2.0 g of Intermediate 4-2 (Mn: 3,520 g/mol, PDI: 1.2).

2.0 g of Intermediate 4-2 (0.00057 mol), 0.11 g of hexylamine (0.0011 mol), and 5 g of anhydrous (dry) THF were mixed, and then, the resulting mixture was stirred under nitrogen atmosphere for 12 hours, the product was precipitated in methanol to thereby obtain 1.8 g of Intermediate 4-3.

1.8 g of Intermediate 4-3 (0.00051 mol), 0.04 g of sodium azide (0.00061 mol), and 5 g of DMF were mixed, and then, the resulting mixture was stirred under nitrogen atmosphere for 12 hours, the product was precipitated in methanol to thereby obtain 5.0 g of Precursor 4.

Synthesis Example 1-5 (Synthesis of Precursor 5)

Precursor 5, m=10, n=30

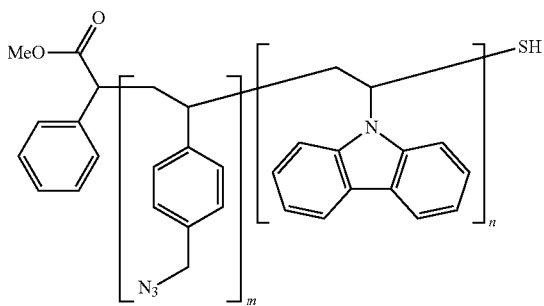

4.5 g of 9-vinylcarbazole monomer (0.0234 mol), 0.001 g of AIBN (0.000065 mol), 1.0 g of Intermediate 1-1 (0.00065 mol), and 15 g of benzene were mixed together. By a three freeze-pump-thaw cycles method, gas was removed therefrom. Then, the resulting mixture was stirred under vacuum at a temperature of 70° C. for 2 hours, the product was precipitated in acetone to thereby obtain 5.0 g of Intermediate 5-2 (Mn: 7,400 g/mol, PDI: 1.2).

5.0 g of Intermediate 5-2 (0.00068 mol), 0.14 g of hexylamine (0.0014 mol), and 10 g of anhydrous (dry) THF were mixed, and then, the resulting mixture was stirred under nitrogen atmosphere for 12 hours, the product was precipitated in methanol to thereby obtain 4.6 g of Intermediate 5-4.

4.6 g of Intermediate 5-4 (0.00062 mol), 0.05 g of sodium azide (0.00075 mol), and 15 g of DMF were mixed, and then, the resulting mixture was stirred under nitrogen atmosphere for 12 hours, the product was precipitated in methanol to thereby obtain 4.3 g of Precursor 5.

Synthesis Example 1-6 (Synthesis of Precursor 6)

Precursor 6, m=10, n=60

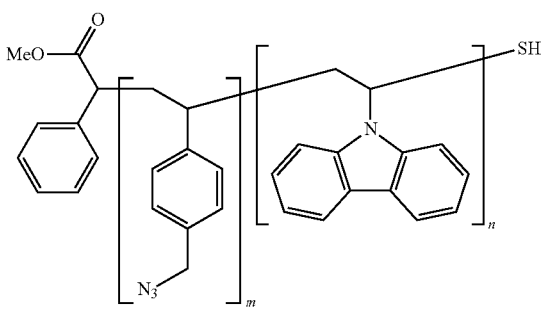

9.0 g of 9-vinylcarbazole monomer (0.047 mol), 0.001 g of AIBN (0.000065 mol), 1.0 g of Intermediate 1-1 (0.00065 mol), and 20 g of benzene were mixed together. By a three freeze-pump-thaw cycles method, gas was removed therefrom. Then, the resulting mixture was stirred under vacuum at a temperature of 70° C. for 9 hours, the product was precipitated in acetone to thereby obtain 9.2 g of Intermediate 6-2 (Mn: 13,400 g/mol, PDI: 1.3).

9.2 g of Intermediate 6-2 (0.00068 mol), 0.14 g of hexylamine (0.0014 mol), and 10 g of anhydrous (dry) THF were mixed, and then, the resulting mixture was stirred under nitrogen atmosphere for 12 hours, the product was precipitated in methanol to thereby obtain 9.0 g of Intermediate 6-3.

9.0 g of Intermediate 6-3 (0.00067 mol), 0.053 g of sodium azide (0.0008 mol), and 20 g of DMF were mixed, and then, the resulting mixture stirred under nitrogen atmosphere for 12 hours, the product was precipitated in methanol to thereby obtain 8.7 g of Precursor 6.

2. Synthesis of Quantum Dot-Containing Material

Synthesis Example 2-1 (Synthesis of Compound 1)

Process 1: Synthesis of InP/ZnSeS
1) Synthesis of InP Core
0.2 g of indium acetate precursor (0.69 millimole (mmol)), 0.38 g of zinc acetate (2.1 mmol), 1.2 milliliters (mL) of oleic acid (3.4 mmol), and 70 mL of 1-octadecene (ODE) were added to a 250 mL three-neck flask. After purging with nitrogen, heating was performed at a temperature of 150° C. for 40 minutes, followed by cooling to room temperature. At room temperature, 2.3 mL of P(TMS)$_3$ (0.91 mmol) was vigorously stirred and injected to a round flask. After injection of P(TMS)$_3$, the reaction temperature was raised from the room temperature to 300° C. for 20 minutes. Then, the resulting product was cooled to a temperature of 230° C. and maintained at that temperature for 40 minutes to thereby form an InP core.

2) Formation of a ZnSeS Shell

A ZnSeS gradient shell was formed on the synthesized InP—GaP core-shell. 0.275 g of Zn(OAc)$_2$ (1.5 mmol) was added to a reaction mixture, and reacted for 1 hour at a temperature of 230° C. 0.16 g of selenium was added to 2 mL of a trioctyl phosphine (TOP) solution, and the mixture was mixed such that the Se-TOP solution became transparent. Subsequently, 0.6 mL of the Se-TOP solution (3 mmol) was added to a round flask at a temperature of 230° C. for 15 seconds. Within 15 seconds, 0.72 mL of DDT (3 mmol) was added dropwise thereto for injection. Then, the reaction temperature was rapidly raised to 300° C., followed by reacting for 20 minutes. Next, the temperature was decreased to 230° C., and the reaction was maintained at that temperature for 20 minutes or more. Finally, the final reaction solution was cooled to room temperature, and methanol and acetone were alternately used 2 to 3 times for centrifugation for separation and purification to thereby preparing an InP/ZnSeS (620 nm) quantum dot.

Process 2: Synthesis of Quantum Dot-Containing Material 1

0.04 g of Precursor 1 was dissolved in 4 mL of toluene, and 0.01 g of InP/ZnSeS was mixed together, followed by stirring for 48 hours. The reaction product was precipitated in cold n-hexane and dissolved in toluene to re-precipitate. This process was repeated for three times. Then, a carboxylic acid ligand was removed therefrom to thereby synthesize Compound 1.

Synthesis Examples 2-1 to 2-6 (Synthesis of Compounds 2 to 6)

In process 2, Compounds 2 to 6 were synthesized in substantially the same manner as in Synthesis Example 2-1, except that Precursors 2 to 6 were each used instead of Precursor 1.

3. Preparation of Cross-Linked Material (Thin Film)

Example 1 (Preparation of Thin Film 1)

Process 1: Synthesis of Ink Composition 1

Compound 1 was dissolved in an anisole solvent to 1.5 weight percent (wt %) to thereby prepare Ink Composition 1 (hereinafter, referred to as "Ink 1").

Process 2: Preparation of Thin Film 1

Ink 1 was spin-coated to form a single film by using a spin coater. Then, drying and heat treatment was performed at a temperature of 180° C. for 30 minutes by using a hot plate to thereby prepare a single film. 50 microliter (μL) of an anisole solvent was coated to the single film, and 30 minutes later, the anisole solvent was absorbed by using a wiper, followed by drying and heat treatment at a temperature of 100° C. for 1 minute by using a hot plate.

The solvent-treated single film was post-baked under a nitrogen atmosphere in a heating oven at a temperature of 180° C. for 30 minutes to thereby prepare a Thin Film 1 having a thickness of 40 nanometer (nm).

Examples 2 to 6 and Comparative Examples 1 to 3 (Thin Films 2 to 6 and Comparative Thin Films 1 to 3)

Thin Films 2 to 6 and Comparative Thin Films 1 to 3 were prepared in substantially the same manner as in Example 1, except that Compounds shown in Table 1 were used instead of Compound 1 in Process 1, and Inks shown in Table 1 were used instead of Ink 1 in Process 2.

Evaluation Example 1

To evaluate characteristics of the Thin Films prepared in Examples 1 to 6 and Comparative Examples 1 to 3, hole mobility of the Thin Films was measured by using a space charge limited current (SCLC). The evaluation results of the Thin Films are shown in Table 1. The residual rate of thin films in Table 1 were each measured by using an exposure system by irradiating UV light (365 nm) in an exposure amount of 200 millijoules per square centimeter (mJ/cm$^2$), calculating the ultraviolet (UV) area of a thin film and the UV area of a single film, and dividing the measured UV area of a thin film by the measured UV area of a single film.

TABLE 1

|  | Quantum dot-containing material | Ink | Residual rate of thin film (%) | Hole mobility (cm$^2$/Vs) |
| --- | --- | --- | --- | --- |
| Example 1 | Compound 1 | Ink 1 | 100 | 1.2 × 10$^{-4}$ |
| Example 2 | Compound 2 | Ink 2 | 100 | 4.5 × 10$^{-4}$ |
| Example 3 | Compound 3 | Ink 3 | 100 | 5.6 × 10$^{-4}$ |
| Example 4 | Compound 4 | Ink 4 | 100 | 1.7 × 10$^{-5}$ |
| Example 5 | Compound 5 | Ink 5 | 100 | 3.6 × 10$^{-5}$ |
| Example 6 | Compound 6 | Ink 6 | 100 | 5.2 × 10$^{-5}$ |
| Comparative Example 1 | InP/ZnSeS | Comparative Ink 1 | 4 | 1.3 × 10$^{-7}$ |
| Comparative Example 2 | Compound B | Comparative Ink 2 | 100 | 2.2 × 10$^{-7}$ |
| Comparative Example 3 | Compound C | Comparative Ink 3 | 5 | 5.2 × 10$^{-8}$ |

Organic Groups of Compounds 1 to 6 and Compounds B and C

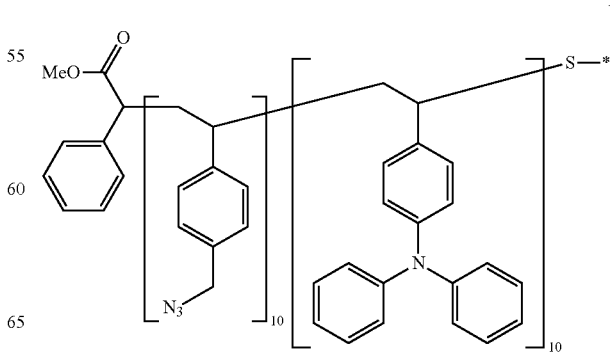

-continued

2

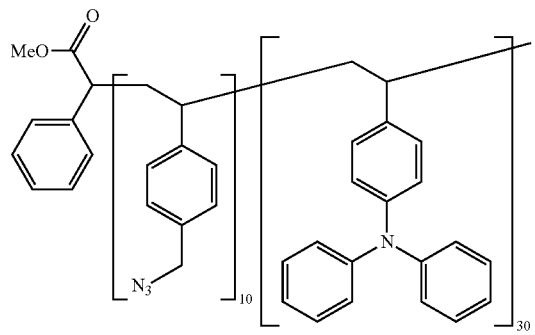

3

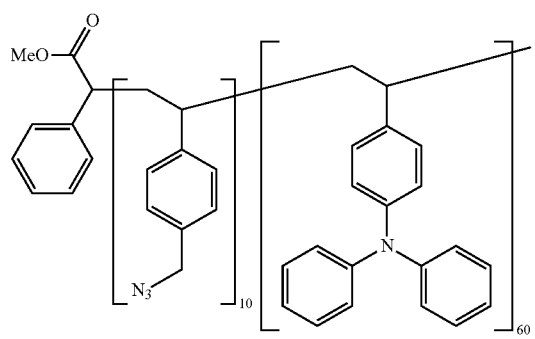

4

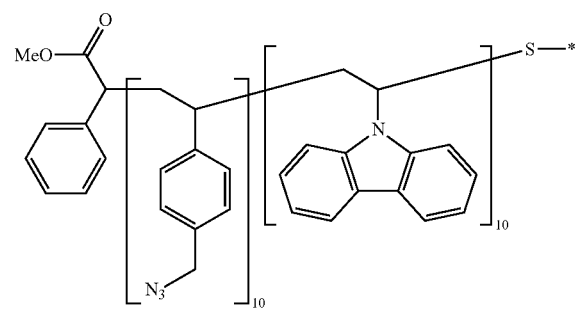

5

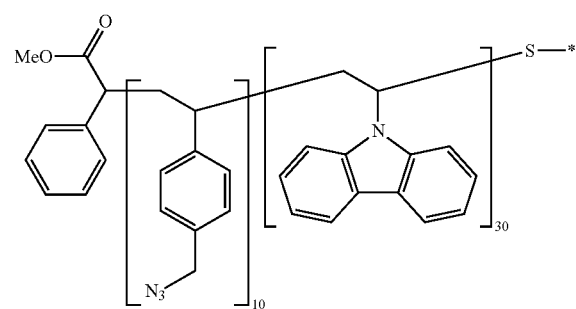

-continued

6

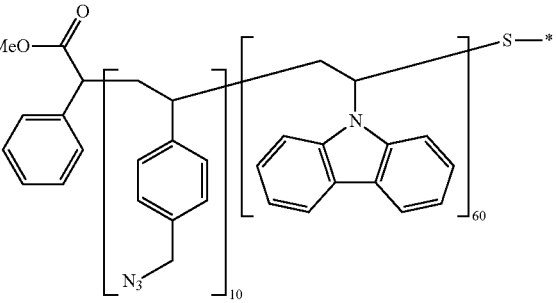

B

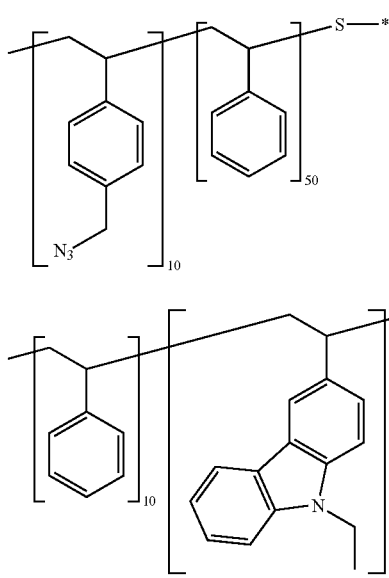

C

In Compounds 1 to 6 and Compounds B and C, * indicates a binding site to InP/ZnSeS.

In Table 1, Thin Films of Examples 1 to 6 was found to have significantly improved hole mobility, as compared with Thin Films of Comparative Examples 1 to 3.

As apparent from the foregoing description, the cross-linked materials prepared by cross-linking of the quantum dot-containing compositions were found to have excellent or improved hole mobility and long or improved lifespan, and thus, the cross-linked materials may be used in manufacture of a high-quality apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present detailed description as defined by the following claims.

What is claimed is:

1. A quantum dot-containing material comprising:
a quantum dot; and
an organic group chemically bound to a surface of the quantum dot via an oxygen bond or a sulfur bond,
wherein the organic group comprises: an azide group, and a charge transport group, and the charge transport group is not an unsubstituted benzene group.

2. The quantum dot-containing material of claim 1, wherein the quantum dot comprises:
a group II-VI semiconductor compound;
a group III-V semiconductor compound;
a group III-VI semiconductor compound;
a group I-III-VI semiconductor compound;
a group IV-VI semiconductor compound;
a group IV element or compound; or
any combination thereof.

3. The quantum dot-containing material of claim 1, wherein the charge transport group in the organic group is an electron donating group or an electron withdrawing group.

4. The quantum dot-containing material of claim 3, wherein the electron donating group is a π electron-rich $C_3$-$C_{60}$ cyclic group unsubstituted or substituted with at least one of $R_{20a}$ or $N(Ar_2)(Ar_3)$, wherein
$Ar_2$ and $Ar_3$ are each independently a π electron-rich $C_3$-$C_{60}$ cyclic group unsubstituted or substituted with at least one $R_{20a}$,
the electron withdrawing group is:
—F, —$CFH_2$, —$CF_2H$, —$CF_3$, —CN, or —$NO_2$;
a $C_1$-$C_{60}$ alkyl group substituted with at least one of —F, —$CFH_2$, —$CF_2H$, —$CF_3$, —CN or —$NO_2$; or
a π electron-depleted nitrogen-containing $C_1$-$C_{60}$ cyclic group unsubstituted or substituted with at least one $R_{10a}$,
$R_{10a}$ is:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_1$-$C_{60}$ arylthio group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or
—$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$,
wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{60}$ carbocyclic group; or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof, and $R_{20a}$ is:
deuterium, a hydroxyl group, or a nitro group;
a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{41})(Q_{42})(Q_{43})$, —$N(Q_{41})(Q_{42})$, —$B(Q_{41})(Q_{42})$, or any combination thereof;
a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{51})(Q_{52})(Q_{53})$, —$N(Q_{51})(Q_{52})$, —$B(Q_{51})(Q_{52})$, or any combination thereof; or
—$Si(Q_{61})(Q_{62})(Q_{63})$, —$N(Q_{61})(Q_{62})$, or —$B(Q_{61})(Q_{62})$,
wherein $Q_{41}$ to $Q_{43}$, $Q_{51}$ to $Q_{53}$, and $Q_{61}$ to $Q_{63}$ are each independently: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof.

5. The quantum dot-containing material of claim 3, wherein the electron donating group is substituted a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonapthothiophene group, an (indolo) phenanthrene group, a (benzofurano) phenanthrene group, a (benzothieno) phenanthrene group, or —$N(Ar_2)(Ar_3)$, each independently unsubstituted or substituted with at least one $R_{20a}$, and descriptions of $Ar_2$, $Ar_3$, and $R_{20a}$ are the same as set forth in claim 4.

6. The quantum dot-containing material of claim 1, wherein the organic group is a group represented by Formula 1:

Formula 1

*—$X_1$—$Z_1$-$(A_1)_m$-$Z_2$-$(A_2)_n$-$Z_3$-$T_1$          1 wherein $A_1$ and $A_2$ are each independently a group represented by Formula 2-1 or Formula 2-2, Formula 2-1

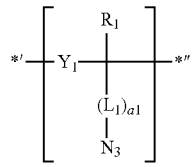

Formula 2-2

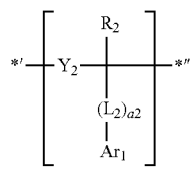

wherein, in Formula 1,
$X_1$ is O or S,
$Z_1$ to $Z_3$ are each independently:
a single bond;
*—$N(R_{1a})$—*', *—O—*', *—S—*', or *—$C(=O)$—*'; or
a $C_1$-$C_{60}$ alkylene group, a $C_1$-$C_{60}$ oxyalkylene group, a $C_6$-$C_{60}$ arylene group, or a $C_6$-$C_{60}$ oxyarylene group, each independently unsubstituted or substituted with deuterium, a hydroxyl group, a $C_1$-$C_{20}$ alkyl group, a $C_1$-$C_{20}$ alkoxy group, a $C_1$-$C_{20}$ alkylthio group, a phenyl group, a biphenyl group, or any combination thereof,
$T_1$ is a terminal group,
at least one of $A_1$ in a number of m and $A_2$ in a number of n is a group represented by Formula 2-1,
m and n are each independently an integer from 50 to 1,000,
* indicates a binding site to the surface of the quantum dot,
wherein, in Formulae 2-1 and 2-2,
$Y_1$ and $Y_2$ are each independently a single bond or a $C_1$-$C_{10}$ alkylene group unsubstituted or substituted with at least one $R_{10a}$,
$L_1$ and $L_2$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
a1 and a2 are each independently an integer from 1 to 3,
$Ar_1$ is an electron donating group unsubstituted or substituted with at least one $R_{20a}$ or an electron withdrawing group unsubstituted or substituted with at least one $R_{10a}$,
when $L_1$ is a single bond, $Ar_1$ is not an unsubstituted benzene group, $R_1$ and $R_2$ are each independently hydrogen, deuterium, —F, —Cl, —Br, —I, a hydroxyl group, a cyano group, a nitro group, a $C_1$-$C_{10}$ alkyl group, a $C_2$-$C_{10}$ alkenyl group, a $C_2$-$C_{10}$ alkynyl group, a $C_1$-$C_{10}$ alkylthio group, or a $C_1$-$C_{10}$ alkoxy group,
*' and *'' each indicate a binding site to an adjacent atom,
$R_{1a}$ and $R_{10a}$ are each independently:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or
—$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$,
wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{60}$ carbocyclic group; or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof, and
$R_{20a}$ is:
deuterium, a hydroxyl group, or a nitro group;
a $C_1$-$C_{60}$ alkyl group, a $C_2$-$C_{60}$ alkenyl group, a $C_2$-$C_{60}$ alkynyl group, a $C_1$-$C_{60}$ alkylthio group, or a $C_1$-$C_{60}$ alkoxy group, each independently unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —$Si(Q_{41})(Q_{42})(Q_{43})$, —$N(Q_{41})(Q_{42})$, —$B(Q_{41})(Q_{42})$, or any combination thereof;
a π electron-rich $C_3$-$C_{60}$ cyclic group, a $C_6$-$C_{60}$ aryloxy group, a $C_1$-$C_{60}$ arylthio group, a $C_1$-$C_{60}$ heteroaryloxy group, or a $C_1$-$C_{60}$ heteroarylthio group, each independently unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a π electron-rich $C_3$-$C_{60}$ cyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, —Si($Q_{51}$)($Q_{52}$)($Q_{53}$), —N($Q_{51}$)($Q_{52}$), —B($Q_{51}$)($Q_{52}$), or any combination thereof; or —Si($Q_{61}$)($Q_{62}$)($Q_{63}$), —N($Q_{61}$)($Q_{62}$), or —B($Q_{61}$)($Q_{62}$), wherein $Q_{41}$ to $Q_{43}$, $Q_{51}$ to $Q_{53}$, and $Q_{61}$ to $Q_{63}$ are each independently: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkylthio group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof.

7. The quantum dot-containing material of claim 1, wherein a molar ratio of the azide group to the charge transport group in the organic group is in a range of about 1:1 to about 1:10.

8. The quantum dot-containing material of claim 1, wherein a molar ratio of the organic group to the quantum dot in the quantum dot-containing material is in a range of about 1:100 to about 1:1,000.

9. The quantum dot-containing material of claim 1, wherein an average diameter (D50) of the quantum dot-containing material is in a range of about 40 nanometers (nm) to about 1,000 nanometers.

10. A method of preparing a quantum dot-containing material, wherein the quantum dot-containing material comprises a quantum dot and an organic group chemically bound to a surface of the quantum dot dot via an oxygen bond or a sulfur bond, and the organic group comprises an azide group and a charge transport group that is not an unsubstituted benzene group, the method comprising:
chemically reacting the quantum dot with a precursor of the organic group to chemically bond the surface of the quantum dot to the organic group.

11. The method of claim 10, wherein the precursor of the organic group is represented by Formula 1(1):

Formula 1(1)

H—$X_1$—$Z_1$-($A_1$)$_m$-$Z_2$-($A_2$)$_n$-$Z_3$-$T_1$      1(1)

wherein $A_1$ and $A_2$ are each independently a group represented by Formula 2-1 or Formula 2-2, Formula 2-1

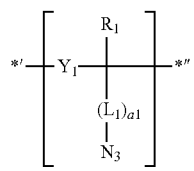

Formula 2-2

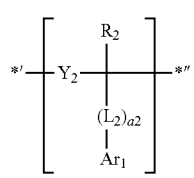

wherein, in Formula 1(1),
$X_1$ is O or S,
$Z_1$ to $Z_3$ are each independently:
a single bond;
*—N($R_{1a}$)—*″, *—O—*″, *—S—*″, or *—C(=O)—*″;
or
a $C_1$-$C_{60}$ alkylene group, a $C_1$-$C_{60}$ oxyalkylene group, a $C_6$-$C_{60}$ arylene group, or a $C_6$-$C_{60}$ oxyarylene group, each independently unsubstituted or substituted with deuterium, a hydroxyl group, a $C_1$-$C_{20}$ alkyl group, a $C_1$-$C_{20}$ alkoxy group, a $C_1$-$C_{20}$ alkylthio group, a phenyl group, a biphenyl group, or any combination thereof,
$T_1$ is a terminal group,
at least one of $A_1$ in a number of m and $A_2$ in a number of n is a group represented by Formula 2-1,
m and n are each independently an integer from 50 to 1,000,
wherein, in Formulae 2-1 and 2-2,
$Y_1$ and $Y_2$ are each independently a single bond or a $C_1$-$C_{10}$ alkylene group unsubstituted or substituted with at least one $R_{10a}$,
$L_1$ and $L_2$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
a1 and a2 are each independently an integer from 1 to 3,
$Ar_1$ is an electron donating group unsubstituted or substituted with at least one $R_{10a}$ or an electron withdrawing group unsubstituted or substituted with at least one $R_{10a}$,
when $L_1$ is a single bond, $Ar_1$ is not an unsubstituted benzene group,
$R_1$ and $R_2$ are each independently hydrogen, deuterium, —F, —Cl, —Br, —I, a hydroxyl group, a cyano group, a nitro group, a $C_1$-$C_{10}$ alkyl group, a $C_2$-$C_{10}$ alkenyl group, a $C_2$-$C_{10}$ alkynyl group, a $C_1$-$C_{10}$ alkylthio group, or a $C_1$-$C_{10}$ alkoxy group,
*′ and *″ each indicate a binding site to an adjacent atom, and
$R_{1a}$ and $R_{10a}$ are each independently:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, a $C_1$-$C_{20}$ alkylthio group, or a $C_1$-$C_{60}$ alkoxy group, each independently unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, a $C_1$-$C_{60}$ heteroarylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, each independently unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{20}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_1$-$C_{60}$ heteroaryloxy group, or a $C_1$-$C_{60}$ heteroarylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{20}$ alkylthio group; a $C_3$-$C_{60}$ carbocyclic group; or a $C_1$-$C_{60}$ heterocyclic group, each independently unsubstituted or substituted with deuterium, —F, a cyano group, a $C_1$-$C_{60}$ alkyl group, a $C_1$-$C_{60}$ alkoxy group, a $C_1$-$C_{60}$ alkylthio group, a phenyl group, a biphenyl group, or any combination thereof.

12. A cross-linked material comprising a cross-linked product of the quantum dot-containing material of claim 1.

13. The cross-linked material of claim 12, the cross-linked material comprising:

a residue group derived from a cross-linking reaction between the azide group in the organic group in the quantum dot-containing material and an adjacent organic group.

14. The cross-linked material of claim 13, wherein the azide group and the adjacent organic group are present in the same quantum dot-containing material or are each present in different quantum dot-containing materials.

15. The cross-linked material of claim 13, wherein the residue group comprises a group represented by Formula 4:

Formula 4

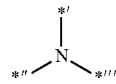

4 wherein, in Formula 4, *', *'', and *''' each indicate a binding site to an adjacent atom.

16. The cross-linked material of claim 12, wherein the cross-linked material has a form of a film.

17. The cross-linked material of claim 16, wherein a thickness of the film is in a range of about 0.1 micrometers (μm) to about 700 micrometers.

18. A method of preparing a cross-linked material, the method comprising:

providing the quantum dot-containing material of claim 1 and a solvent on a substrate; and cross-linking the quantum dot-containing material.

19. The method of claim 18, wherein the cross-linking of the quantum dot-containing material is performed by exposure to ultraviolet rays.

20. A light-emitting device comprising:

a first electrode;

a second electrode facing the first electrode; and an interlayer between the first electrode and the second electrode and comprising an emission layer, wherein the light-emitting device comprises the cross-linked material of claim 12.

* * * * *